United States Patent
Burkhart et al.

(10) Patent No.: US 10,215,317 B2
(45) Date of Patent: Feb. 26, 2019

(54) ADDITIVELY MANUFACTURED GAS DISTRIBUTION MANIFOLD

(71) Applicant: Lam Research Corporation, Fremont, CA (US)

(72) Inventors: Christopher William Burkhart, Los Gatos, CA (US); Andrew C. Lee, Daly City, CA (US); David J. Hemker, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 180 days.

(21) Appl. No.: 15/087,889

(22) Filed: Mar. 31, 2016

(65) Prior Publication Data
US 2017/0203511 A1   Jul. 20, 2017

Related U.S. Application Data

(63) Continuation-in-part of application No. 14/997,419, filed on Jan. 16, 2016, now Pat. No. 9,879,795.

(51) Int. Cl.
*F16L 25/00* (2006.01)
*F16L 23/14* (2006.01)
(Continued)

(52) U.S. Cl.
CPC ............ *F16L 25/0009* (2013.01); *B22F 7/04* (2013.01); *B33Y 10/00* (2014.12); *F16L 3/006* (2013.01); *F16L 9/003* (2013.01); *F16L 13/002* (2013.01); *F16L 23/14* (2013.01); *F16L 41/025* (2013.01); *F16L 43/003* (2013.01); *F16L 47/145* (2013.01); *F16L 51/021* (2013.01); *H01L 21/67017* (2013.01); *H01L 21/6719* (2013.01);
(Continued)

(58) Field of Classification Search
CPC ...... B33Y 10/00; F16L 53/008; F16L 53/004; F16L 53/005; F16L 9/003; F16L 13/002; F16L 23/14; F16L 25/0009; F16L 41/025; F16L 43/003; F16L 47/145; F16L 51/021; F16L 3/006; H05B 2203/021; Y10T 137/6606; Y10T 137/87571; Y10T 137/87684
See application file for complete search history.

(56) References Cited

U.S. PATENT DOCUMENTS 2,361,150 A   10/1944   Petroe
2,569,857 A   10/1951   Jaegle et al.
(Continued)

FOREIGN PATENT DOCUMENTS

JP   2003-334479 A   11/2003
JP   2004-214591 A   7/2004
(Continued)

OTHER PUBLICATIONS

U.S. Appl. No. 14/997,419, filed Jan. 15, 2016, entitled "Additively Manufactured Gas Distribution Manifold."
(Continued)

*Primary Examiner* — Atif Chaudry
(74) *Attorney, Agent, or Firm* — Weaver Austin Villeneuve & Sampson LLP

(57) ABSTRACT

Methods and apparatuses for additively manufactured tubular passages, additively manufactured manifolds, and additively manufactured heaters are provided.

24 Claims, 31 Drawing Sheets

(51) Int. Cl.

| | | |
|---|---|---|
| *H01L 21/67* | (2006.01) | |
| *B33Y 10/00* | (2015.01) | |
| *B22F 7/04* | (2006.01) | |
| *F16L 9/00* | (2006.01) | |
| *F16L 13/00* | (2006.01) | |
| *F16L 47/14* | (2006.01) | |
| *F16L 3/00* | (2006.01) | |
| *F16L 51/02* | (2006.01) | |
| *F16L 43/00* | (2006.01) | |
| *F16L 41/02* | (2006.01) | |
| *B33Y 80/00* | (2015.01) | |
| *B22F 3/00* | (2006.01) | |
| *B22F 3/105* | (2006.01) | |

(52) U.S. Cl.
CPC ............ *B22F 3/008* (2013.01); *B22F 3/1055* (2013.01); *B29K 2995/0006* (2013.01); *B33Y 80/00* (2014.12); *H05B 2203/021* (2013.01); *Y02P 10/295* (2015.11); *Y10T 137/6606* (2015.04); *Y10T 137/87571* (2015.04); *Y10T 137/87684* (2015.04)

(56) References Cited

U.S. PATENT DOCUMENTS

| | | |
|---|---|---|
| 3,026,183 A | 3/1962 | Cole, III |
| 3,102,004 A | 8/1963 | Grintz |
| 3,865,133 A | 2/1975 | Alford |
| 4,099,919 A | 7/1978 | Leidal |
| 4,134,002 A * | 1/1979 | Stanford ............ E04D 13/0762 138/33 |
| 4,215,081 A | 7/1980 | Brooks |
| 4,264,212 A | 4/1981 | Tookey |
| 4,422,471 A | 12/1983 | Faccini |
| 4,545,328 A | 10/1985 | Fujiyama et al. |
| 4,581,521 A * | 4/1986 | Grise ............ H05B 3/58 219/528 |
| 4,703,718 A | 11/1987 | Enstrom |
| 4,714,091 A | 12/1987 | Wagner |
| 5,063,027 A | 11/1991 | Schneider |
| 5,082,633 A | 1/1992 | Stuper |
| 5,534,328 A | 7/1996 | Ashmead et al. |
| 5,794,645 A | 8/1998 | Rohrberg et al. |
| 5,836,355 A | 11/1998 | Markulec et al. |
| 5,887,977 A | 3/1999 | Morikawa |
| 5,911,342 A | 6/1999 | Sindoni |
| 5,950,874 A | 9/1999 | Sindoni |
| 5,984,519 A | 11/1999 | Onodera et al. |
| 6,068,016 A | 5/2000 | Manofsky, Jr. et al. |
| 6,073,646 A | 6/2000 | Kimura |
| 6,125,887 A | 10/2000 | Pinto |
| 6,159,442 A | 12/2000 | Thumm et al. |
| 6,168,948 B1 | 1/2001 | Anderson et al. |
| 6,186,177 B1 | 2/2001 | Maher |
| 6,260,581 B1 | 7/2001 | Hollingshead |
| 6,269,978 B1 | 8/2001 | Sindoni |
| 6,281,155 B1 | 9/2001 | Vu |
| 6,283,143 B1 | 9/2001 | Adachi, Jr. et al. |
| 6,302,141 B1 | 10/2001 | Markulec et al. |
| 6,352,594 B2 | 3/2002 | Cook et al. |
| 6,440,504 B1 | 8/2002 | Akiyama |
| 6,546,960 B1 | 4/2003 | Rohrberg et al. |
| 6,581,640 B1 | 6/2003 | Barron |
| 6,640,835 B1 | 11/2003 | Rohrberg et al. |
| 6,648,020 B2 | 11/2003 | Fujimoto et al. |
| 6,655,829 B1 | 12/2003 | Vanden Bussche et al. |
| 6,718,817 B1 | 4/2004 | Ko et al. |
| 6,753,200 B2 | 6/2004 | Craighead et al. |
| 6,880,745 B2 | 4/2005 | Stueber et al. |
| 6,907,904 B2 | 6/2005 | Harris et al. |
| 7,055,550 B2 | 6/2006 | Harris et al. |
| 7,126,094 B2 | 10/2006 | Bower et al. |
| 7,140,558 B2 | 11/2006 | McCracken et al. |
| 7,150,475 B2 | 12/2006 | Eriksson et al. |
| 7,178,556 B2 | 2/2007 | Reid, II et al. |
| 7,195,037 B2 | 3/2007 | Eidsmore |
| 7,225,835 B2 | 6/2007 | Vu |
| 7,234,222 B1 | 6/2007 | Hao et al. |
| 7,261,812 B1 | 8/2007 | Karp et al. |
| 7,299,825 B2 | 11/2007 | Milburn |
| 7,307,247 B2 | 12/2007 | Bower et al. |
| 7,320,339 B2 | 1/2008 | Milburn |
| 7,334,605 B2 | 2/2008 | Vu |
| 7,404,417 B2 | 7/2008 | Eidsmore |
| 7,410,519 B1 | 8/2008 | Ewald |
| 7,789,107 B2 | 9/2010 | Eriksson et al. |
| 7,798,388 B2 | 9/2010 | Crockett et al. |
| 7,806,143 B2 | 10/2010 | Taskar |
| 7,892,357 B2 | 2/2011 | Srivastava |
| 7,976,795 B2 | 7/2011 | Zhou et al. |
| 8,122,910 B2 | 2/2012 | Taskar |
| 8,196,480 B1 | 6/2012 | Mayeaux |
| 8,196,609 B2 | 6/2012 | Oya et al. |
| 8,322,380 B2 | 12/2012 | Taskar |
| 8,340,827 B2 | 12/2012 | Yun et al. |
| 8,397,752 B2 * | 3/2013 | Hou ............ B29C 45/16 137/315.12 |
| 8,521,461 B2 | 8/2013 | Shareef et al. |
| 8,746,284 B2 | 6/2014 | DeDontney |
| 8,794,267 B2 | 8/2014 | Shareef et al. |
| 8,846,183 B2 | 9/2014 | Unger et al. |
| 8,851,113 B2 | 10/2014 | Taskar et al. |
| 8,852,685 B2 | 10/2014 | Kenworthy et al. |
| 9,879,795 B2 | 1/2018 | Burkhart et al. |
| 10,022,689 B2 | 7/2018 | Shareef et al. |
| 10,128,087 B2 | 11/2018 | Taskar et al. |
| 2002/0017329 A1 | 2/2002 | Fukushima |
| 2002/0072164 A1 | 6/2002 | Umotyo et al. |
| 2002/0176317 A1 | 11/2002 | Bellasalma et al. |
| 2003/0124842 A1 | 7/2003 | Hytros et al. |
| 2004/0091406 A1 | 5/2004 | Wolfert et al. |
| 2004/0092118 A1 | 5/2004 | Johnson et al. |
| 2004/0125689 A1 | 7/2004 | Ehrfeld et al. |
| 2004/0189311 A1 | 9/2004 | Glezer et al. |
| 2004/0231586 A1 | 11/2004 | Dugue et al. |
| 2005/0005981 A1 | 1/2005 | Eidsmore et al. |
| 2005/0104242 A1 * | 5/2005 | Olaru ............ B29C 45/2737 264/40.6 |
| 2005/0284529 A1 | 12/2005 | Iwabuchi |
| 2006/0028908 A1 | 2/2006 | Suriadi et al. |
| 2007/0007204 A1 | 1/2007 | Schanz et al. |
| 2007/0138203 A1 | 6/2007 | Sacchet |
| 2007/0140042 A1 | 6/2007 | Schanz et al. |
| 2007/0253281 A1 | 11/2007 | Radford et al. |
| 2007/0291581 A1 | 12/2007 | Ehrfeld et al. |
| 2008/0066859 A1 | 3/2008 | Kobayashi et al. |
| 2008/0106968 A1 | 5/2008 | Schanz et al. |
| 2009/0071556 A1 | 3/2009 | Bourlart et al. |
| 2009/0120364 A1 | 5/2009 | Suarez et al. |
| 2010/0067323 A1 | 3/2010 | Blom et al. |
| 2011/0005601 A1 | 1/2011 | Shareef et al. |
| 2011/0158931 A1 | 6/2011 | Wittek |
| 2012/0175442 A1 | 7/2012 | Xiong et al. |
| 2012/0237696 A1 | 9/2012 | Huseinovic et al. |
| 2012/0263012 A1 | 10/2012 | Xiong et al. |
| 2013/0025718 A1 | 1/2013 | Nagase et al. |
| 2013/0248511 A1 * | 9/2013 | Wallinger ............ H05B 3/26 219/510 |
| 2013/0255782 A1 | 10/2013 | Shareef et al. |
| 2013/0255883 A1 | 10/2013 | Shareef et al. |
| 2014/0020779 A1 | 1/2014 | Vu |
| 2014/0076236 A1 | 3/2014 | Sankarakrishnan et al. |
| 2014/0090599 A1 | 4/2014 | Saitou |
| 2014/0137961 A1 | 5/2014 | Kao et al. |
| 2014/0182689 A1 | 7/2014 | Shareef et al. |
| 2014/0202577 A1 * | 7/2014 | Webster, III ......... F16L 41/023 138/177 |
| 2014/0241960 A1 | 8/2014 | Mochizuki |
| 2015/0362080 A1 | 12/2015 | Vu |
| 2016/0111257 A1 | 4/2016 | Kellogg et al. |

(56) References Cited

U.S. PATENT DOCUMENTS

2017/0021317 A1     1/2017    Shareef et al.
2017/0173886 A1*   6/2017    Menchik ................ B33Y 30/00
2017/0204989 A1     7/2017    Burkhart et al.

FOREIGN PATENT DOCUMENTS

KR     10-2009-0125681        12/2009
WO     WO 2014/199158         12/2014
WO     WO 2016/061493 A1    4/2016

OTHER PUBLICATIONS

U.S. Appl. No. 14/843,775, filed Sep. 2, 2015, entitled "Monolithic Manifold Mask and Substrate Concepts."
U.S. Appl. No. 14/517,192, filed Oct. 17, 2014, entitled "Substrate for Mounting Gas Supply Components and Methods Thereof."
U.S. Appl. No. 14/884,575, filed Oct. 15, 2015, entitled "Monolithic Gas Distribution Manifold and Various Construction Techniques and Use Cases Therefor."
U.S. Notice of Allowance (Corrected), dated Jan. 3, 2018, issued in U.S. Appl. No. 14/997,419.
U.S. Office Action, dated Dec. 15, 2017, issued in U.S. Appl. No. 14/680,244.
U.S. Office Action dated Jun. 5, 2017, issued in U.S. Appl. No. 14/809,041.
U.S. Notice of Allowance dated Nov. 30, 2017, issued in U.S. Appl. No. 14/809,041.
U.S. Office Action, dated Jun. 22, 2017, issued in U.S. Appl. No. 14/517,192.
U.S. Final Office Action, dated Nov. 16, 2017, issued in U.S. Appl. No. 14/517,192.
U.S. Office Action, dated Dec. 30, 2016, issued in U.S. Appl. No. 14/997,419.
U.S. Final Office Action, dated Jul. 10, 2017, issued in U.S. Appl. No. 14/997,419.
U.S. Notice of Allowance, dated Sep. 27, 2017, issued in U.S. Appl. No. 14/997,419.
PCT International Search Report and Written Opinion dated Dec. 28, 2015 issued in PCT/US2015/0555997.
PCT International Preliminary Report on Patentability and Written Opinion dated Apr. 27, 2017 issued in PCT/US2015/0555997.
U.S. Notice of Allowance dated Jul. 13, 2018 issued in U.S. Appl. No. 14/680,244.
Taiwanese First Office Action [w/ Translation] dated Sep. 10, 2018 issued in TW 104111078.
Chinese First Office Action dated Nov. 2, 2018 issued in CN 201580056443.5.

* cited by examiner

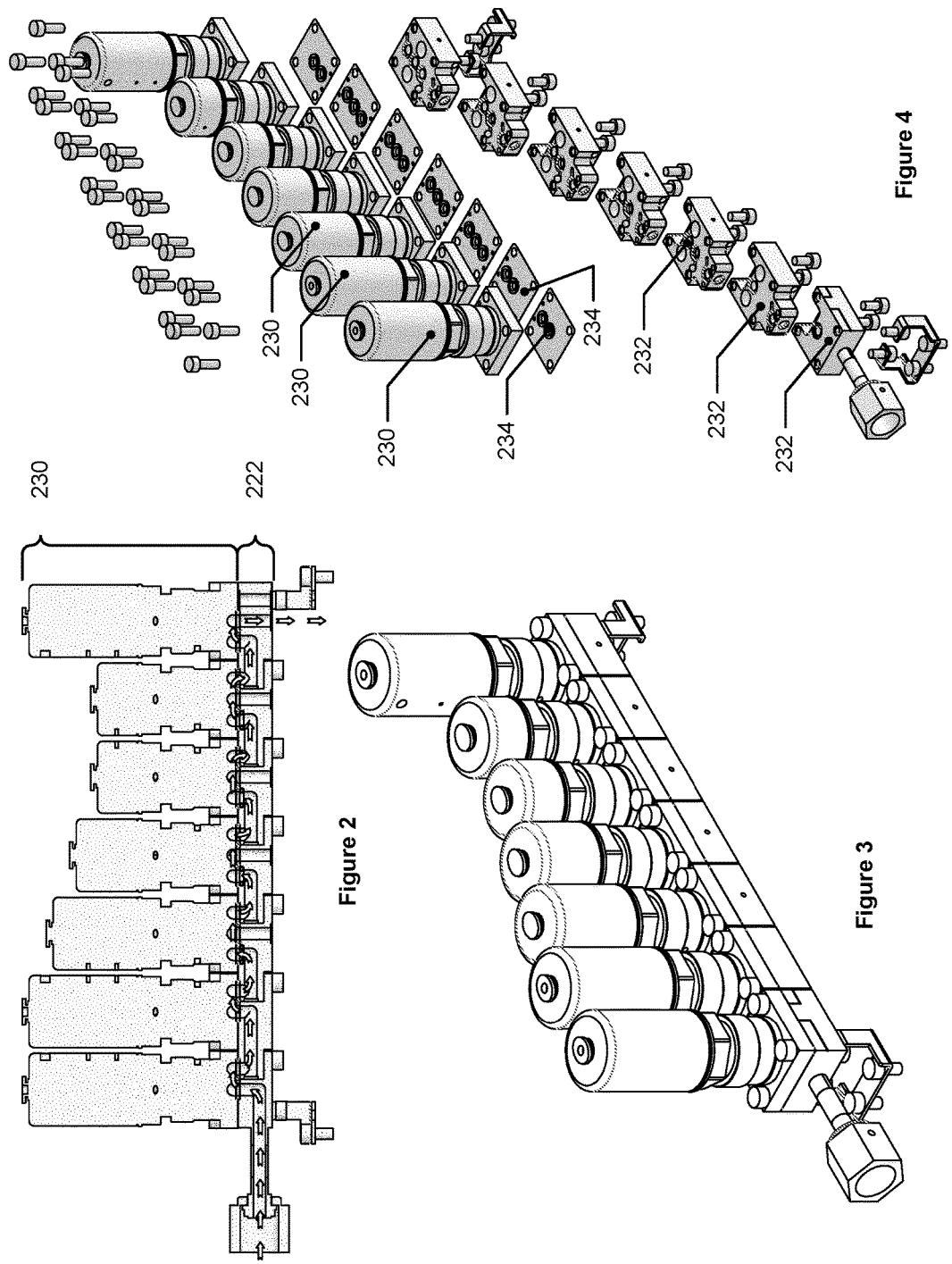

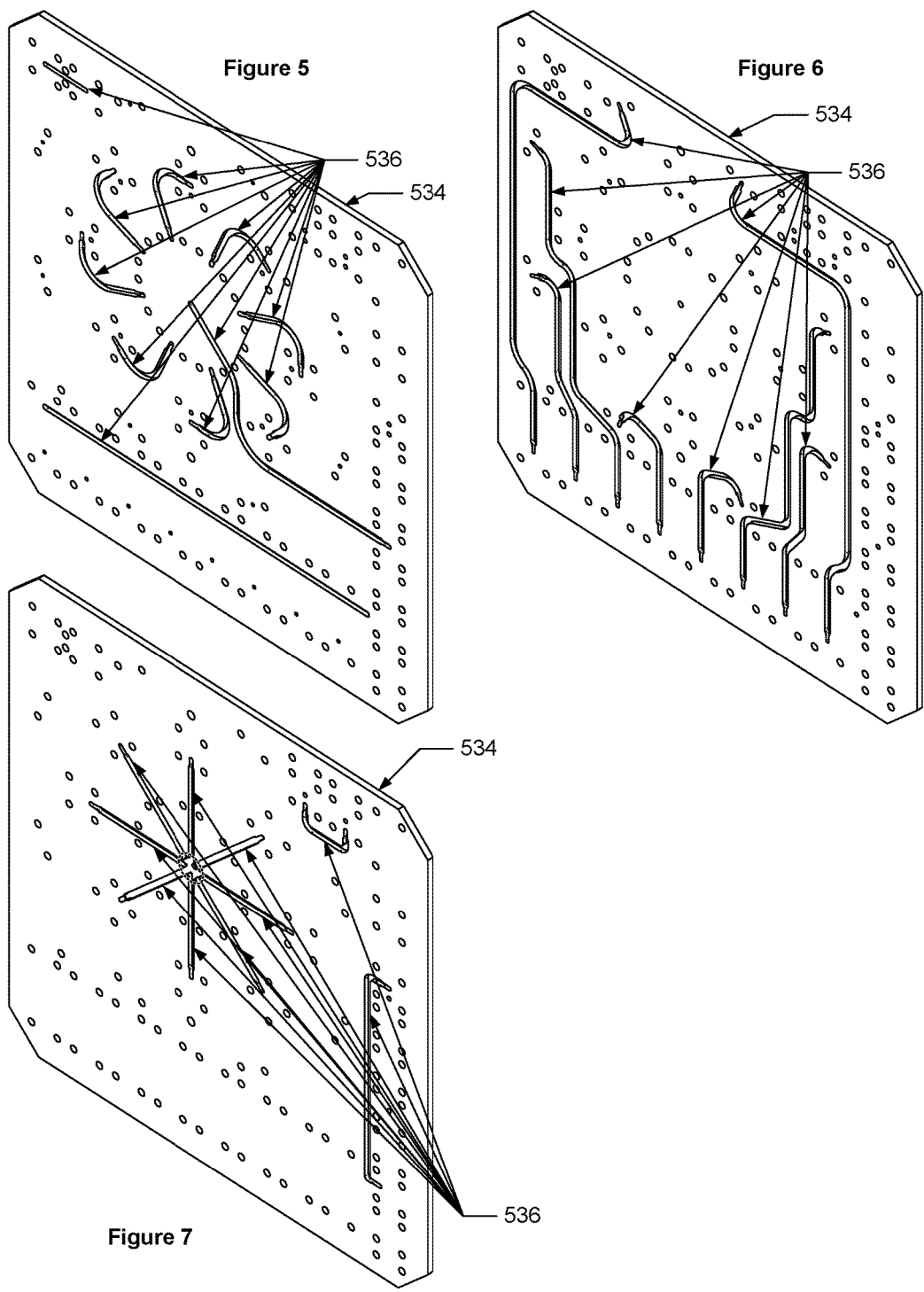

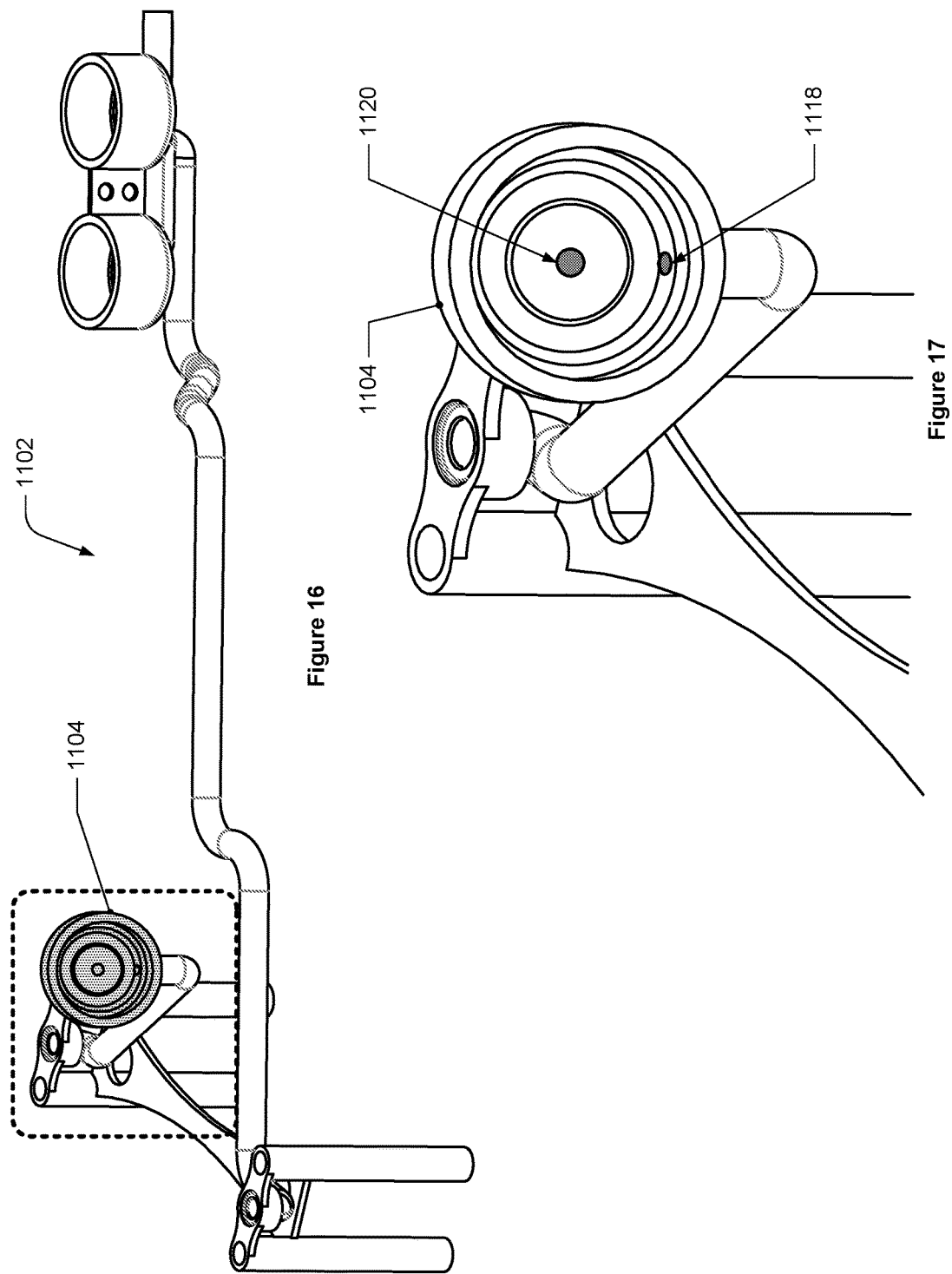

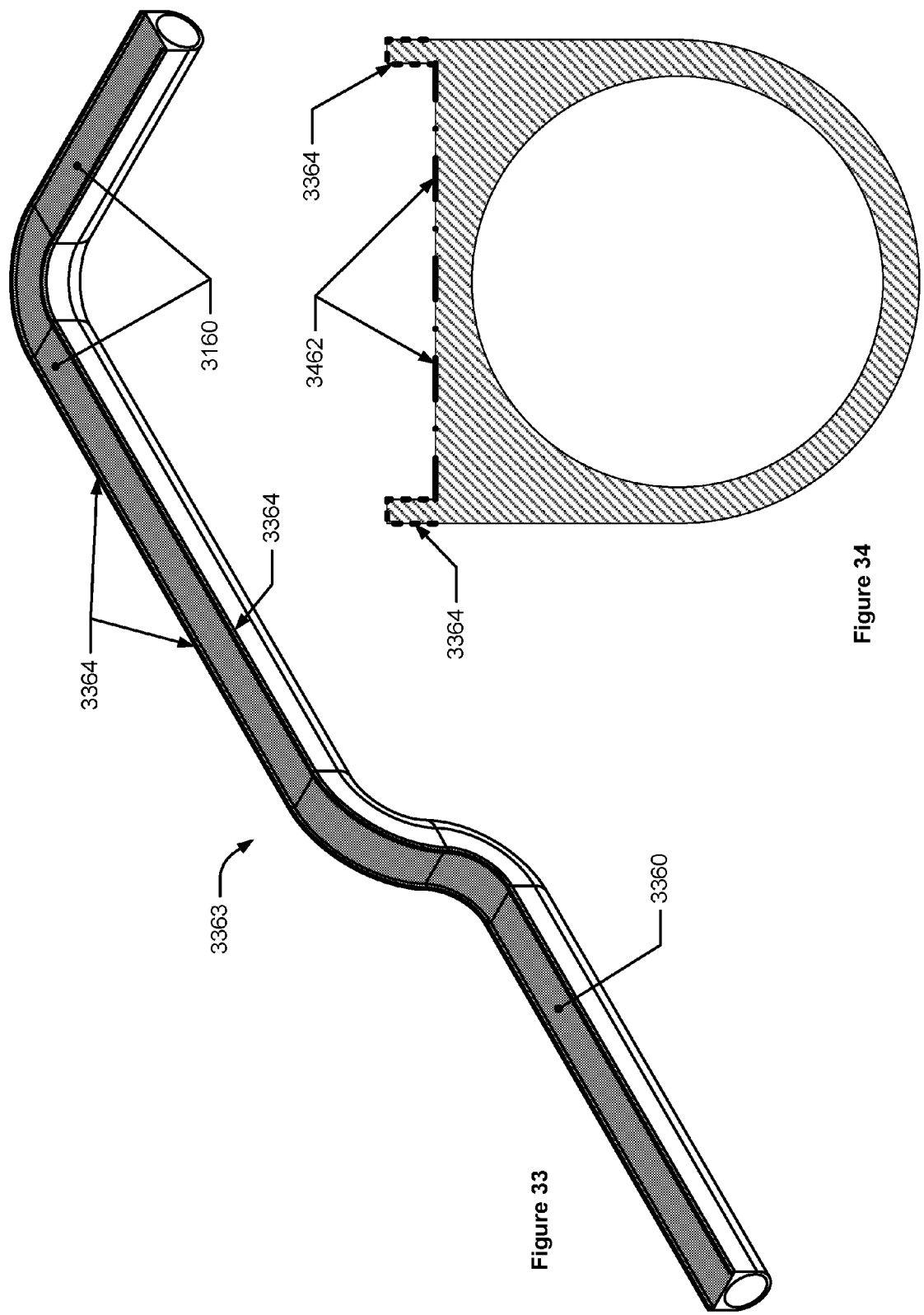

ADDITIVELY MANUFACTURED GAS DISTRIBUTION MANIFOLD

CROSS REFERENCE TO RELATED APPLICATIONS

This application is a continuation-in-part application claiming priority under 35 U.S.C. § 120 from pending U.S. patent application Ser. No. 14/997,419, filed on Jan. 15, 2016, LAMRP239/3802-1US, titled "ADDITIVELY MANUFACTURED GAS DISTRIBUTION MANIFOLD," which is hereby incorporated by reference in its entirety for all purposes.

BACKGROUND

Semiconductor manufacturing processes utilize a variety of different types of process gases that must be delivered with precise timing, in precise quantities, and/or at precise delivery rates and ratios. In some cases, a semiconductor processing tool may utilize ten or more process gases, e.g., 14 different process gases, each of which must have its own separate control hardware. This collection of control hardware, which may include valves, mass flow controllers (MFCs), tubing, fittings, etc., is typically housed in a "gas box," which is an enclosure or other structure that is typically mounted to the semiconductor processing tool (or in another location nearby).

BRIEF DESCRIPTION OF THE DRAWINGS

FIGS. 2 through 4 show an example of a modular substrate gas stick.

FIGS. 5 through 7 depict three example layers of a monolithic substrate.

FIG. 16 depicts an off-angle view of the first flow path of FIG. 12.

FIG. 17 depicts a detail view of a portion of the first flow path from FIG. 16.

FIG. 33 depicts an isometric view of a seventh example tubular passage.

FIG. 34 depicts a cross-sectional view of the seventh example tubular passage in FIG. 33.

SUMMARY

Figure 1:
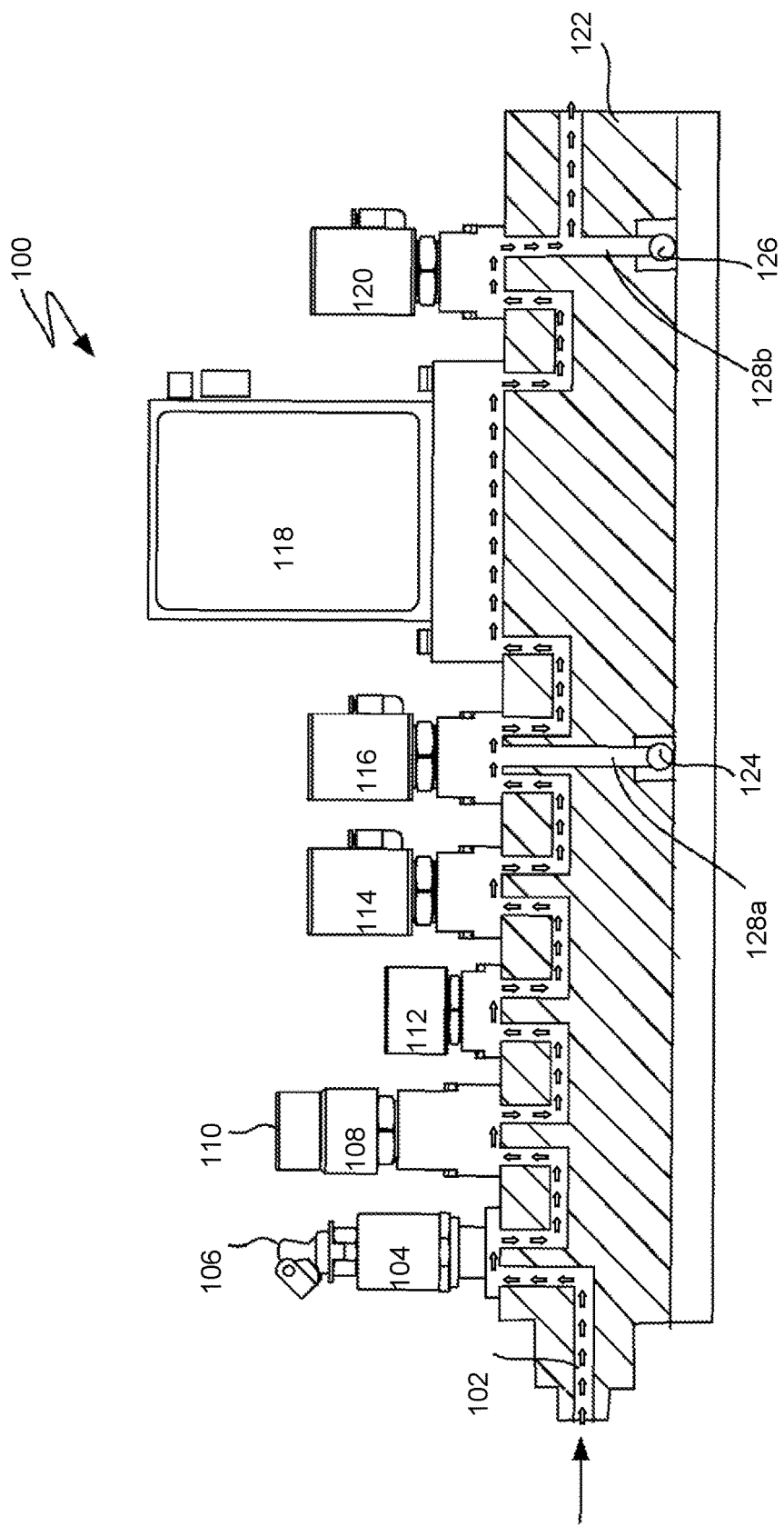
FIG. 1 depicts an example of a gas stick arrangement used in some conventional gas boxes.

In one embodiment, an apparatus may be provided. The apparatus may include a manifold constructed by additive manufacturing and including a plurality of tubular passages in which at least one tubular passage follows a pathway and has an exterior surface that includes a first runway, the first runway includes a surface defined by a first profile that is swept along the pathway, the first profile is in a plane perpendicular to the pathway, and the first profile is substantially linear.

In some embodiments, the pathway may be a three-dimensional path.

In some embodiments, the first profile may slightly curved so as to make the first runway concave.

In some embodiments, the first profile may include features that define opposing sidewalls along the length of the runway to form a trough.

In one embodiment, the exterior surface of the at least one tubular passage may include a second runway, the second runway may include a surface defined by a second profile that is swept along the pathway, the second profile may be in a plane perpendicular to the pathway, and the second profile may be substantially linear.

In some such embodiments, the second profile may be at an oblique angle to the first profile when viewed normal to the plane perpendicular to the pathway.

In some such embodiments, the second profile may be substantially parallel to the first profile when viewed normal to the plane perpendicular to the pathway.

In some such embodiments, the second profile may be perpendicular to the first profile when viewed normal to the plane perpendicular to the pathway.

In one embodiment, the at least one tubular passage may further include a first dielectric layer that is adjacent to the first runway and extends along the first runway for substantially the entire length of the first runway.

In some such embodiments, the at least one tubular passage may further include a resistive heating element layer that is adjacent to the first dielectric layer and extends along the first dielectric layer for substantially the entire length of the first dielectric layer.

In some such embodiments, the at least one tubular passage may further include a second dielectric layer that is adjacent to the resistive heating element layer and extends along the first runway for substantially the entire length of the first runway, and the resistive heating element layer may be interposed between the first dielectric layer and the second dielectric layer.

In some such embodiments, the resistive heating element layer may include a first heating zone that is configured to heat the tubular passage to a first temperature, and the resistive heating element layer may include a second heating zone that is configured to heat the tubular passage to a second temperature that is different than the first temperature.

In one embodiment, a method for creating a heater on a tubular passage using additive manufacturing may be provided. The method may include providing the tubular passage, depositing a first flowable dielectric onto the tubular passage using a computer controlled first nozzle, curing the first flowable dielectric, depositing a resistive heating element onto the cured first flowable dielectric using a computer controlled second nozzle, curing the resistive heating element, depositing a second flowable dielectric onto the resistive heat trace using a computer controlled third nozzle, wherein the resistive heating element is interposed between the first cured flowable dielectric and the second flowable dielectric, and curing the second flowable dielectric.

In some embodiments, the tubular passage may follow a three-dimensional pathway.

In one embodiment, providing the tubular passage may include additively manufacturing the tubular passage.

In some such embodiments, the tubular passage may follow a pathway and may have an exterior surface that includes a runway, the runway may include a surface defined by a first profile that is swept along the pathway, the first profile may be in a plane perpendicular to the pathway, the first profile may be substantially linear, and the first flowable dielectric may be deposited onto the runway.

In some embodiments, providing the tubular passage may include providing a manifold that includes a plurality of tubular passages.

In one embodiment, providing the tubular passage may include additively manufacturing a manifold that includes a plurality of tubular passages.

In some such embodiments, at least one tubular passage may follow a pathway and may have an exterior surface that includes a runway, the runway may include a surface defined by a first profile that is swept along the pathway, the first profile may be in a plane perpendicular to the pathway, the first profile may be substantially linear, and the first flowable dielectric may be deposited onto the runway.

In one embodiment, a method for creating a heater on a tubular passage using screen printing may be provided. The method may include providing an additively manufactured tubular passage, in which the tubular passage follows a two-dimensional pathway and has an exterior surface that includes a runway, the runway includes a surface defined by a first profile that is swept along the pathway, the first profile is in a plane perpendicular to the pathway, and the first profile is substantially linear. The method may further include screen-printing a first dielectric layer onto the runway, curing the first dielectric layer, screen-printing a resistive heating element onto the first dielectric layer, curing the resistive heat trace, screen-printing a second dielectric layer onto the resistive heating element, wherein the resistive heating element is interposed between the first dielectric layer and the second dielectric layer, and curing the second dielectric layer.

In one embodiment, an apparatus may be provided. The apparatus may include a manifold constructed by additive manufacturing, and the manifold may include a mixing chamber and portions of a plurality of flow paths. Each flow path may include a first fluid flow component interface including a first fluid flow component interface inlet and a first fluid flow component interface outlet, a second fluid flow component interface including a second fluid flow component interface inlet and a second fluid flow component interface outlet, a first tubular passage fluidically connecting the first mixing chamber with the first fluid flow component interface outlet of that flow path, and a second tubular passage fluidically connecting the first fluid flow component interface inlet of that flow path with the second fluid flow component interface outlet of that flow path. Each first fluid component interface may be fluidically interposed between the first tubular passage of that flow path and the second tubular passage of that flow path, each first fluid flow component interface may be configured to interface with a corresponding first fluid flow component such that the corresponding first fluid flow component, when installed, is able to interact with fluid flow between the first fluid flow component interface inlet and the first fluid flow component interface outlet, and each second fluid flow component interface may be configured to interface with a corresponding second fluid flow component such that the corresponding second fluid flow component, when installed, is able to interact with fluid flow between the second fluid flow component interface inlet and the second fluid flow component interface outlet.

In some embodiments, for at least one of the flow paths, at least one of the first tubular passage and the second tubular passage may follow a three-dimensional path.

In some embodiments, at least the majority of the manifold may have a sintered structure.

In some embodiments, the manifold may be made from a material such as a sintered metal, a sintered metal alloy, and a sintered ceramic.

In some embodiments, each first fluid flow component interface may be configured to interface with the corresponding first fluid flow component such that the first corresponding fluid flow component, when installed, is able to interact with fluid flow between the first fluid flow component interface inlet and the first fluid flow component interface outlet by regulating the fluid flow between the first fluid flow component interface inlet and the first fluid flow component interface outlet.

In some embodiments, each second first fluid flow component interface may be configured to interface with the corresponding second fluid flow component such that the corresponding second fluid flow component, when installed, is able to interact with fluid flow between the second fluid flow component interface inlet and the second fluid flow component interface outlet by regulating the fluid flow between the second fluid flow component interface inlet and the second fluid flow component interface outlet.

In one such embodiment, each fluid flow path may further include a third fluid flow component interface including a third fluid flow component interface inlet and a third fluid flow component interface outlet and a third tubular passage fluidically connecting the second fluid flow component interface inlet of that flow path with the third fluid flow component interface outlet of that flow path. Each second fluid flow component interface may be fluidically interposed between the second tubular passage of that flow path and the third tubular passage of that flow path and each third fluid flow component interface may be configured to interface with a corresponding third fluid flow component such that the corresponding third fluid flow component, when installed, is able to interact with fluid flow between the third fluid flow component interface inlet and the third fluid flow component interface outlet.

In further such embodiments, each third fluid flow component interface may be configured to interface with the corresponding third fluid flow component such that the corresponding third fluid flow component, when installed, is able to interact with fluid flow between the third fluid flow component interface inlet and the third fluid flow component interface outlet by regulating the fluid flow between the third fluid flow component interface inlet and the third fluid flow component interface outlet.

In further such embodiments, each fluid flow path may further include a fourth fluid flow component interface including a fourth fluid flow component interface inlet and a fourth fluid flow component outlet and a fourth tubular passage fluidically connecting the fourth fluid flow component interface inlet of that flow path with the third tubular passage of that flow path. Each fourth fluid flow component interface outlet may be fluidically connected to the fourth fluid flow component interface and each fourth fluid flow component interface may be configured to interface with a corresponding fourth fluid flow component such that the corresponding fourth fluid flow component, when installed, is able to interact with fluid flow between the fourth fluid flow component interface inlet and the fourth fluid flow component interface outlet.

In some embodiments, the first tubular passages and the first fluid flow component interfaces may be arranged in a radial pattern around a first axis.

In some embodiments, the manifold may further include one or more structural supports that span between (a) one or more portions of one of the flow paths, such as the first tubular passage of that flow path, the second tubular passage of that flow path, the first fluid flow component interface of that flow path, and the second fluid flow component interface of that flow path and (b) one or more portions of one of the other flow paths, such as the first tubular passage of that other flow path, the second tubular passage of that other flow path, the first fluid flow component interface of that other flow path, and the second fluid flow component interface of that other flow path.

In some embodiments, one or more portions of one or more bends in the first tubular passage may have a bend radius less than ten times the outside diameter of the first tubular passage.

In some embodiments, one or more portions of one or more bends in the second tubular passage may have a bend radius less than ten times the outside diameter of the second tubular passage.

In some embodiments, each first tubular passage may have a plurality of first bends and 85% or more of the first bends may be free of internal sharp edges, and each second tubular passage may have a plurality of second bends and 85% or more of the second bends may be free of internal sharp edges.

In some embodiments, for at least one of the flow paths, at least one of the first fluid flow component interface and the second fluid flow component interface is a bore-type interface.

In some embodiments, for at least one of the flow paths, at least one of the first fluid flow component interface and the second fluid flow component interface may be a surface mount interface.

In some embodiments, for at least one of the flow paths, at least one of the first fluid flow component interface and the second fluid flow component interface may be an interface provided by two different, non-contiguous interface surfaces.

In one such embodiment, the apparatus may further include a plurality of first fluid flow components and each first fluid flow component may be mounted to the manifold such that each first fluid flow component is fluidically connected with a corresponding one of the first fluid flow component interfaces.

In further such embodiments, the apparatus may further include a plurality of second fluid flow components and each second fluid flow component may be mounted to the manifold such that each second fluid flow component is fluidically connected with a corresponding one of the second fluid flow component interfaces.

In some embodiments, each of the first tubular passages may be the same length as the other first tubular passages.

In some embodiments, one or more of the first tubular passages may have an interior surface with an arithmetic average surface roughness ($R_a$) of 10 microinches or less and one or more of the second tubular passages may have an interior surface with an arithmetic average surface roughness ($R_a$) of 10 microinches or less.

In one such embodiment, the manifold may occupy 35% or less of the smallest prismatic rectangular volume that can completely contain the manifold.

In further such embodiments, the height and the width of the smallest prismatic rectangular volume that can completely contain the manifold each measure between about 15 inches and about 20 inches.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific implementations, it will be understood that these implementations are not intended to be limiting.

There are many concepts and implementations described and illustrated herein. While certain features, attributes and advantages of the implementations discussed herein have been described and illustrated, it should be understood that many others, as well as different and/or similar implementations, features, attributes and advantages of the present inventions, are apparent from the description and illustrations. As such, the below implementations are merely some possible examples of the present disclosure. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description below because the description of the above implementations has been presented for the purposes of illustration and description.

Importantly, the present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

Semiconductor processes typically utilize a large number of different types of processing gases and/or liquids. These fluids may need to be individually controlled to a high degree of precision to ensure that the proper quantities and ratios of gases are delivered to the semiconductor processing chamber (or chambers) where semiconductor processing occurs at the right time and in the right sequence—it is to be understood that the term "fluid," as used herein, may refer to either a gas or a liquid. To provide such fluidic control, semiconductor processing tools usually include, or are connected with, a "gas box," which is a complex assembly of fluid flow components, such as valves, mass flow controllers (MFCs), fittings, tubes, manifold blocks, etc.

As discussed in further detail below, the inventors of the present disclosure have discovered that many current gas boxes may include numerous disadvantages and/or limitations, such as flow paths that may have sharp internal edges, overhangs, gaps, dead zones, misalignments, and/or discontinuities which may adversely affect fluid flow. Moreover, the present inventors have found that traditional manufacturing techniques of current gas boxes are limited in the flow path configurations that can be constructed such that they cannot create intricate, tightly packed flow paths that follow a three-dimensional path and/or have bends without internal sharp edges.

In a typical gas box, each processing fluid may have an associated "gas stick," which is typically a linear arrangement of shut-off valves, mixing valves, MFCs (if used), fittings, tubing, filters, pressure regulators, and/or manifold blocks. These gas sticks, which may also be used for liquid reactants (despite the name referring to "gas"), may then be arranged in a linear fashion, side-by-side, and connected to a common trunk line. In such arrangements, the average flow direction of each gas stick may typically be perpendicular to the average flow direction of the trunk line.

In a typical gas stick, the fluid flow components are laid out in a generally sequential manner. FIG. 1 depicts an example of a typical gas stick arrangement used in some conventional gas boxes.

Referring to FIG. 1, the gas stick 100 may have a gas stick input port 102 that may be connected to a supply fluid source, e.g., a facility gas source. A manual valve 104 may be used to allow for the supply or isolation of the supply fluid source from the gas stick (or vice versa). The manual valve 104 may also have a lockout/tagout device 106 that prevents the manual valve 104 from being operated until the lockout is disengaged, or that indicates prominently that the valve is in-use and should not be operated except by the person who set the tag.

A regulator 108 may be used to regulate the pressure of the supply fluid, e.g., the pressure of a supply gas, and a pressure gauge 110 may be used to monitor the pressure of the supply fluid. In one implementation, the pressure may be preset and not need to be regulated. In another implementation, a pressure transducer (not illustrated) having a display to display the pressure may be used. The pressure transducer may be positioned next to the regulator 108. A filter 112 may be used to remove impurities in the supply fluid. A primary shut-off valve 114 may be used to prevent any corrosive supply fluids from remaining in the gas stick. The primary shut-off valve 114 may be a two-port valve having an automatic pneumatically operated valve assembly that causes the valve to become deactivated (closed), which in turn effectively stops fluid flow within the gas stick. Once deactivated, a non-corrosive purge gas, such as nitrogen, may be used to purge the gas stick. The purge valve 116 may have three ports to provide for the purge process—an entrance port, an exit port and a discharge port.

Adjacent the purge valve 116 may be a mass flow controller ("MFC") 118. The MFC 118 may be used to accurately measure and control the flow rate of the supply fluid, e.g., supply gas. Positioning the purge valve 116 next to the MFC 118 allows a user to purge any corrosive supply fluids in the MFC 118. A mixing valve (or secondary valve) 120 next to the MFC 118 may be used to release the amount of supply fluid to be mixed with other supply fluids in the gas box.

Each component of the gas stick 100 may be positioned above a manifold block. The aforementioned fluid flow components may be positioned on the manifold blocks through any of a variety of mechanisms, e.g., threaded interfaces, flange plates with threaded fasteners, etc. There may be additional flow paths for additional fluid flow, such as purge or other reactant liquids, that may flow through the substrate 122 in flow components 124 and 128a, which may be part of a purge flow system/path; and flow components 126 and 128b, which may be part of another reactant flow system/path.

In some arrangements, the gas stick 100 may include a modular substrate. FIGS. 2 through 4 show an example of a modular substrate gas stick. In FIG. 2, the substrate 222 can be seen with the layer of gas flow components 230. FIG. 3 depicts an isometric view of the modular gas stick. Substrate 222 is of a modular design which includes multiple interchangeable parts which are connected to each other with seals, which each introduce potential failure points in the gas stick assembly. Since substrate 222 is made up of multiple parts, it allows for a LEGO® type construction, which provides flexibility in how each gas stick is assembled, which is discussed in further detail below in FIG. 4. However, this design causes the flow path between gas supply components to become long, which increases fluid flow path lengths and thus transit time of gases, and introduces multiple failure points in the gas stick. For example, there may be more sites where leaks may occur, and such configurations may include more interfaces which may have manufacturing defects, tolerance or stackup problems, and/or misalignment of components. In some conventional semiconductor processing gas boxes, a gas box includes discrete gas sticks, built up on discrete substrates such as the modular substrate 222, that are then mounted to a common mounting plate—the fluid flow passages in such conventional gas boxes are provided by the discrete substrates and are not included in the mounting plate.

In FIG. 4, the individual piece-parts of the modular substrate are clearly shown in the exploded view. Each such modular piece-part 232 may interlock with the adjacent modular piece-part 232 and the two interlocked piece-parts 232 may then be bolted together. Once the assembled substrate is complete, then the gas flow components 230, which, in this example, are all valves or sensors of various types, may be assembled to the assembled substrate. Seals 234 may be interposed between the gas flow components 230 and the piece-parts 232 in order to provide a gas-tight seal interface. The gas flow path through such a modular gas stick assembly is represented by the flow arrows in FIG. 2; it is to be understood that the internal features of the valves and sensors in this example are not depicted, although such valves may be any of a variety of surface-mount valve technologies readily available in the industry.

In such arrangements, each gas stick may be located a different distance from the end of the trunk line that serves as the supply to the semiconductor processing chamber. In such arrangements, it may take longer for gases that are introduced into the trunk line further from such a supply end to reach the supply end than gases that are introduced into the trunk line closer to the supply end. In some of these arrangements, a high-flow carrier gas may be introduced into the trunk line to convey lower-flow process gases from the gas sticks to the supply end of the trunk line in a more rapid fashion, which may reduce the time it takes to deliver process fluids to the trunk line supply end.

As mentioned above, a gas delivery system that uses gas sticks may have numerous drawbacks, e.g., long flow path lengths that increase transit time of gases and introduces multiple failure points, these gas sticks may be very space consuming, difficult to access, and difficult to maintain due to, for example, a high packing density of the components. Furthermore, some such systems may require a large amount of tubing, fittings, machined blocks, machined manifolds, and gaskets, which may further increase cost, decrease access and maintainability, as well as introduce more potential failure points into the system.

Another example gas box may be a monolithic structure that includes gas-tight channels that are in fluidic connection with each other. This monolithic structure may include a gas delivery substrate for mounting gas supply components of a gas delivery system that may be formed from stacked layers which are bonded together to create a uniform monolithic structure that is configured to receive and mount gas supply components such that the gas supply components are in fluidic communication with each other via channels within the substrate. FIGS. 5 through 7 depict three example layers of a monolithic substrate. As can be seen, each layer includes different flow paths which may be fluidically connected to other flow paths in other layers and may be configured in various shapes and sizes. For example, FIG. 5 shows a first example layer 534 with multiple first example flow paths 536, while FIG. 6 shows a second example layer 534 with numerous example flow paths 534, and FIG. 7 shows a third example layer 534 with several example flow paths 536.

In some such monolithic structures, each layer may be made from any of a variety of materials, including, for example, stainless steels, glass, or ceramics. In implementations using metal layers, the layers may be brazed together or otherwise bonded together. In implementations using ceramic layers, the layers may be bonded together before sintering and then sintered into a fused layer stack; the bonding material is typically burned off during the sintering process, resulting in a generally homogenous ceramic part. The layers in some such monolithic structures may be manufactured using precision machining.

Figure 8:
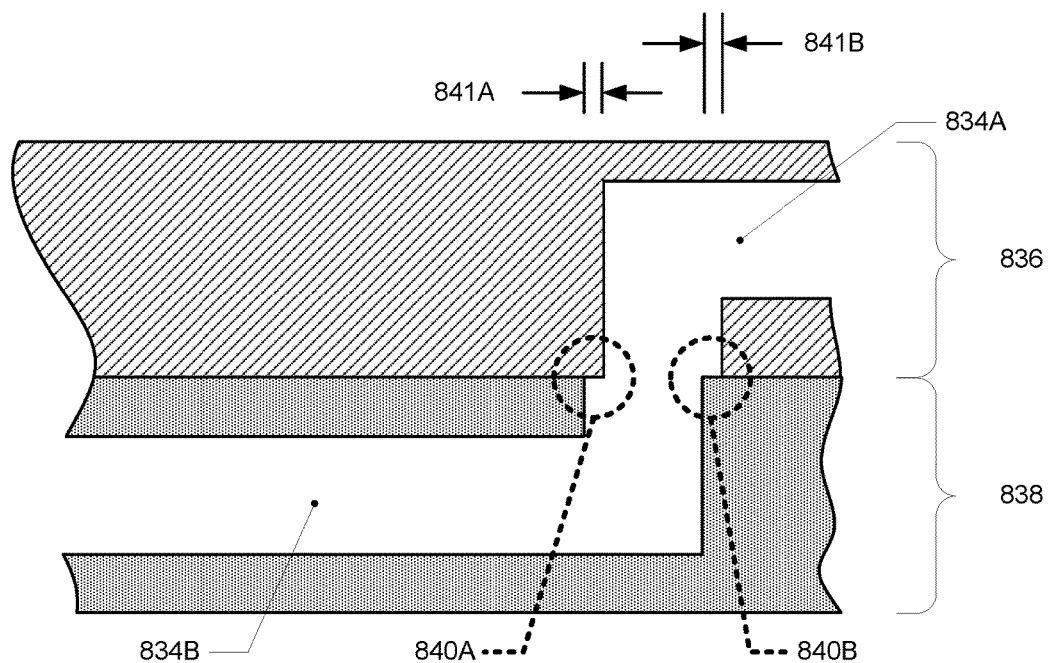
FIG. 8 depicts an example section view of a monolithic structure with a misaligned flow path.

Some potential disadvantages may exist with monolithic structures that are made from bonded or otherwise connected layers. In some such structures, the alignment between each layer may not be exact such that ridges, overlaps, gaps, and other dead zones may form within and between portions of fluidic channels, and these discontinuities may adversely affect fluid flow through a channel and/or adversely affect the structure itself. For instance, a misaligned layer at a bend of a passage may cause an overlap of one or more surfaces which may adversely affect the fluid flowing around such surfaces. FIG. 8 depicts an example section view of a monolithic structure with a misaligned flow path. As can be seen, a first layer 836 includes a first portion of a flow path 834A that is not aligned with a second portion of a flow path 834B that is located in a second layer 838. The misalignment 841A and 841B between the first layer 836 and the second layer 838 has caused discontinuities 840A and 840B to form at the junction between these layers. These discontinuities may adversely affect fluid flow through the flow path, such as creating turbulence and/or a dead volume/space, which in turn may affect the timing and control of fluid flow through the system, act as a particle source/trap, cause gases to slowly leach out of the flow path, and/or may cause a "virtual leak" in the gas delivery system, all of which may increase wafer defects and/or adversely affect wafer processing.

Figure 9:
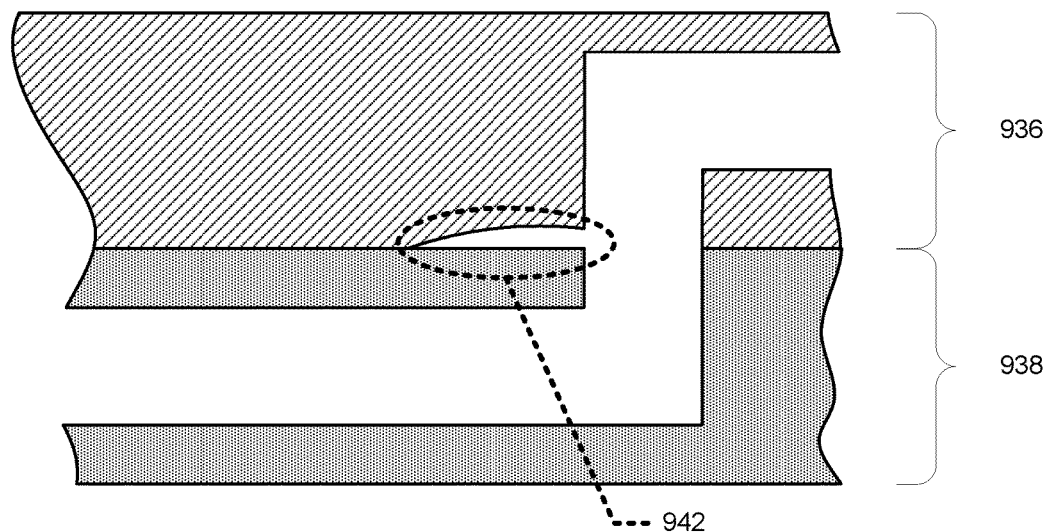
FIG. 9 depicts an example section view of a monolithic structure with a gap between two layers.

Another disadvantage of a layered monolithic structure is that one or more gaps may potentially form between two layers, e.g., due to improper or poor bonding, which may decrease structural integrity of the layered stack, as well as adversely affecting fluid flow through the structure as described above, including, for instance, creating a particle source/trap in the flow path. FIG. 9 depicts an example section view of a monolithic structure with a gap between two layers. Similar to FIG. 8, FIG. 9 includes a first layer 936 and a second layer 938, but here a gap 942 is formed between the two layers. Such a gap may case adversely affect flow through the flow path like the misalignment/discontinuities discussed above. Additionally, a gap may compromise the structural integrity of a structure, e.g., causing the layers to delaminate and/or deform; such effects may not only negatively affect fluid flow, but also lead to a catastrophic failure of structure.

The nature of constructing a monolithic structure with layers, e.g., with a ceramic and/or metal, is such that perfect alignment between each layer may not be achieved, which may therefore result in gaps, misalignments, discontinuities, and the like as discussed above.

In some instances, gas boxes may include manifolds that are monolithic structures made from a single piece of a material that may be machined to a desired configuration. In some such structures, the flow paths through the structure may be made using traditional machining techniques, although there may be numerous disadvantages to this approach. For instance, some such structures may require the creation of a long, straight flow path which may be achieved by a technique known as "gun-drilling", but this technique has limitations on allowable drill depth—for example, gun-drilled holes have a tendency to "wander" with increasing hole depth, making it difficult to ensure that two gun-drilled holes that intersect do so in an aligned manner. Accordingly, in some such structures, gun-drilling cannot create a long enough flow path through the manifold. Another disadvantage is that some gun-drilled holes may not maintain their alignment if they are drilled to deep which in turn may result in misalignment with other holes and/or components and thereby causing sharp internal edges to form which have the aforementioned disadvantages. Moreover, it is often the case that a gun-drilled flow passage may need to be plugged at the location where the gun-drilled hole exits the manifold block. Such plugs introduce additional cost and may also introduce a dead volume in the flow passage that makes purging of the flow passage difficult.

Figure 10:
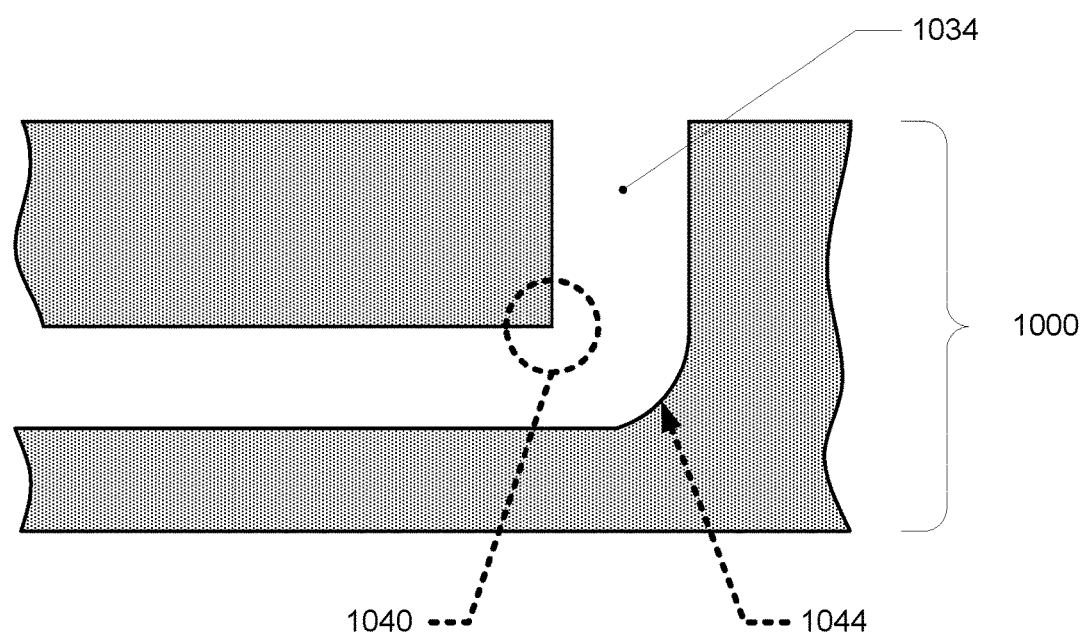
FIG. 10 depicts an example monolithic structure that has a partially-rounded and partially sharp internal bend.

Furthermore, for some such monolithic structures made from a single piece of a material, traditional manufacturing techniques are unable to create internal flow paths with smooth internal bends without any sharp edges. Flow paths with internal bends that have edges may adversely affect fluid flow by, for example, creating dead zones, turbulent flow, and/or other negative effects, which may cause, for instance, turbulence and/or condensation of precursor and/or precursor buildup. For example, some such structures may require a flow path with a 90-degree bend. One technique to create such a corner is to drill two holes through the single piece of material at 90-degree angles such that the bottoms of the holes intersect. Typically, a drill bit or end mill with a rounded or semi-rounded nose may be used, which may create a bend with a partially rounded internal edge, but, given the nature of the geometries involved, is not able to create a bend without any sharp internal edge. FIG. 10 depicts an example monolithic structure that has a partially-rounded and partially sharp internal bend. As can be seen, the example monolithic structure 1000 includes a flow path 1034 that has an internally rounded bend 1044, but also has a sharp internal edge 1040. With many traditional machining techniques, the sharp internal edge 1040 cannot be rounded.

A different example gas box may be constructed using a series of pipes, tubes, valves, and/or fittings arranged together into a desired configuration. This example gas box may include flow components, such as a mass flow controller ("MFC") and valves, which may be installed onto a frame and/or manifold block(s), and connections between some or all of these flow components may be made using tubes and/or fittings. In some such situations, the tubes may be bent to desired shapes in order to properly interconnect certain flow components. Fittings may also be used to interconnect the tubes when, among other things, the tubes cannot be bent into to a desired shape or angle. Again, numerous disadvantages exist with this type of gas box. For instance, tubes have certain bend radius limitations such that they cannot be bent too tightly or else the tubes may fail, kink, become damaged, and/or shorten the life of the tube, e.g., by virtue of work hardening due to excessive strain during a tight-radius bend. Furthermore, the tube, in order to bend a tube into some configurations, the tube must be gripped in two or more places, but depending on the configuration and/or the desired bend, gripping the tube may be impracticable and/or may damage the tube, especially if one or more bends are to be placed within a short distance of the tube. For example, making a 3-dimensional, tightly-curved serpentine design may not be possible by bending a tube. Additionally, in some such example gas boxes, some tight corners may be made using a fitting between two or more tubes. However, many typical fittings include sharp internal edges which may lead to the aforementioned adverse effects on fluid flow through the tubes and/or fittings.

While in theory some structures of a gas box manifold may be created using one or more casting techniques, which may include plaster molding, shell molding, investment casting, and lost foam casting, the present inventors determined that such techniques are generally not feasible or practical for constructing a gas box or some parts of a gas box, for semiconductor processing. For instance, investment casting is a slow (e.g., long production-cycle times and low throughput), labor intensive, and expensive process because, in some situations, the core used for the casting is thrown away after every molding, thereby requiring the creation of a core for each new casting process. The structures that can be created using casting techniques are also limited. For example, casting cannot create some intricate configurations of hollow flow passages and cannot create holes and/or passages that are smaller than a specific diameter.

The assignee of this disclosure has undertaken to fundamentally change the design of gas boxes for use in semiconductor manufacturing to make these systems more streamlined, higher functioning, more compact, and less expensive. As part of this effort, the present inventors determined that a gas box with a manifold created using additive manufacturing, e.g., three-dimensional printing, that includes: a) fluid flow components linked to a common mixing chamber by generally equal-length flow passages, b) some fluid flow components generally arranged in a circular pattern about the mixing chamber, c) three-dimensional fluid flow passages, and/or d) fluid flow passages without sharp internal edges, may significantly improve fluid routing and delivery, manufacturability, and maintainability as compared with gas boxes using manifolds made using other techniques. Such a gas box created using additive manufacturing is not only improved over traditional gas box designs, but also improved over gas boxes that may be created using other traditional manufacturing techniques.

The above improvements may be provided by way of a manifold constructed by additive manufacturing (hereinafter "manifold") that may generally provide a mixing chamber that is fluidically connected with a plurality of flow paths arranged around the mixing chamber. Each of these fluid flow paths may lead to one or more fluid flow component interfaces, via one or more tubular passages, which may interface with a fluid flow component such that the fluid flow paths may be used to deliver a process gas or liquid to the mixing chamber.

Figure 11:
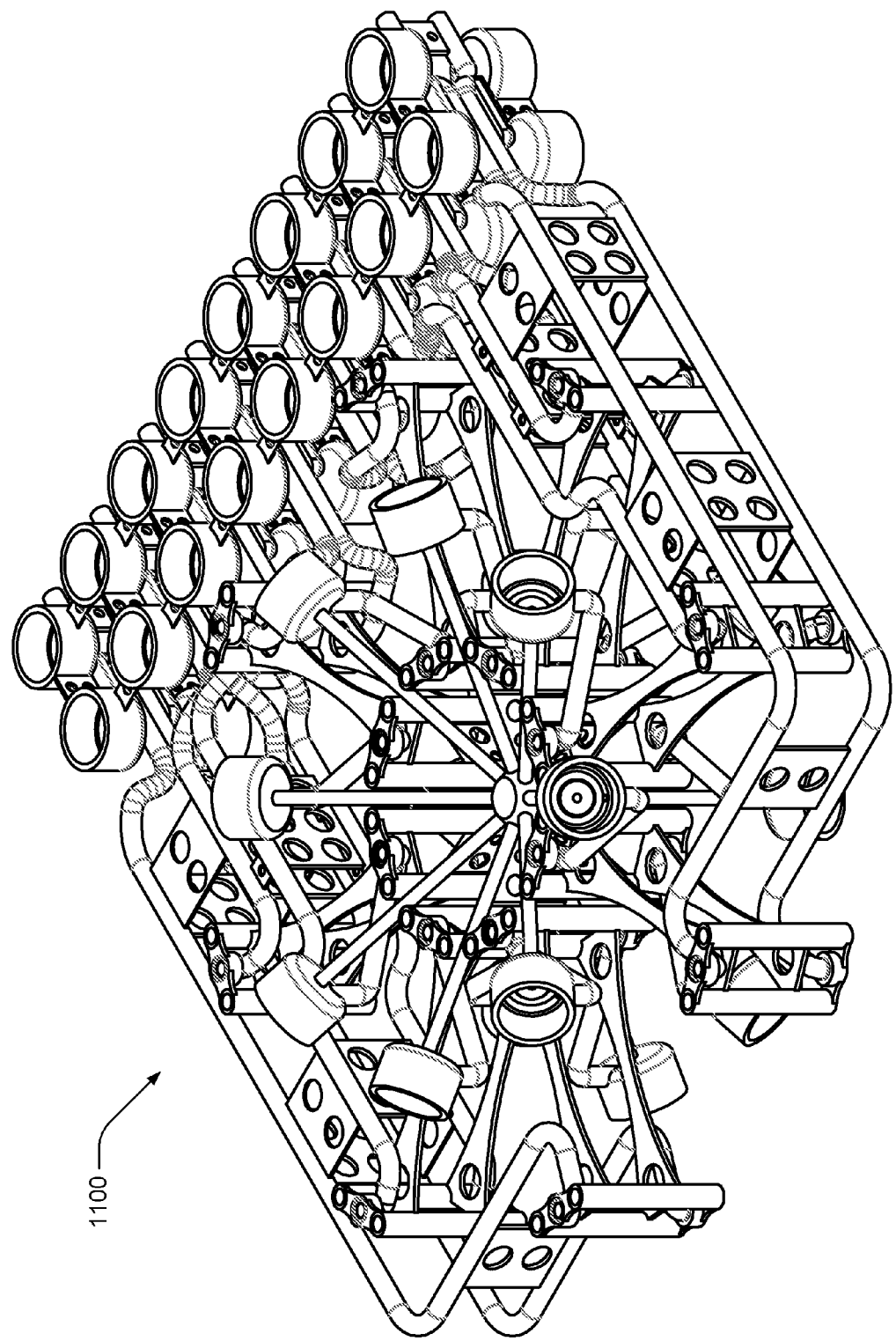
FIG. 11 depicts an isometric view of an example manifold created by additive manufacturing.
Figure 12:
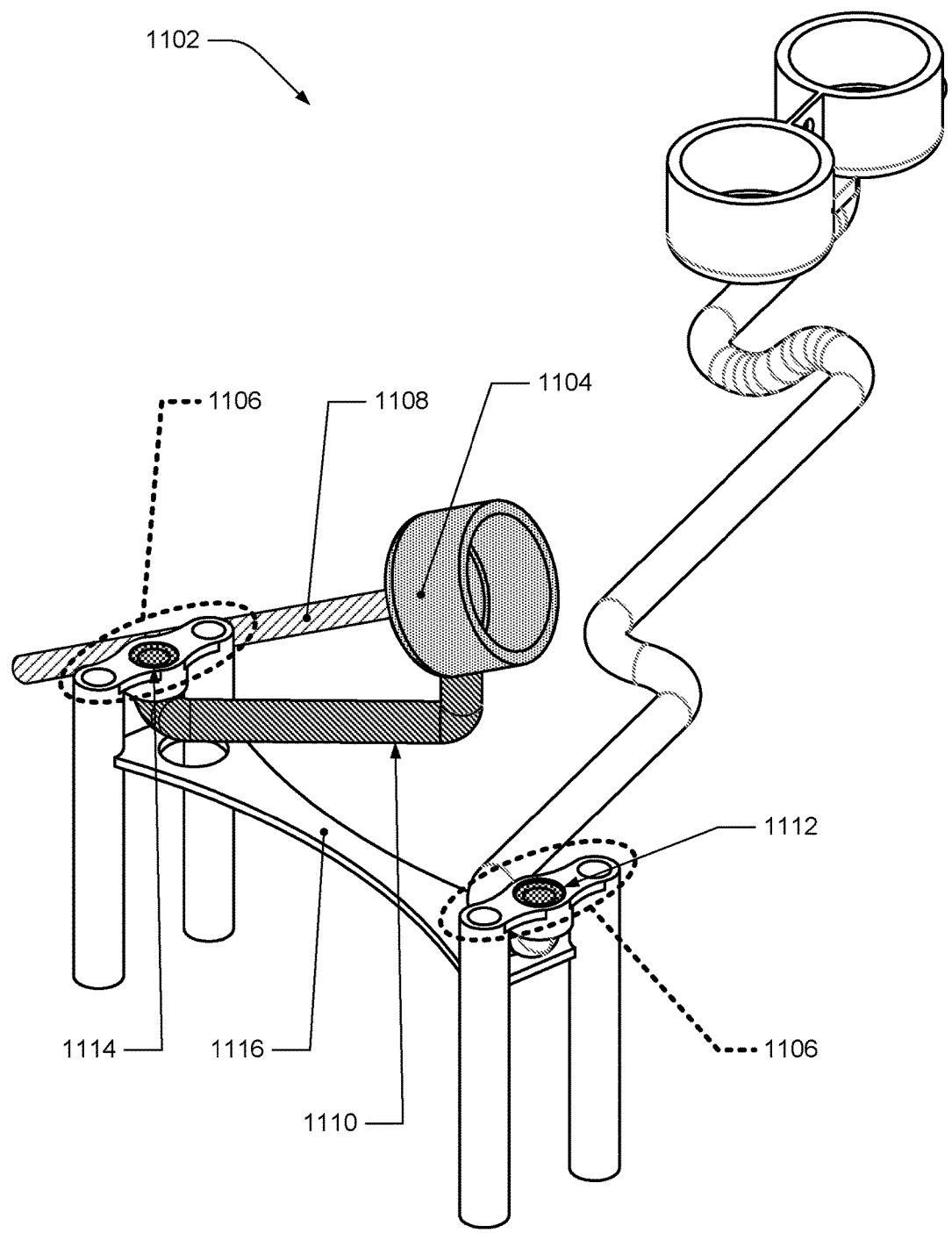
FIG. 12 depicts an isometric view of one isolated flow path from the example manifold of FIG. 11.
Figure 13:
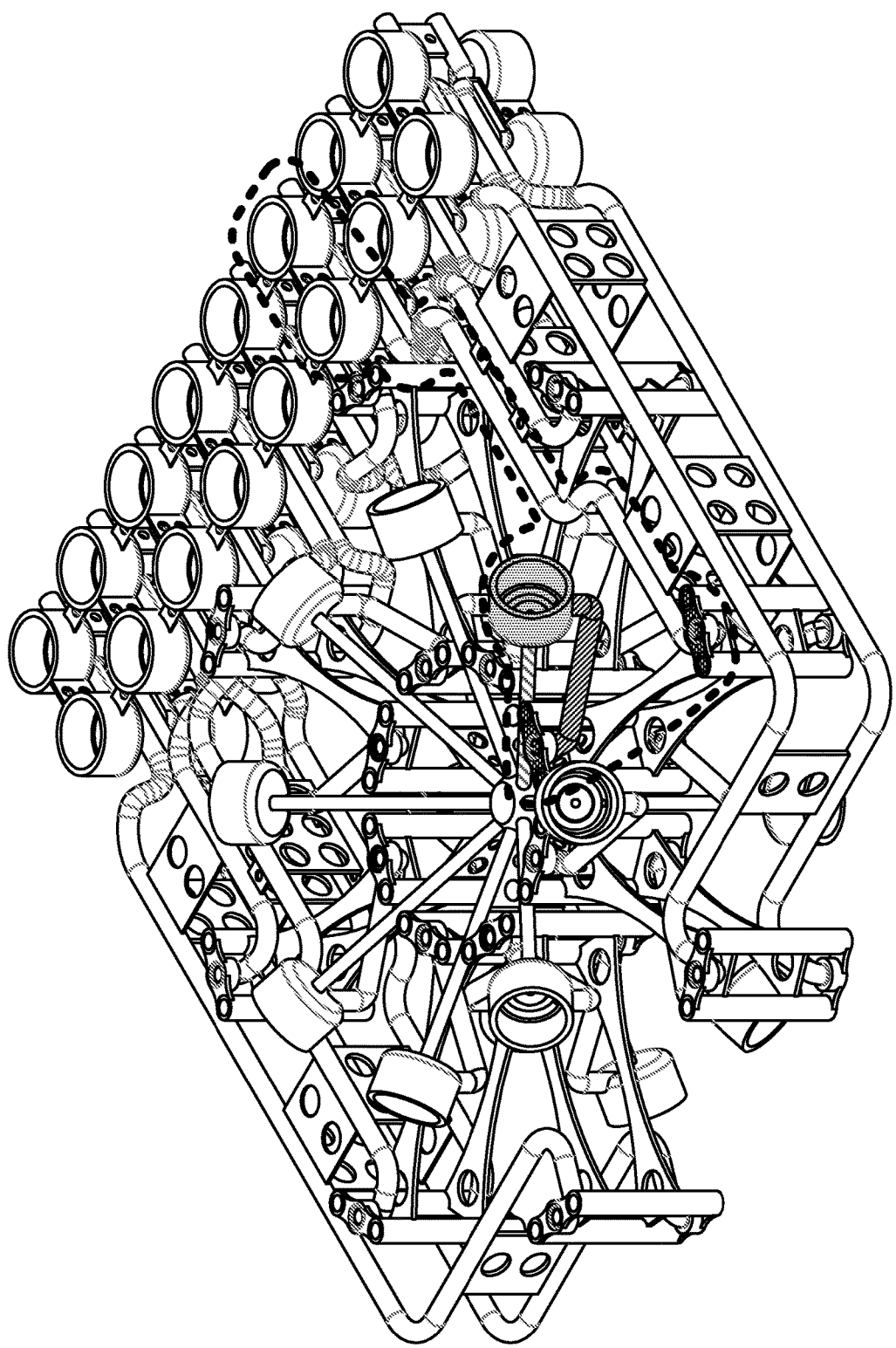
FIG. 13 depicts an isometric view of the manifold of FIG. 11 with a first flow path identified inside a dashed line.

FIG. 11 depicts an isometric view of an example manifold 1100 created by additive manufacturing. FIG. 12 depicts an isometric view of one isolated flow path from the example manifold 1100 of FIG. 11. FIG. 13 depicts an isometric view of the manifold of FIG. 11 with the first flow path identified inside the dashed line. As can be seen in FIG. 12, the isolated first flow path 1102 (hereinafter "the first flow path") includes a first fluid flow component interface 1104 shown with shading, a second fluid flow component interface 1106 identified by the dashed ellipses, a first tubular passage 1108 shown with cross-hatching, and a second tubular passage 1110 shown with a different cross-hatching. The second fluid flow component interface 1106 includes a second fluid flow component interface inlet 1112 and a second fluid flow component interface outlet 1114, both of which are identified with shading, connected to each other by a structural support 1116. The first tubular passage 1108 is fluidically connected to the mixing chamber (identified as 1154 in FIGS. 14 and 15) such that fluid may flow from the first tubular passage 1108 into the mixing chamber 1154.

In some embodiments, the first fluid flow component interface 1104, the second fluid flow component interface 1106, the first tubular passage 1108, and the second tubular passage 1110 of each flow path are separate from the first fluid flow component interfaces, the second fluid flow component interfaces, the first tubular passages, and the second tubular passages of the other flow paths in the manifold, although such flow paths may all eventually flow into the same mixing chamber. This type of separation between flow paths is illustrated in at least FIGS. 11, 15, 25, and 29, and their corresponding discussions.

Figure 14:
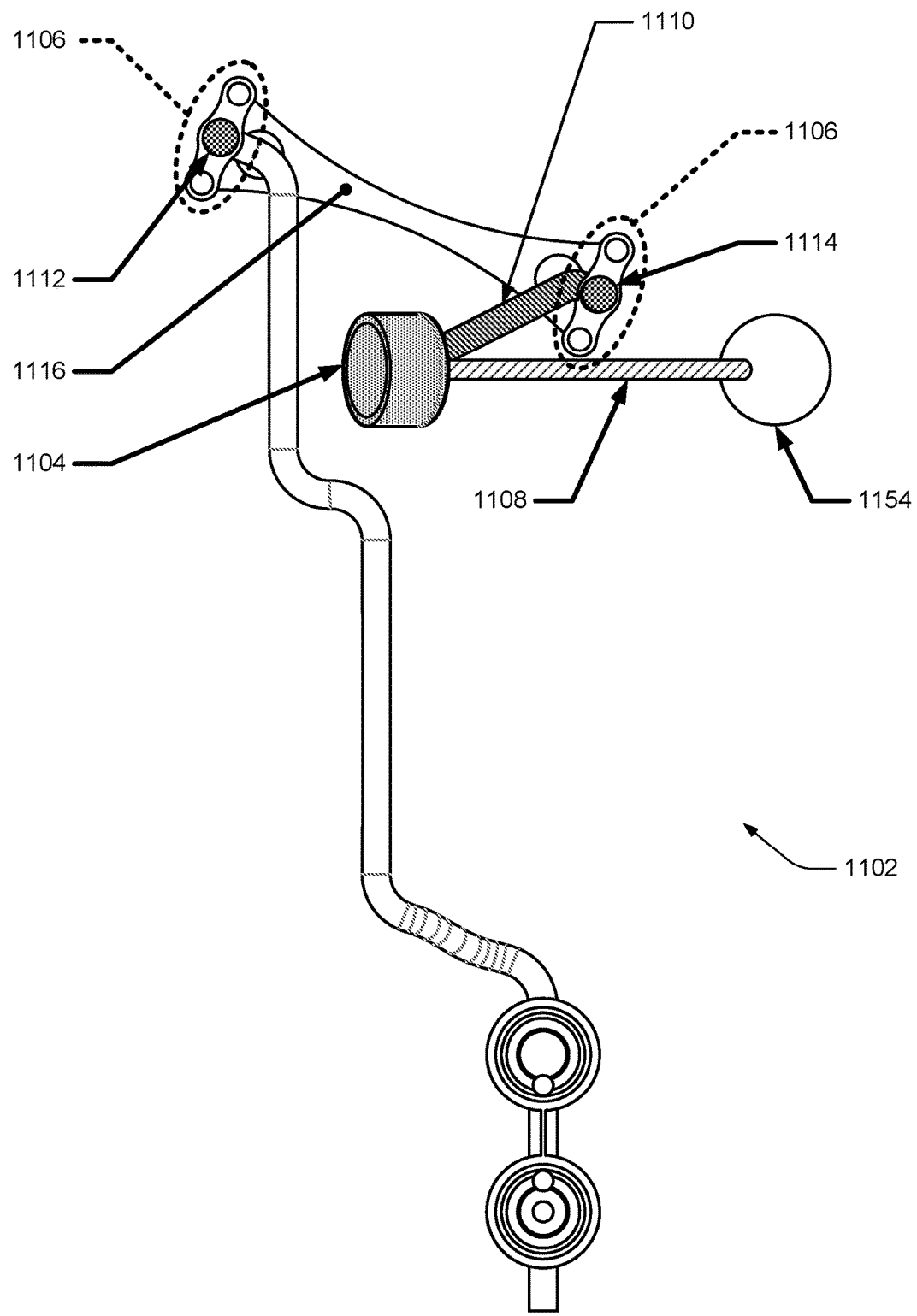
FIG. 14 shows a plan view of the first flow path of FIG. 12 from the same viewpoint of FIG. 15.
Figure 15:
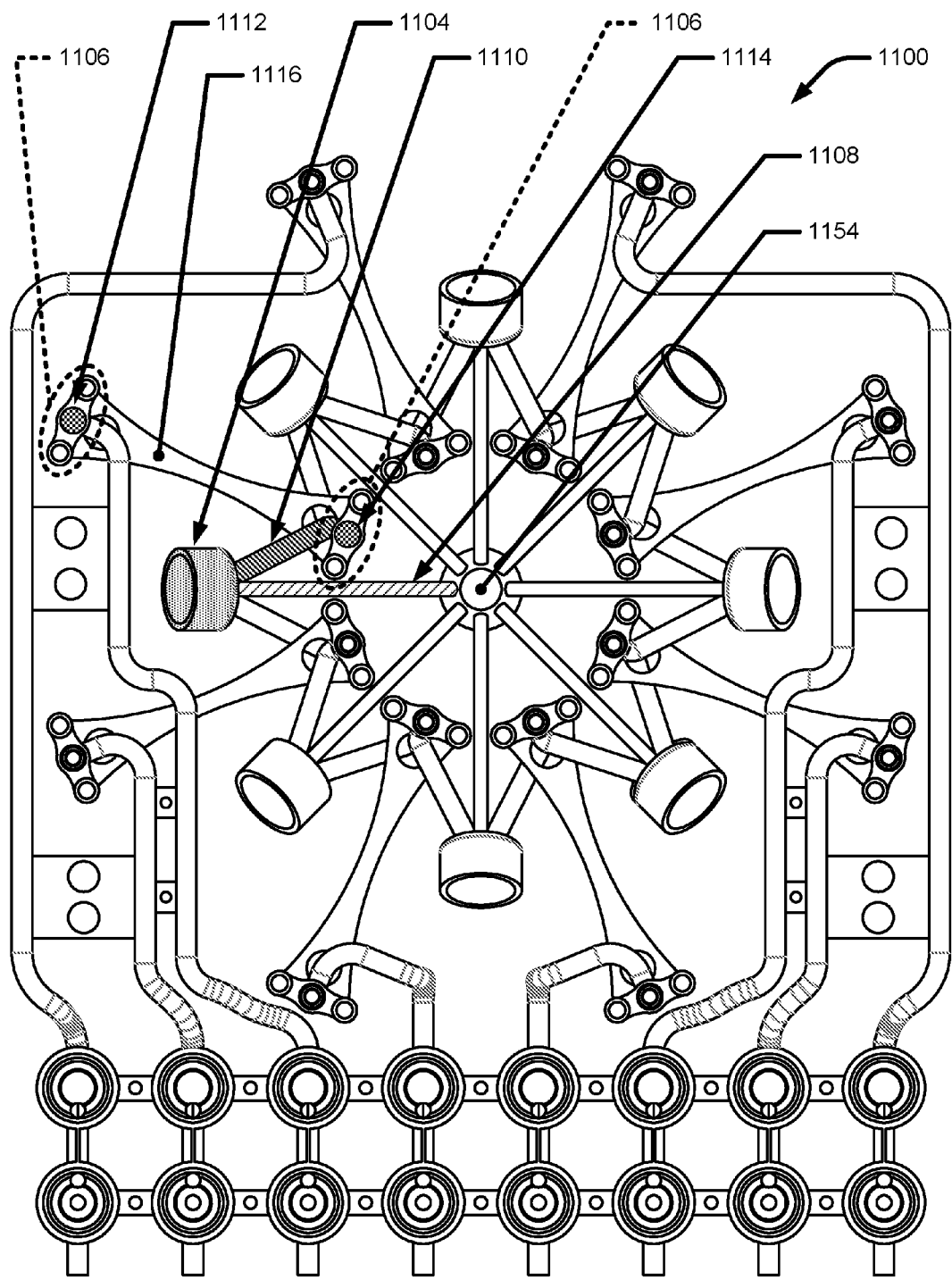
FIG. 15 depicts a plan view of the first flow path of FIG. 12 in the manifold.

FIG. 14 shows a plan view of the first flow path of FIG. 12 from the same viewpoint of FIG. 15. Here in FIG. 14, the first flow path is shown with the same elements identified in FIG. 12. The mixing chamber 1154, which is fluidically connected with the first passage 1108, is also included in FIG. 14. Similarly, FIG. 15 depicts a plan view of the first flow path of FIG. 12 in the manifold. As can be seen, the same elements in FIGS. 12 and 14 are highlighted, including the mixing chamber 1154.

Like with the second fluid flow component interface 1106, the first fluid flow component interface 1104 similarly includes a first fluid flow component interface inlet 1118 and a first fluid flow component interface outlet 1120 which cannot be seen in FIG. 12, but can be seen in FIGS. 16 and 17. FIG. 16 depicts an off angle view of the first flow path 1102 of FIG. 12, and FIG. 17 depicts a detail view of a portion of the first flow path 1102 from FIG. 16. In FIG. 16, the flow path 1102 is rotated and angled from FIG. 12 such that the inside of the first fluid flow component interface 1104 can be viewed. The portion of flow path 1102 encircled by the dashed line in FIG. 16 is enlarged in FIG. 17 in order to view the first fluid flow component interface inlet 1118 and the first fluid flow component interface outlet 1120, which are holes that are identified by shading.

Referring back to FIGS. 12, 14, 16, and 17, the first flow path 1102 may be arranged such that the first tubular passage 1108 fluidically connects a first mixing chamber (identified as mixing chamber 1154 on FIG. 15) with the first fluid flow component interface outlet 1120, and the second tubular passage 1110 fluidically connects the first fluid flow component interface inlet 1118 and the second fluid flow component interface outlet 1114. The first fluid flow component interface 1104 may be fluidically interposed between the first tubular passage 1108 and the second tubular passage 1110. The first fluid flow component interface 1104 may also be configured to interface with a corresponding first fluid flow component (not shown) such that the corresponding first fluid flow component, when installed, is able to interact with fluid flow between the first fluid flow component interface inlet 1118 and the first fluid flow component interface outlet 1120. For example, in some embodiments the first fluid component may be a valve that may be configured to regulate fluid flow through the first fluid flow component interface 1104. In some other embodiments the fluid flow component may be a mass flow controller, a regulator, a sensor, and/or a measuring device.

In some embodiments, a fluid flow component interface may be configured to interface with a fluid flow component by using a surface-mount interface. In some such embodiments, a surface-mount fluid flow component may be configured to be mounted to a flat surface with an inlet and an outlet port (these interfaces will generally include seals). Such a face-mount fluid flow component will generally have internal flow paths or flow recesses that, when the fluid flow component is mounted to the flat surface, serve to define a contained flow path for the gas or liquid that is routed through the fluid flow component. For example, the second fluid flow component interface 1106 depicted in at least FIG. 12 is a surface mount interface. As can be seen in FIG. 12, the second fluid flow component interface 1106 includes two separate flat surfaces, each within a dashed ellipse, that are the surfaces on which a fluid flow component mounts. Each flat surface of the interface second fluid flow component interface 1106 also includes an inlet or outlet, i.e., the second fluid flow component interface inlet 1112 and the second fluid flow component interface 1114, such that a flow path between the second fluid flow component interface inlet 1112 and the second fluid flow component interface outlet 1114 is created when a second fluid flow component is interfaced with the second fluid flow component interface 1106.

In some other embodiments, a fluid flow component interface may be configured to interface with a fluid flow component by using a threaded bore-type interface. In some such embodiments, the fluid flow component interface may be of a cylindrical shape and/or may include a threaded bore such that a threaded fluid flow component, such as a valve, may connect with the fluid flow component interface. One such example is discussed below and shown in FIGS. 18 and 19.

Figure 18:
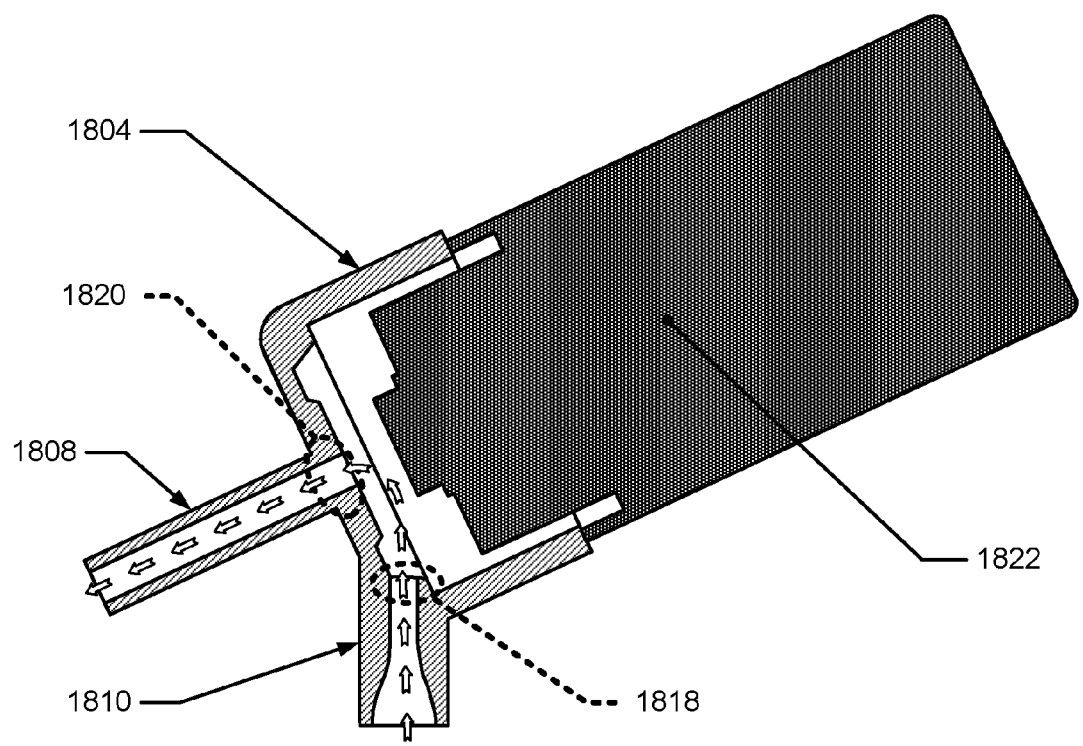
FIG. 18 depicts a cross-sectional view of an example fluid flow component interfaced with a first fluid flow component interface.
Figure 19:
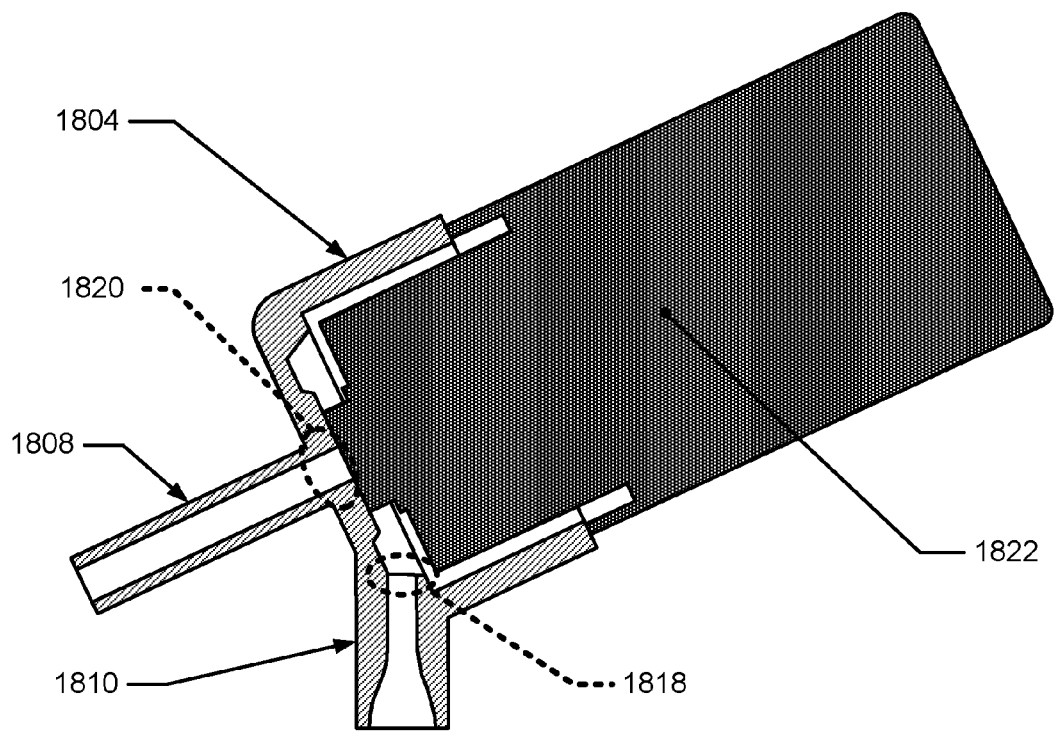
FIG. 19 depicts another cross-sectional view of the example fluid flow component interface of FIG. 18.

FIG. 18 depicts a cross-sectional view of an example fluid flow component interfaced with a first fluid flow component interface. As can be seen, a first fluid flow component interface 1804 includes a first fluid flow component interface outlet 1820, as indicated with a dashed ellipse, that is fluidically connected to a first tubular passage 1808, and a first fluid flow component interface inlet 1818, also indicated with a dashed ellipse, that is fluidically connected to a second tubular passage 1810. The first fluid flow component interface 1804 here is configured such that a first fluid flow component 1822, which in this example is a valve, may be interfaced with the first fluid flow component interface 1804 such that the valve can regulate fluid flow between the second tubular passage 1810 and the first tubular passage 1808. The valve in FIG. 18 is shown in an "open" position such that fluid may flow through the second tubular passage 1810, into and through the first fluid flow component interface inlet 1818, into the first fluid flow component interface 1804, into and through the first fluid flow component interface outlet 1820, and into and through the first tubular passage 1808; this path is exemplified by the white arrows. FIG. 19 depicts another cross-sectional view of the example fluid flow component interface of FIG. 18. In FIG. 19, the first fluid flow component 1822 is shown in the "closed" position such that no fluid may flow between the first fluid flow component interface inlet 1818 and the first fluid flow component interface outlet 1820, and such that fluid may not flow from and through the second tubular passage 1810 to the first tubular passage 1808.

Similarly, the second fluid flow component 1106 may be configured to interface with a corresponding second fluid flow component such that the corresponding second fluid flow component, when installed, is able to interact with fluid flow between the second fluid flow component interface inlet 1112 and the second fluid flow component interface outlet 1114. In some embodiments, as mentioned above, the second fluid flow component may be a mass flow controller that may regulate fluid flow between the second fluid flow component interface inlet 1112 and the second fluid flow component interface outlet 1114.

In some surface-mount fluid flow component interface embodiments, a fluid flow component interface may be provided by two different, non-contiguous interface surfaces. For example, the second fluid flow component interface depicted in at least FIGS. 12 and 14, are configured such that the second fluid flow component interface 1106 includes two non-contiguous interface surfaces: a first interface surface (not labeled) that includes the second fluid flow component interface outlet 1114 as well as some mounting features, and a second interface surface (not labeled) that includes the second fluid flow component interface inlet 1112. These first and second interface surfaces are non-contiguous in that they, among other things, are not subregions of the same surface, but are provided by discrete surfaces—in this case with a large gap or open space between them, in contrast to the first fluid flow component interface 1104 depicted in at least FIGS. 12, 16, and 17. In some embodiments, the first interface surface and the second interface surface may be connected by a member, such as the structural support 1116 in FIG. 12.

In some embodiments, the first flow path 1102 may be configured such that when a first fluid flow component is interfaced with the first fluid flow component interface then fluid may flow through and from the second fluid flow component interface outlet 1114, into and through the second tubular passage 1110, into and through the first fluid flow component interface inlet 1118, into and through the first fluid flow component interface outlet 1120, into and through the first tubular passage 1108, and into the mixing chamber (1154 in FIG. 15). In some such embodiments, the flow path 1102 may also be configured such that when a second fluid flow component is interfaced with the second fluid flow component interface 1106, fluid may flow through the second fluid flow component interface inlet 1112, into and through the second fluid flow component interface outlet 1114, into and through the second tubular passage 1110, into and through the first fluid flow component interface inlet 1118, into and through the first fluid flow component interface outlet 1120, into and through the first tubular passage 1108, and into the mixing chamber.

Figure 20:
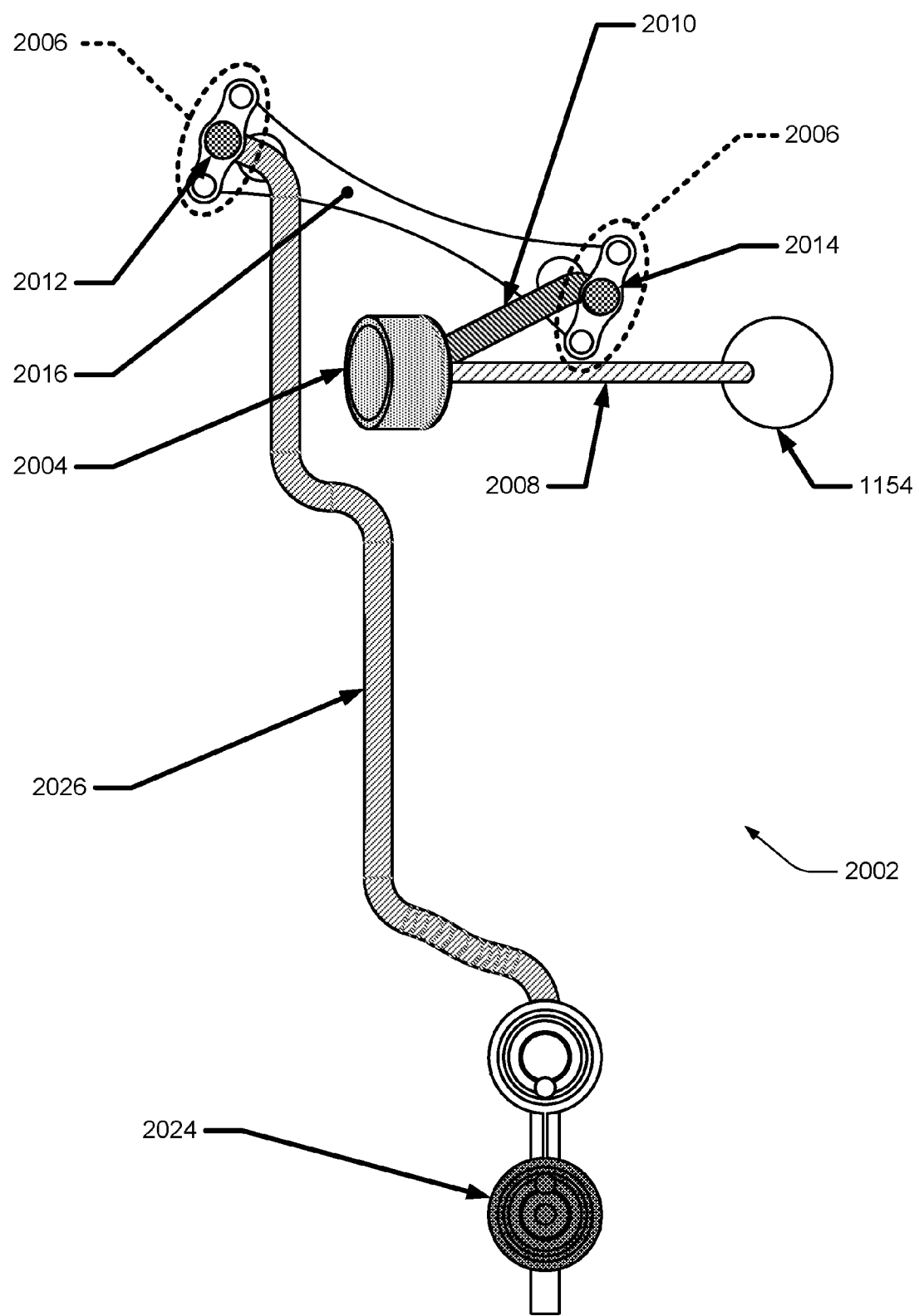
FIG. 20 depicts a plan view of a second fluid flow path that includes a third fluid flow component interface and a third tubular passage.
Figure 21:
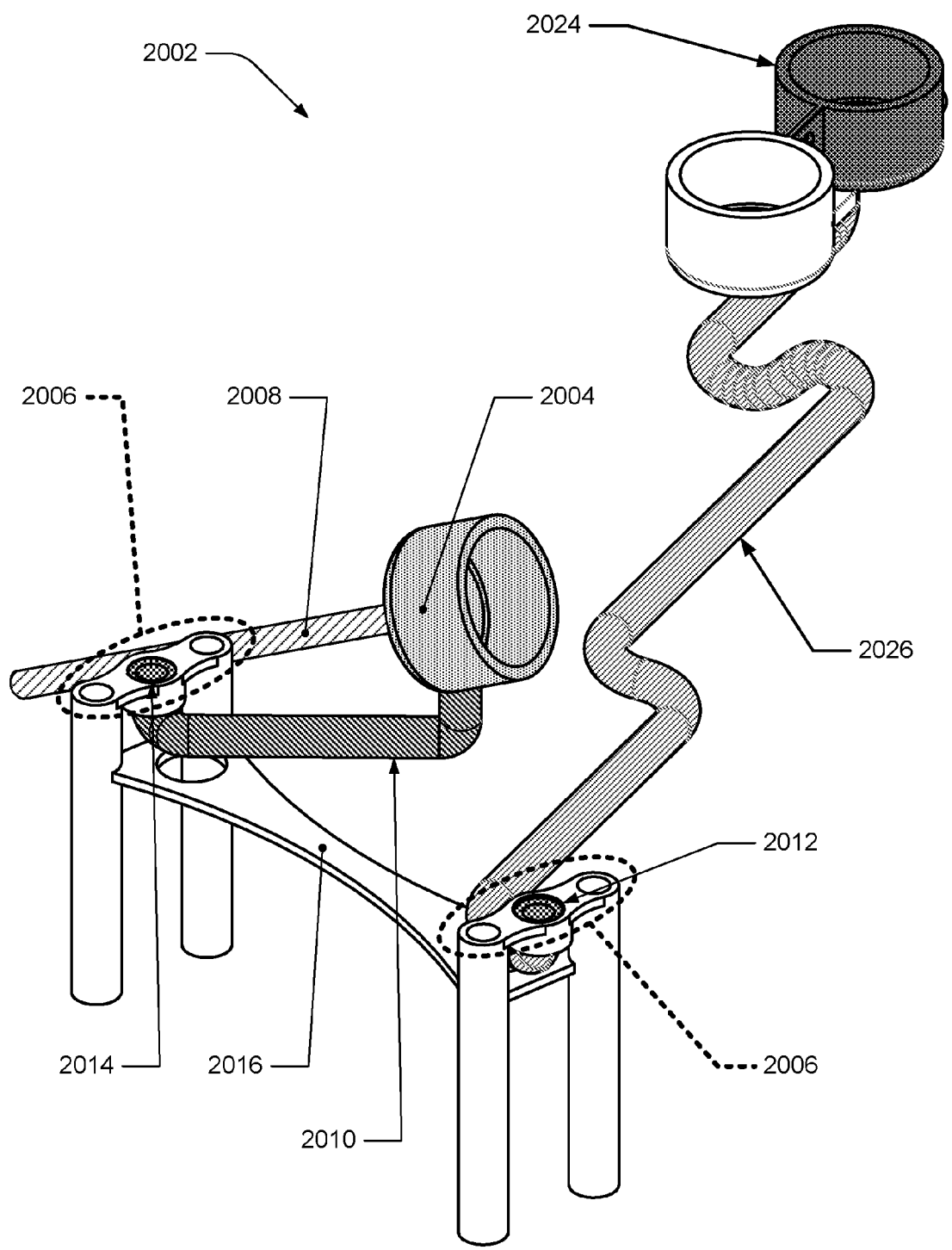
FIG. 21 depicts an isometric view of the second flow path of FIG. 20.

In some embodiments, each flow path of the manifold may also include a third fluid flow component interface, which may include a third fluid flow component interface inlet and a third fluid flow component outlet, and each flow path may also include a third tubular passage that may fluidically connect the second fluid flow component interface inlet of that flow path with the third fluid flow component interface outlet of that flow path. FIG. 20 depicts a plan view of a second fluid flow path that includes a third fluid flow component interface and a third tubular passage; FIG. 21 depicts an isometric view of the second flow path of FIG. 20. The second flow path 2002 may be similar to or identical to the first flow path 1102 discussed above and shown in at least FIGS. 12 and 14. For instance, the second flow path 2002 may include the same elements as the first flow path 1102 and may be configured similarly. Here in FIG. 20, the second flow path 2002 includes a first fluid flow component interface 2004 shown with shading, a second fluid flow component interface 2006 identified by the dashed circles, a first tubular passage 2008 shown with cross-hatching, and a second tubular passage 2010 shown with a different cross-hatching. The second fluid flow component interface 2006 includes a second fluid flow component interface inlet 2012 and a second fluid flow component interface outlet 2014, both of which are identified with shading, and which are connected to each other by a structural support 2016. As stated above, these items may be configured similarly and/or identically to the first flow path 1102 such that, for instance, the second tubular passage 2010 fluidically connects the second fluid flow component interface outlet 2014 with the first fluid flow component interface inlet (not shown).

Figure 22:
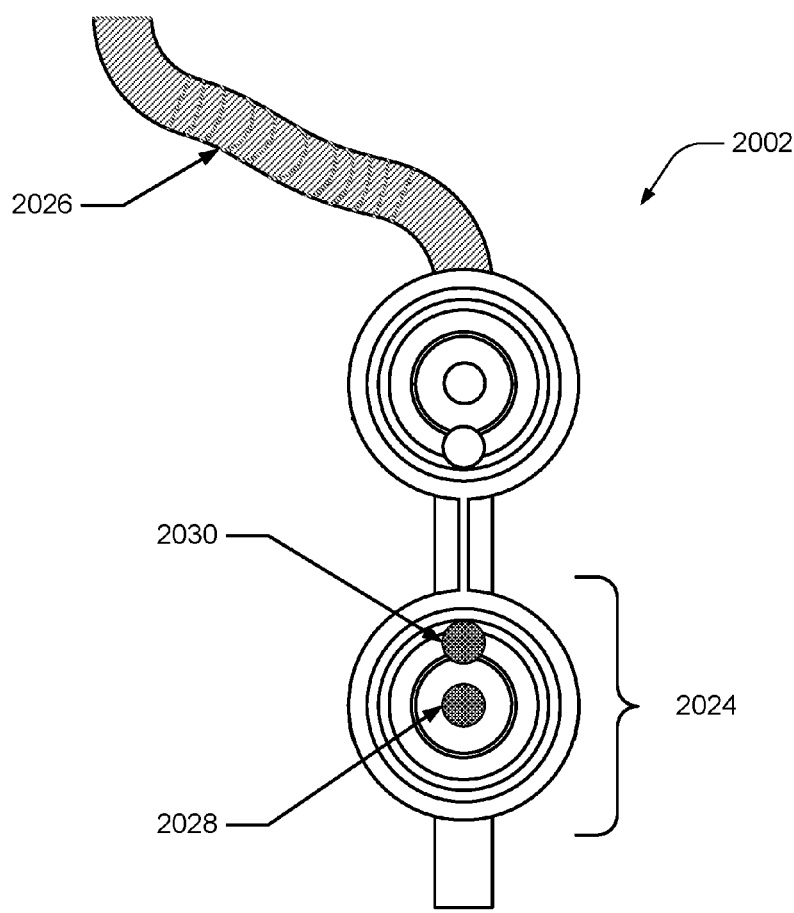
FIG. 22 depicts a plan view of a portion of the second flow path of FIG. 20 showing the third fluid flow component interface and a part of the third tubular passage.
Figure 23:
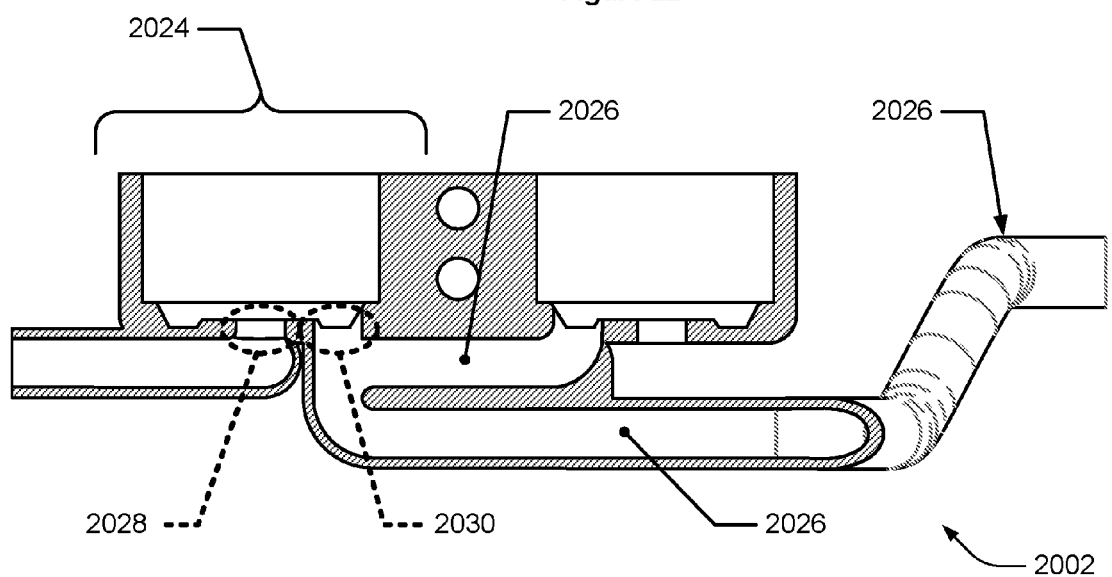
FIG. 23 depicts a cross-sectional view of the portion of the second flow path from FIG. 22.

The second flow path 2002 in FIG. 20 also includes a third fluid flow component interface 2024 and a third tubular passage 2026. The third fluid flow component interface 2024 may include a third fluid flow component interface inlet and a third fluid flow component interface outlet, which can be seen in FIGS. 22 and 23. FIG. 22 depicts a plan view of a portion of the second flow path 2002 showing the third fluid flow component interface 2024 and a part of the third tubular passage 2026. The third fluid flow component interface 2024 includes a third fluid flow component interface inlet 2028 and a third fluid flow component interface outlet 2030. FIG. 23 depicts a cross-sectional view of the portion of the second flow path from FIG. 22. As can be seen, the third fluid flow component interface 2024 includes the third fluid flow component interface inlet 2028 and the third fluid flow component interface outlet 2030, and the third the third tubular passage 2026 is fluidically connected to the third fluid flow component interface outlet 2030. In some embodiments, fluid may flow from the third fluid flow component interface 2024, through the third tubular passage 2026, and to the second fluid flow component interface inlet 2012. The second fluid flow component interface 2006 may also be fluidically interposed between the second tubular passage 2010 and the third tubular passage 2026 of that flow path.

Similar to the first and second fluid flow component interfaces, 2004 and 2006, respectively, the third fluid flow component interface 2024 may be configured to interface with a corresponding third fluid flow component (not shown) such that the corresponding third fluid flow component, when installed, is able to interact with fluid flow between the third fluid flow component interface inlet 2028 and the third fluid flow component interface outlet 2030. In some such embodiments, the third fluid flow component interface 2024 may be configured such that the third fluid flow component may be able to regulate flow between the third fluid flow component interface inlet 2028 and the third fluid flow component interface outlet 2030, as described above and shown in FIGS. 18 and 19.

Figure 24:
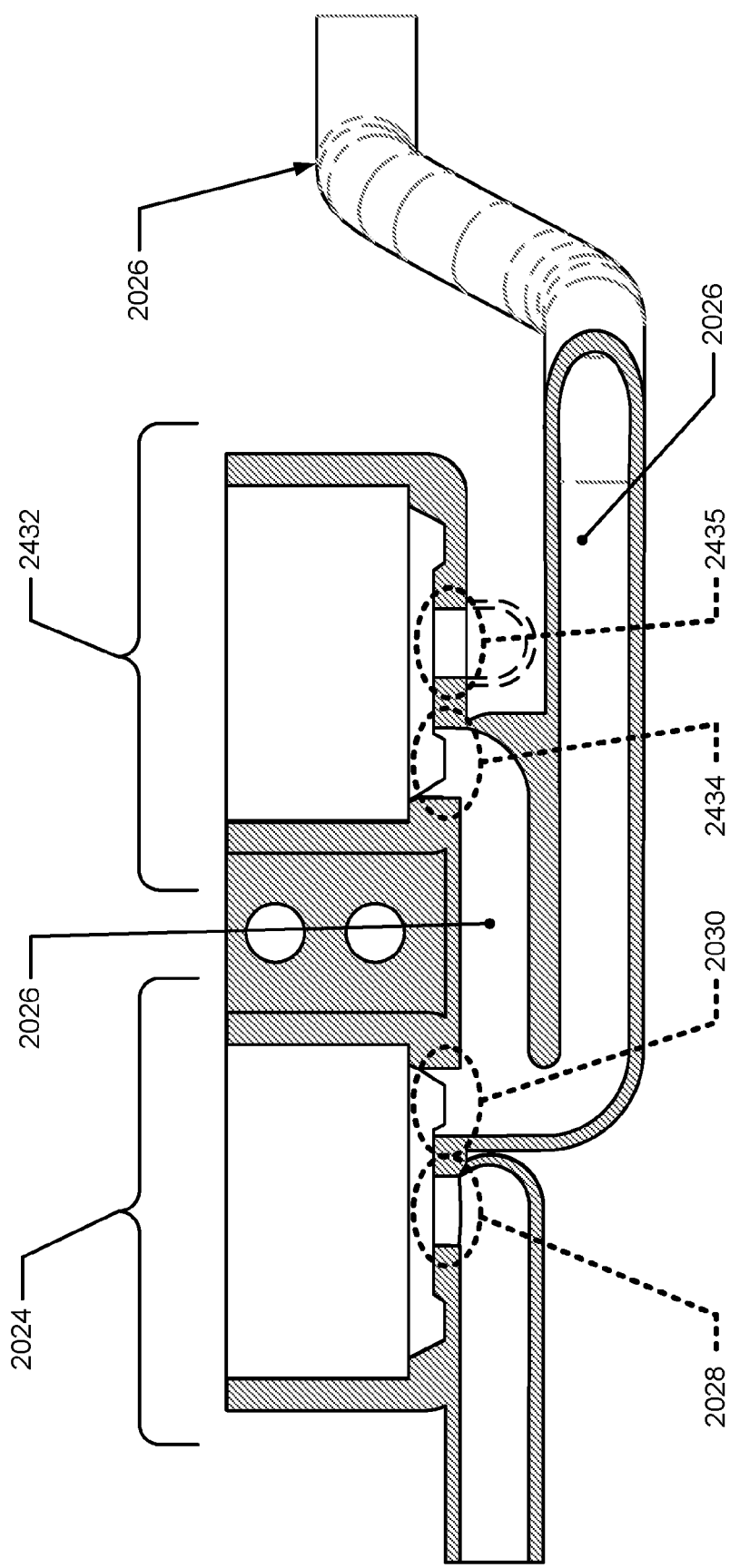
FIG. 24 depicts the same portion of the cross-sectional view of the portion of the second flow path from FIG. 23, but identifies additional features of a fourth fluid flow component interface.

In some embodiments, the manifold may include a flow path that also includes a fourth fluid flow component interface which may include a fourth fluid flow component interface inlet. FIG. 24 depicts the same portion of the cross-sectional view of the portion of the second flow path 2002 from FIG. 23, but identifies additional features of a fourth fluid flow component interface 2432. The fourth fluid flow component interface 2432 is, in this example, part of the second example flow path 2002 and includes a fourth fluid flow component interface outlet 2434 that is fluidically connected to the third tubular passage 2026 and a fourth fluid flow component interface outlet 2435 that is fluidically connected to the fourth fluid flow component interface 2432. In some embodiments, the fourth fluid flow component interface outlet 2435 may be fluidically connected to other components, such as a manifold and/or fourth fluid components interface outlets of other flow paths in the manifold. This may include an additively-manufactured tubular passage, not identified but shown with dashed lines directly below the fourth fluid flow component interface outlet 2435, that travels in a path perpendicular to the page and in between the third tubular passage 2026 and the fourth fluid flow component interface 2432, which may provide a fluid to the fourth fluid flow component interface outlet 2435. This additively-manufactured tubular passage may be a common passage for all such instances of the depicted valve seat arrangement. In some embodiments, the fourth fluid flow component interface 2432 may be used to introduce a purge gas for purging the corresponding flow path. Furthermore, similar to the other fluid flow component interfaces discussed above, the fourth fluid flow component interface 2432 may be configured to interface with a corresponding fourth fluid flow component (not shown) such that the corresponding fourth fluid flow component, when installed, is able to interact with fluid flow of the third tubular passage.

Figure 25:
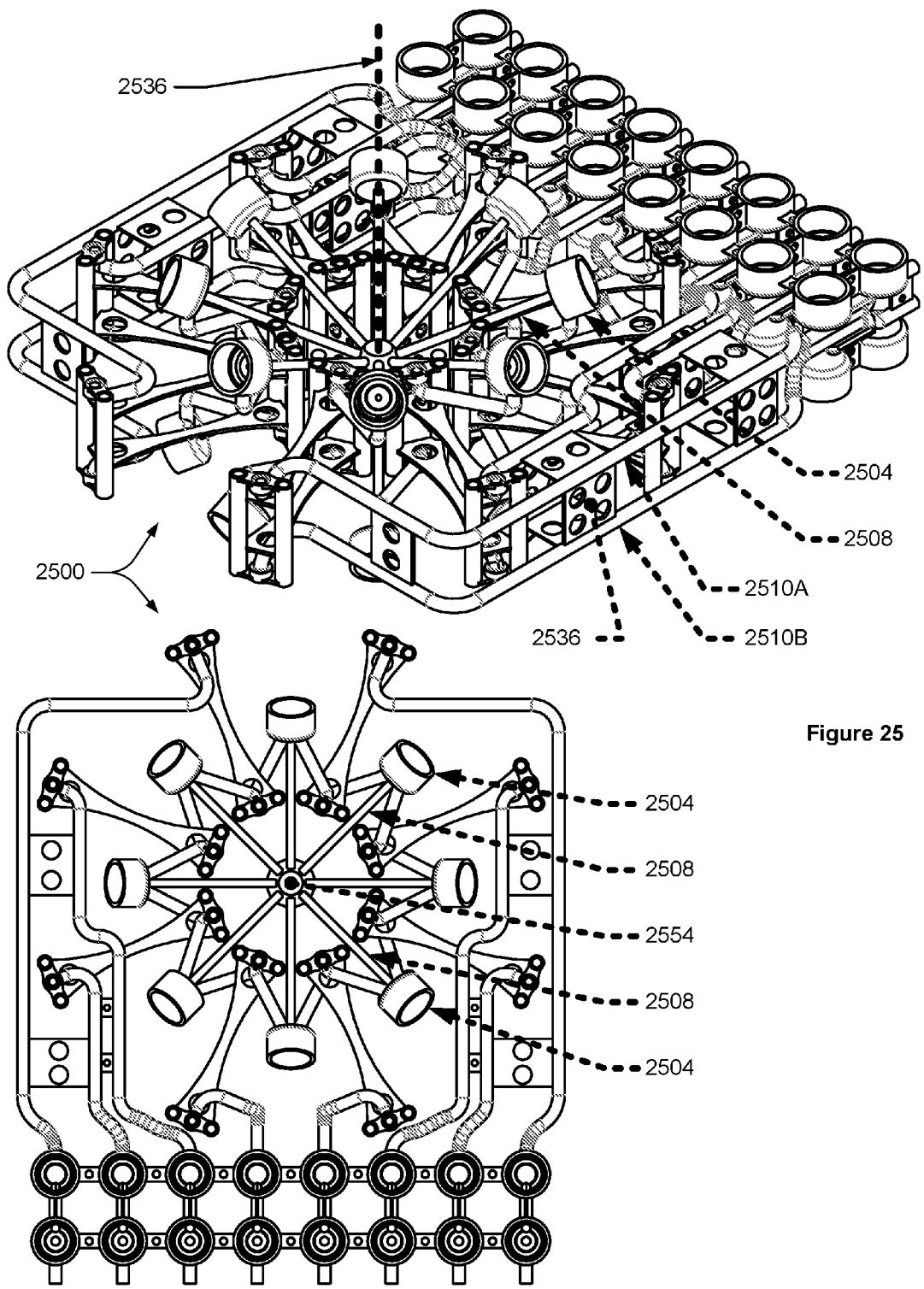
FIG. 25 depicts both an isometric view (top) and a plan view (bottom) of a manifold.

Referring back to the manifold 1100 of FIG. 11, in some embodiments, the first tubular passages and the first fluid flow component interfaces may be arranged in a radial pattern around a first axis. FIG. 25 depicts both an isometric view (top) and a plan view (bottom) of a manifold 2500. A first axis 2536 is shown in the isometric view which is parallel to the viewing angle of the plan view, e.g. "into the page" of the plan view. For illustration purposes, some of the first fluid flow components 2504 and first tubular passages 2508 are identified.

In some embodiments, at least two of the first tubular passages of the manifold may be the same length. In some such embodiments, each of the first tubular passages may be the same length as the other first tubular passages, such as is illustrated with the first tubular passages in 2508, as well as the first tubular passages in at least FIGS. 11, 13, and 15. In some embodiments, having two or more first tubular passages of equal length may allow for more consistent and/or controllable fluid delivery to the mixing chamber 2554. For example, the first tubular passages may have the same lengths and diameters, and thus equal effective flow resistances, which may generally cause the fluids flowing down the first tubular passages to have the same transit times and arrive at the same time at the mixing chamber introduced into the first tubular passages at the same time and under similar flow conditions. In the case of the example manifold 2500, the first tubular passages and the second tubular passages of each flow path are, in effect, identically sized and routed. Thus, the effective flow resistance in each flow path between the mixing chamber and the second fluid flow component interface may, in at least this example, be the same, allowing for fluids that are introduced into two or more of the second tubular passages under similar flow conditions to reach the mixing chamber, in effect, simultaneously.

In some embodiments, the manifold may also include one or more structural supports which may span between two or more elements of the manifold. In some such embodiments, the structural supports may be membranes or webs that span between two or more portions of a single element. For instance, the structural support 1116 spans between multiple elements of the second fluid flow component interface 1106. In some embodiments, the structural supports may span between (a) one or more portions of one of the flow paths that may include the first tubular passage of that flow path, the second tubular passage of that flow path, the first fluid flow component interface of that flow path, or the second fluid flow component interface of that flow path, and (b) one or more portions of one of one of the other flow paths that may include the first tubular passage of that other flow path, the second tubular passage of that other flow path, the first fluid flow component interface of that other flow path, or the second fluid flow component interface of that other flow path. For example, as can be seen in the isometric manifold of FIG. 25, a structural support 2536 spans between a second tubular passage 2510A of one flow path and a second tubular passage 2510B of a different flow path. A structural support may also span between one or more elements of a flow path and one or more other elements of the manifold, such as the mixing chamber or another structural support.

In some embodiments, at least one flow path in the manifold may have a tubular passage, such as a first tubular passage, that follows a three-dimensional path. For example, the first flow path 1102 that is isolated and shown in FIGS. 12 and 14 includes a second passage 1110 that follows a three-dimensional path, which is a three-dimensional path between the first fluid flow component interface inlet 1118 and the second fluid flow component interface outlet 1114. A manifold 1100 constructed with additive manufacturing enables the creation of tubular passages that may follow many different and varied three-dimensional flow paths which are not constrained by traditional manufacturing techniques, as described herein.

In some embodiments, one or more portions of one or more bends in a tubular passage may have a bend radius less than ten times the outer diameter of the tube of the diameter of the tubular passage, and potentially less than just the outer diameter. As stated above, traditional metal tubes have bend radius limits which prevent the tubes from being bent beyond a certain radius since the bending process may cause strain in the bent tube that may cause undesired deformation (such as flattening the tube cross-section into an oval from a circle), wrinkling, or localized strain-hardening that may compromise the integrity of the tube; additionally, such strain may lead to decreased corrosion resistance in the tube material at the bend locations, which poses a safety and performance hazard. With additive manufacturing, however, bends of tubular passages in a manifold, such as manifold 1100, may be made to nearly any bend radius, including bend radii smaller than the minimum bend radii achievable using actual tubing bending techniques—since such bends are formed as part of the additive manufacturing process, there are no risks of cross-section deformation, wrinkling, or work-hardening as seen with bent tubing. This allows manifolds such as those described herein to provide compact fluid routing with tighter turns than may be achieved using traditional tubing bending techniques. Some examples of tubular passages that include bends with bend radii lower than the bend radius limits for traditional manufacturing techniques may be seen with the second tubular passage 1110 in FIG. 12, the third tubular passage 2026 in FIGS. 20 and 24. As can be seen, these tubular passages may not only bend beyond normal manufacturability limits, but also follow three-dimensional paths in that are in close proximity to one another and that may be without any sharp internal edges. Such configurations are not achievable by other traditional manufacturing methods.

Figure 26:
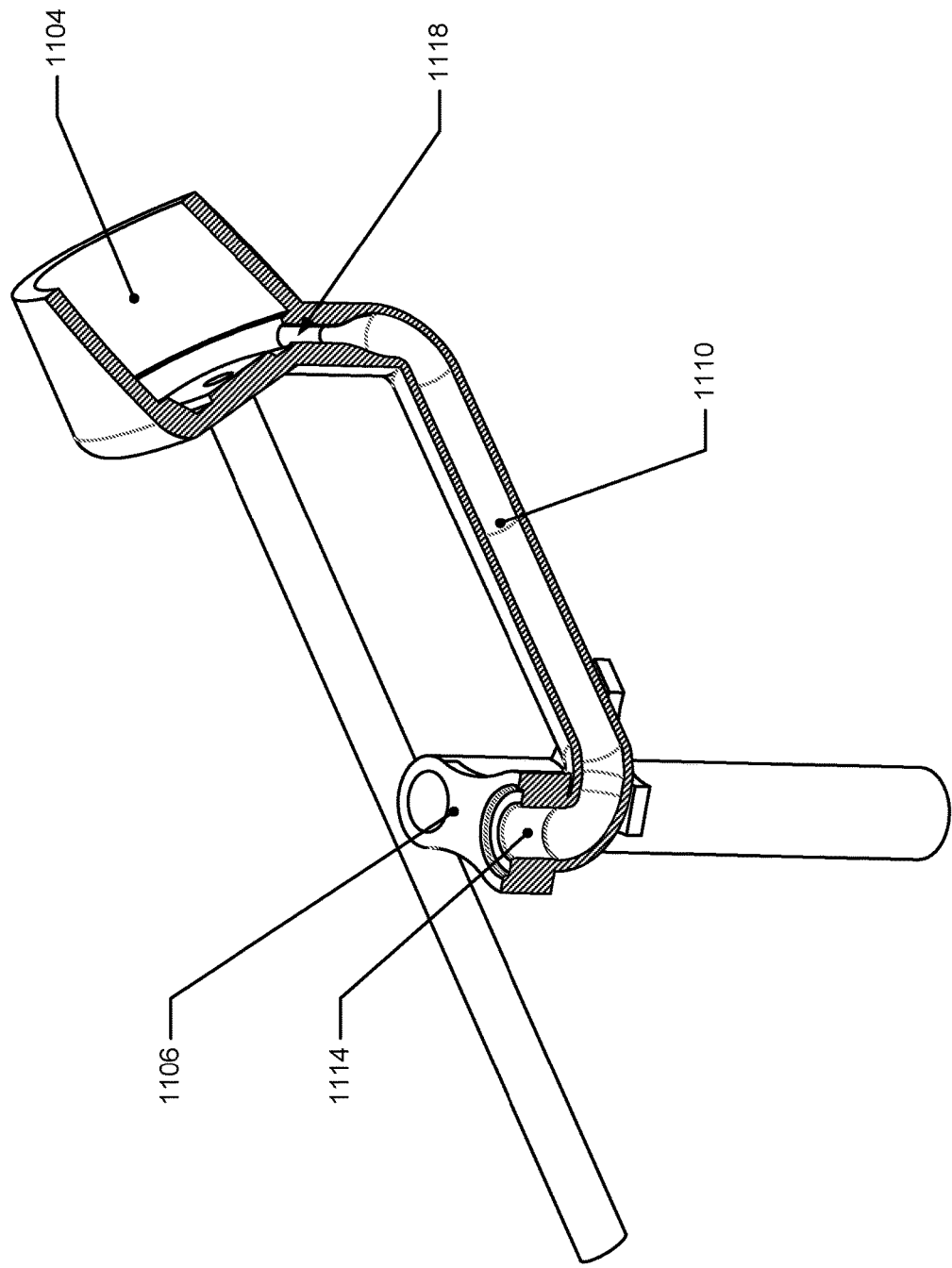
FIG. 26 depicts an isometric cross-sectional view of the second tubular passage from the first flow path of FIG. 12.

Furthermore, in some embodiments, one or more tubular passages of a manifold may have a plurality of bends and at least some of the bends may be free of internal sharp edges. In some such embodiments, at least 85% or more of the plurality of bends of one or more of the tubular passages may be free of internal sharp edges. In some such embodiments, each first tubular passage may have a plurality of first bends and 85% or more of the first bends may be free of internal sharp edges, and each second tubular passage may have a plurality of second bends and 85% or more of the second bends may be free of internal sharp edges. For example, FIG. 26 depicts an isometric cross-sectional view of the second tubular passage 1110 from the first flow path 1102 of FIG. 12. A cross-sectional cut has been made through the second fluid flow component interface 1106, the second fluid flow component interface outlet 1114, the second tubular passage 1110, the first fluid flow component interface inlet 1118, and the first fluid flow component interface 1104. As can be seen, the second tubular passage 1110 includes a plurality of bends that are all, e.g., more than 85%, free of internal sharp edges.

Figure 27:
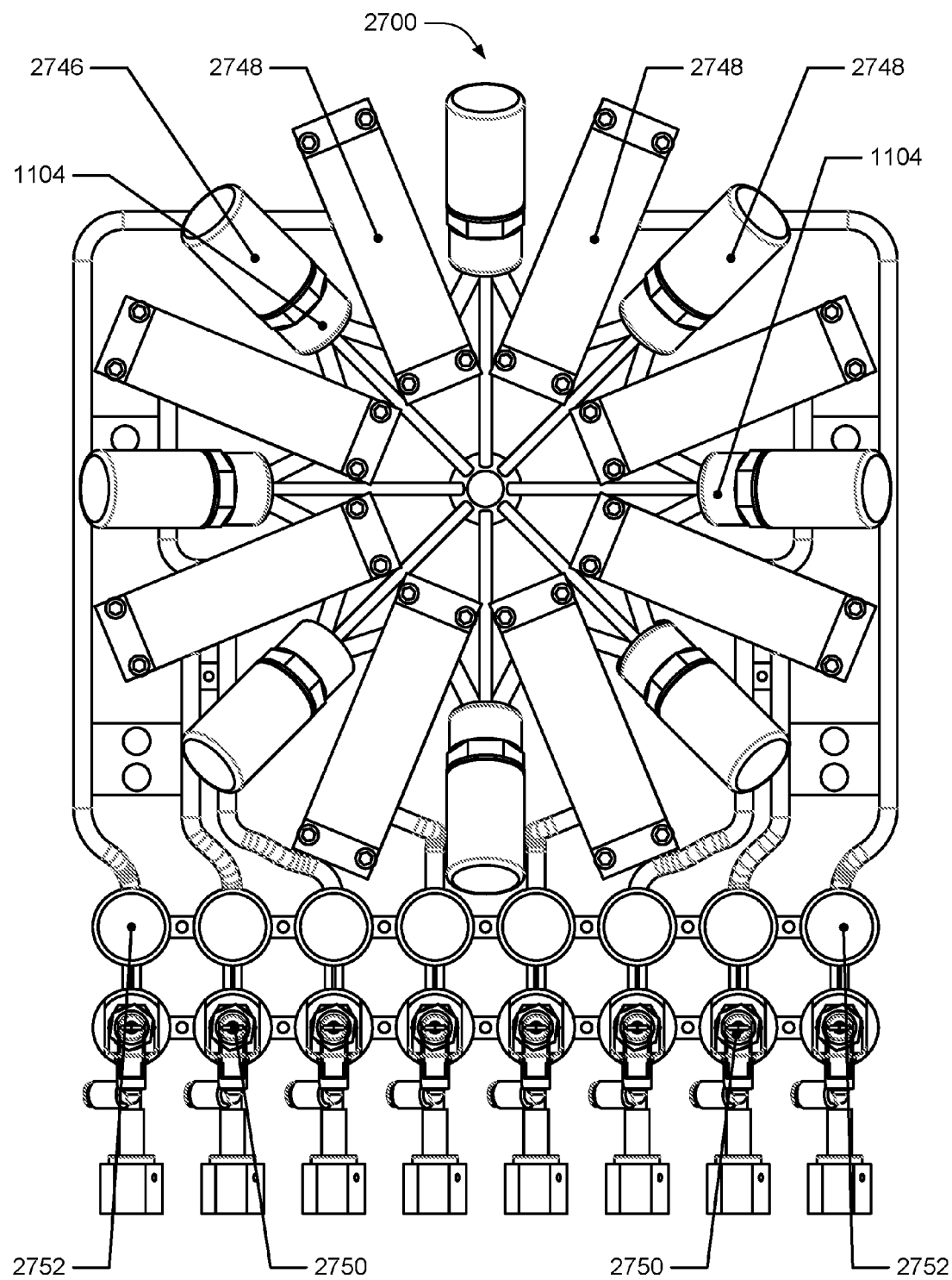
FIG. 27 depicts a plan view of a manifold that includes a plurality of fluid flow components interfaced with fluid flow component interfaces.
Figure 28:
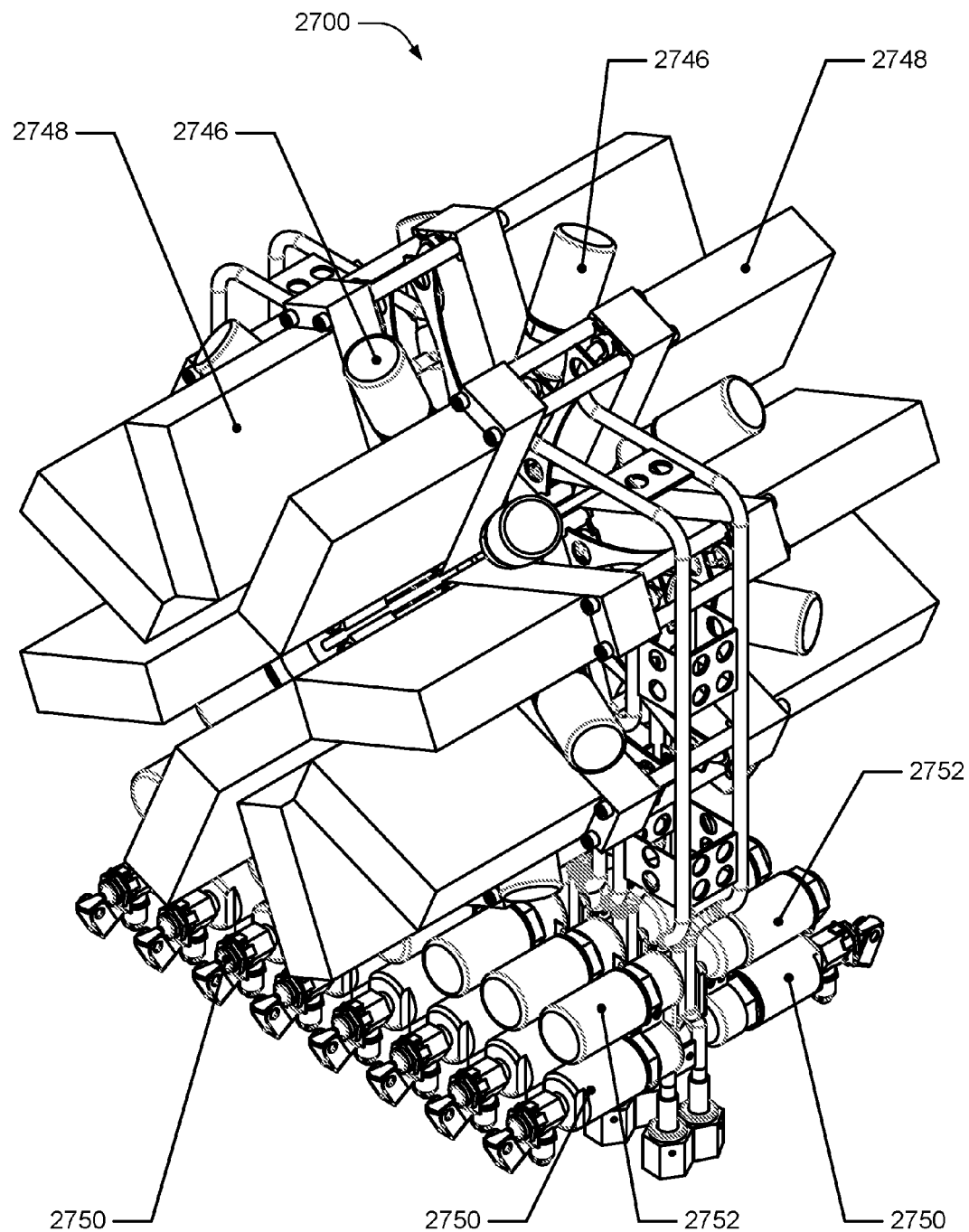
FIG. 28 depicts an isometric view of the manifold of FIG. 27.

In some embodiments, the manifold may include a plurality of first fluid flow components that are mounted to the manifold. In some such embodiments, each first fluid component may be fluidically connected with a corresponding one of the first fluid flow components. As discussed above, a first fluid flow component may be mounted to the manifold in any of the ways known in the art. In some such embodiments, the manifold may also include a plurality of second fluid flow components, which may also be mounted to the manifold such that each second fluid flow component may be fluidically connected with a corresponding one of the second fluid flow component interfaces. FIG. 27 depicts a plan view of a manifold that includes a plurality of fluid flow components interfaced with fluid flow component interfaces, while FIG. 28 depicts an isometric view of the manifold of FIG. 27. As can be seen in both FIGS. 27 and 28, manifold 2700 includes a plurality of first fluid flow components 2746, a plurality of second fluid flow components 2748, a plurality of third fluid flow components 2750, and a plurality of fourth fluid flow components 2752 that are interfaced with corresponding fluid flow component interfaces on the manifold 2700. For instance, each first fluid flow component 2746 is interfaced with a corresponding first fluid flow component interface 2704 and each second fluid flow component 2748 is interface with a corresponding second fluid flow component interface (not labeled). In the example of FIG. 27, first fluid components 2746, third fluid flow components 2750, and fourth fluid flow components 2752, are all a type of valve, whereas the second fluid flow components 2748 are MFCs.

The manifold 2700 is also configured such that there may be two "sides" to the manifold. For example, manifold 2700 in FIG. 28 has one side with eight flow paths and another side with eight flow paths, totaling sixteen flow paths. Each side may be identical to the other side, and in some embodiments both sides may be made together as part of one additive manufacturing process to make the manifold.

In some embodiments, at least a majority of the manifold may have a sintered structure. In some such embodiments, at least 75% of the manifold may have a sintered structure. In some such embodiments, the manifold may also have some traditional components, as discussed above, for instance fittings and/or piping.

The manifold may also be made from a variety of materials. In some embodiments, the manifold may be constructed from a metal alloy, a metal, or a ceramic. In some such embodiments, the manifold may be made from stainless steel, such as 316L stainless steel. The manifold may also be constructed of a blend of one or more materials that may be suitable for additive manufacturing, such as alloys or super-alloys (e.g., Hastelloy). In some other embodiments, the manifold may be made from a sintered metal, a sintered metal alloy, or a sintered ceramic.

In some embodiments, the interior surface of one or more tubular passages may have a specific average surface roughness. In some such embodiments, one or more of the tubular passages of the manifold, such as the first and/or second tubular passages, may have an interior surface with an arithmetic average surface roughness ($R_a$) of less than 15 microinches. The $R_a$ in some such embodiments may also be 10 microinches or less, such as 5 microinches or less. The $R_a$ may also be of a value desirable for the liquid(s) that may flow through the manifold for semiconductor processing. The desired arithmetic average surface roughness may be obtained by the additive manufacturing process and/or one or more steps performed during and/or after manufacturing, such as electropolishing or flowing a polishing slurry through one or more tubular passages of the manifold. Alternatively, a coating may be applied to the interior of the tubular flow passages in order to smooth out the interior surfaces of the passages. In some embodiments, atomic-layer deposition ("ALD") may be used to apply one or more layers of material onto some of the interior of the passages to achieve the desired $R_a$. It is also to be understood that some features of the manifolds discussed herein may be subjected to post-additive-manufacturing machining processes, e.g., if there are valve seats/sealing surfaces or threaded interfaces, such features may be added after additive manufacturing is completed since such the surface finishes and tolerances of such features may be impossible to achieve using additive manufacturing techniques (future advances in additive manufacturing techniques may allow such features to be created directly in the additive manufacturing process, however).

Figure 29:
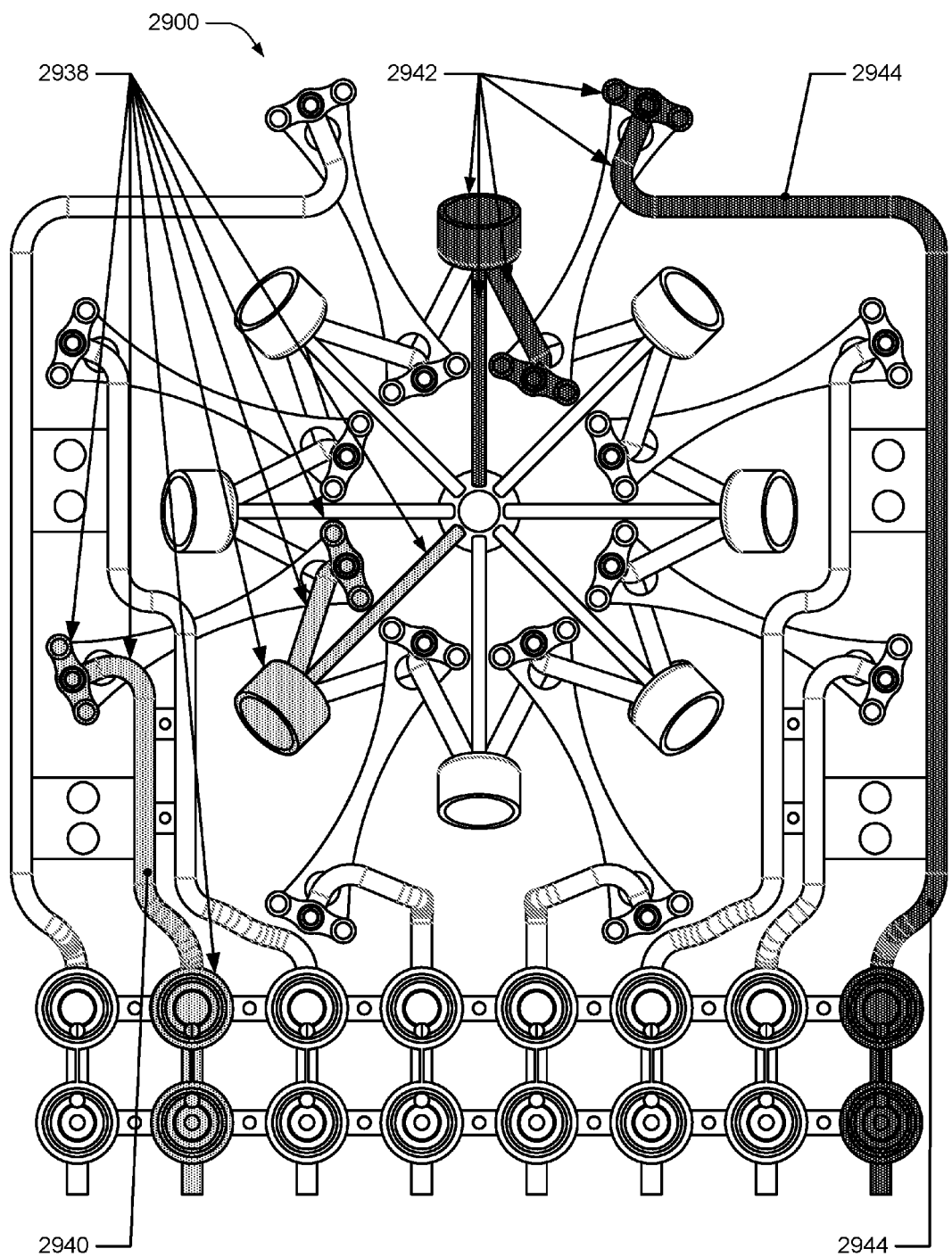
FIG. 29 depicts two different flow paths of a manifold.

The manifold flow paths may be arranged in various configurations. In some such embodiments, the manifold may include more two or more different flow paths, such that each different flow path travels a different route from the mixing chamber to the end of the flow path such that, for instance, the third tubular passages may be different lengths. For instance, FIG. 29 depicts two different flow paths of a manifold. Manifold 2900 includes a third example flow path 2938 on the left side of the Figure in light shading, with a third tubular passage identified as 2940, and a fourth example flow path 2942 on the right side of the Figure in dark shading, with a third tubular passage identified as 2944. In this example, the third tubular passage 2940 of the third example flow path and the fourth tubular passage 2944 of the fourth example flow path are different lengths. In some embodiments, at least one first tubular passage may be a different length than another first tubular passage; similarly at least one second tubular passage may be a different length from another second tubular passage. In some embodiments, all of the first tubular passages may be the same length and the second tubular passages may also be all the same length, such as depicted in at least FIG. 11.

In some embodiments, the manifold may have one or more flow paths. In some embodiments, the manifold may have eight flow paths while is some other embodiments, the manifold may have sixteen flow paths, while in others there may be twenty flow paths. For example, the manifold in FIG. 25 has sixteen flow paths.

The inner and/or outer diameters of the tubular passages of one or more flow paths may also vary. In some embodiments, the majority of the outer diameters of the tubular passages in all the flow paths of a manifold may be the same, while the majority of the inner diameters of such tubular passages may also be substantially equal, e.g. within 90% of each other. In some embodiments, one or more portions of the interior diameters of some tubular passages may include tapering or varying diameter. For instance, the second tubular passage 1110 depicted in FIG. 26 includes an inner diameter that is identical for the majority of the length of the passage, but it also includes tapering towards the end of the passage that is located on the right side of FIG. 26. In some embodiments, the interior diameter for some tubular passages of the manifold may range from about 0.25 inches to about 0.187 inches, while in some other embodiments, the interior diameters may range from 0.5 inches to about 0.0625 inches.

The manifold may also be of varying size and volume. In some embodiments, a significant portion of the manifold may be empty space. In some such embodiments, the manifold may occupy 35% or less of the smallest prismatic rectangular volume that may completely contain the manifold. In some such embodiments, the height and width of the smallest prismatic rectangular volume may range between about 15 inches and about 20 inches. For instance, such a height and width may both be about 18 inches.

Another embodiment of the present disclosure includes the addition of a heater to one or more tubular passages, e.g., one or more of the tubular passages in a manifold as described herein. In some such embodiments, the heater may be an electric heat trace, which may also be referred to as a "heat trace", "heat tape," or "surface heating", and is collectively referred to herein as "heat trace". Some heat traces include, for instance, a heating element, one or more insulating layers, and conductors. The heating element is typically a resistive heating element that may be arranged in different configurations such as a serpentine, corkscrew, and/or another arrangement that has linear and/or curved sections, such as curved corners. In some heat traces, the resistive heating element may be one of numerous types of resistive heating elements, such as a "series heating" wire that typically is a high-resistance wire that is powered at a specific voltage to produce a constant heat or a "self-regulating" wire that has a resistance which varies with temperature, e.g. low resistance for temperatures below a specific wire temperature point and high resistance for temperatures above that point. Some resistive heating elements may be made from various metals, including, for example, nickel or iron based elements. For example, a resistive heating element may be nichrome, a nickel alloy, that may be 80% nickel and 20% chromium. The one or more insulating layers may be one or more dielectric layers with a high breakdown voltage, such as a ceramic or a plastic.

Some heat traces may be in a layered configuration in which the resistive heating element is interposed between two or more dielectric layers. For example, a heat trace may include a first dielectric layer, which is adjacent to and placed on the item to be heated, such as a pipe or tube; a heating element adjacent to the first dielectric layer; and a second dielectric layer adjacent to the resistive heating element and forming the exterior surface of the heat trace such that the resistive heating element is interposed between the first and second dielectric layers. The second dielectric layer may be considered an outer layer that may provide thermal isolation that may drive heat inward to and through the tubular passage wall, electrical isolation, and protection from damage, such as mechanical damage.

Figure 30:
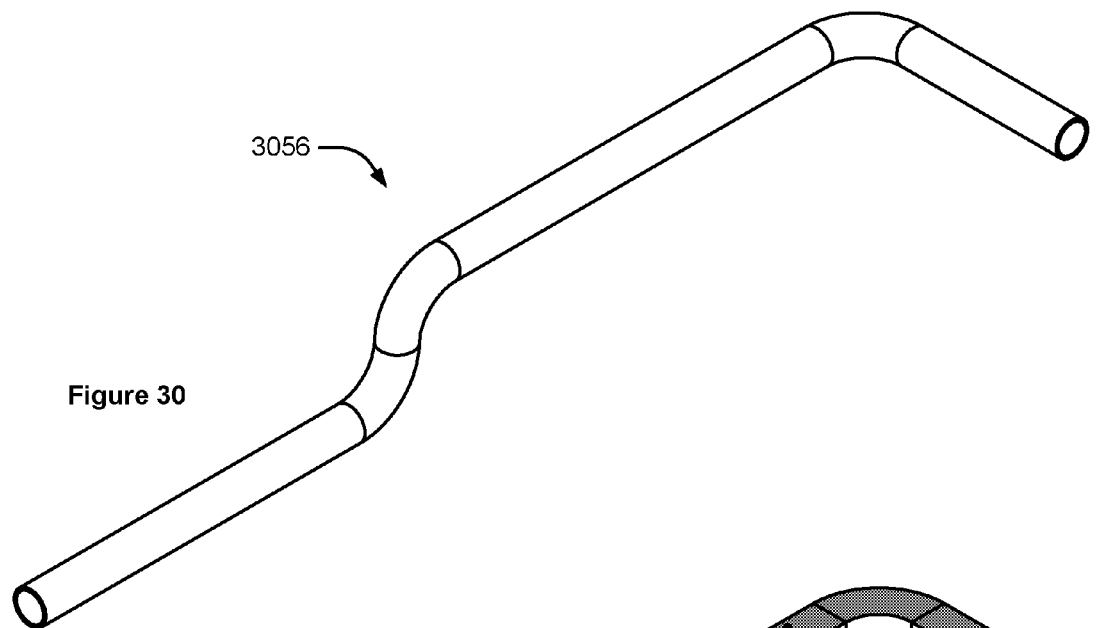
FIG. 30 depicts an isometric view of a fifth example tubular passage.
Figure 31:
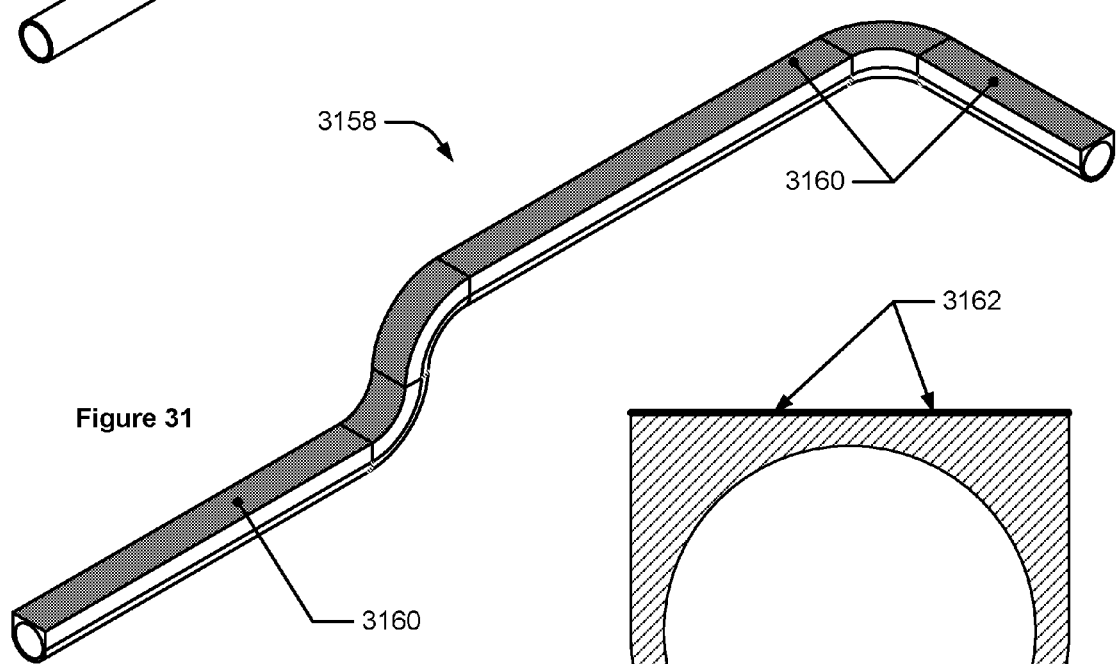
FIG. 31 depicts an isometric view of a sixth example tubular passage.
Figure 32:
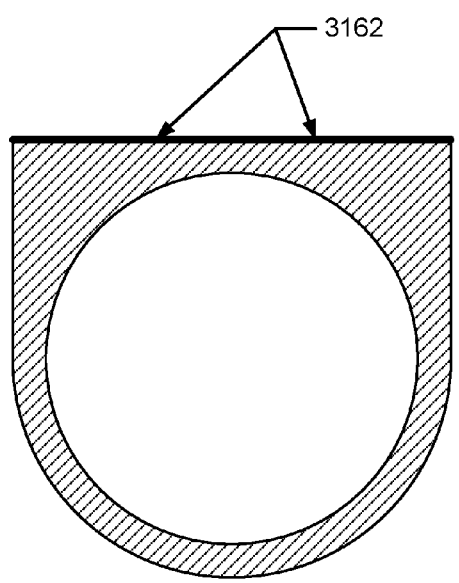
FIG. 32 depicts a cross-sectional view of the sixth example tubular passage in FIG. 31.

A heat trace applied to a tubular passage as part of the present disclosure will now be discussed. In some such embodiments, the tubular passage with the heat trace may be an additively manufactured tubular passage that is part of an additively manufactured manifold with a plurality of tubular passages. FIG. 30 depicts an isometric view of a fifth example tubular passage; such a passage may be representative of one or more tubular passages in an additively manufactured manifold. As can be seen, the fifth tubular passage 3056 follows a three-dimensional pathway, i.e., travelling in X, Y, and Z directions, and has a circular exterior surface (not identified). In some embodiments, the tubular passage may follow a two-dimensional pathway, e.g., following a path that lies in a single plane. FIG. 31 depicts an isometric view of a sixth example tubular passage, while FIG. 32 depicts a cross-sectional view of the sixth example tubular passage in FIG. 31. In FIGS. 31 and 32, the sixth example tubular passage 3158 follows the same pathway as the fifth example tubular passage 3056 in FIG. 30, but the exterior surface of the sixth example tubular passage 3158 includes a runway 3160, identified with shading. The runway 3160 includes a surface defined by a first profile 3162, identified in FIG. 32, that is swept along the pathway in order to form the runway 3160. FIG. 31 shows the runway 3160 extending along the entire length of the sixth example tubular passage 3058, e.g. along the three-dimensional pathway. The first profile 3162 may also be in a plane that is perpendicular to the pathway, for instance, as shown in FIG. 32 which is a view normal to the plane that is perpendicular to the pathway.

The profile may also be substantially linear. For example, FIGS. 31 and 32 depict that the first profile 3162 is a substantially linear, flat surface that is swept along and a three-dimensional pathway. "Substantially linear" may mean that at least 80% or more of the profile may be linear while the remaining portion may not be linear. For instance, FIG. 33 depicts an isometric view of a seventh example tubular passage, while FIG. 34 depicts a cross-sectional view of the seventh example tubular passage in FIG. 33. As can be seen in FIGS. 33 and 34, the seventh example tubular passage 3363 includes a runway 3360 with a profile that is substantially linear and includes sidewalls 3364 along the length of the runway 3360 which create a trough-shaped runway 3360. The two sidewalls 3364, which are part of the profile and which may also be linear, may be substantially perpendicular to the remaining portion the majority of the linear profile 3462, as can be seen in FIG. 34 ("substantially perpendicular" here may be +/−10 degrees of perpendicular). For additional illustration purposes, the profile 3462 is identified with two different line types—the portion of the profile 3462 that includes the sidewalls 3364 is identified with bold, dotted lines and the remaining portion of the profile 3462 is identified with a bold, dashed-and-dotted line. In some other embodiments, the two side walls 3364 may be at oblique angles to the remaining portion of the majority of the linear profile 3462, for instance, at angles of up to about 135 degrees.

Figure 35:
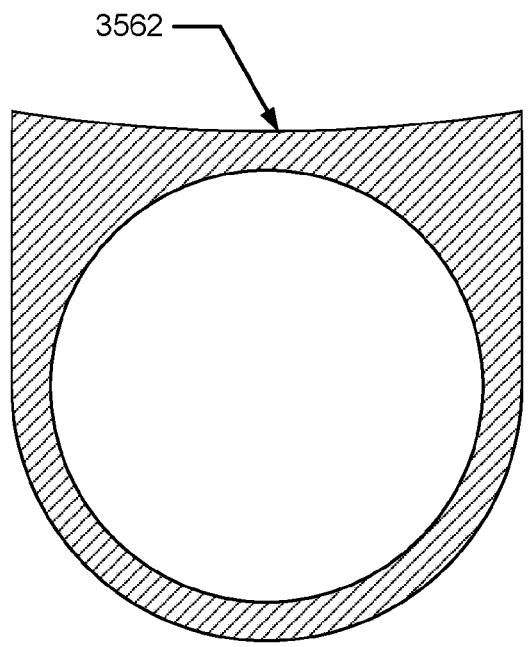
FIG. 35 depicts a profile that is slightly curved.

"Substantially linear" here may also mean that the profile may not be truly linear, such as having a slight curvature (e.g. convex and/or concave) and/or having features on the sides of the runway that may not be linear, such as curved or straight walls, such as are shown in FIG. 34. For example, the profile may be slightly curved, as shown in FIG. 35 which depicts a profile 3562 that is slightly curved, which in turn makes the runway concave (not depicted).

Figure 36:
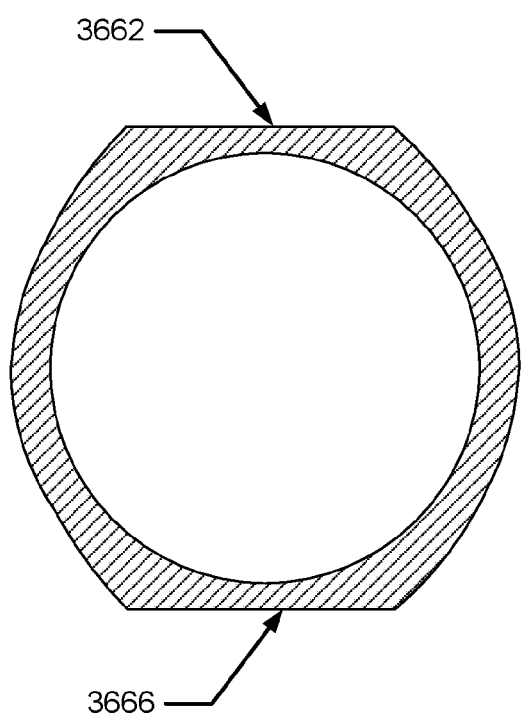
FIG. 36 depicts a cross-sectional view of an eighth example tubular passage with two runways.

In some embodiments, the exterior surface of the tubular passage may have more than one runway. FIG. 36 depicts a cross-sectional view of an eighth example tubular passage with two runways. A first profile 3662 of a first runway can be seen on the top of the depicted cross-section while a second profile 3666 of a second runway can be seen on the bottom. As discussed above, the first profile and the second profile, which are swept along a common path, define the first runway and the second runway, respectively. As also stated above, the first profile and the second profile may be in the same plane perpendicular to the pathway, and may be substantially linear. In some embodiments, the second profile may not be linear. The first and the second runways may also extend along the entire length of the tubular passage.

When viewed normal to the plane perpendicular to the pathway at a point along the swept path of the tubular passage, like depicted in FIG. 36, the first and the second runway may be arranged in various configurations. For example, the first and the second runway may be substantially parallel to each other. "Substantially parallel" may be within +/−10 degrees of parallel. In some embodiments, the first and the second runway may be at an oblique angle to each other, while in some other embodiments they may be substantially perpendicular to each other. "Substantially perpendicular" may mean within +/−10 degrees of normal.

As mentioned above, the additively manufactured tubular passage may be part of an additively-manufactured manifold that includes a plurality of tubular passages, such as the manifold discussed herein above. Therefore, the runway may be included on a tubular passage through additive manufacturing of the tubular passage such that the runway is constructed as a feature of the tubular passage during additive manufacturing of the tubular passage. In some other embodiments, the tubular passage may be additively manufactured as a single, individual tubular passage with an integral runway. The tubular passages with runways discussed herein are generally only practically manufacturable using additive manufacturing techniques because, for example, bending tubes having such cross-sections is generally infeasible due to high stress/strain at the corners/edges of the runways. Additionally, bending tubes to follow a three-dimensional pathway, such as pathways followed by the third tubular passage 2026 and the second tubular passage 2010 of FIGS. 20 and 21, may not be feasible with or without a runway. Even if such bending could occur, the bending may cause the internal surfaces not to be the desired smoothness, the internal bends to have sharp edges, and the structural integrity of the tube to be diminished or compromised. In another example, combining several different sections of a tube together to make a single a three-dimensional tubular passage, may also have significant drawbacks. For instance, such construction may be expensive and time consuming, the seams at each joint may be structural weak points which could compromise the tubular passage, and the sections may be misaligned at a joint which may cause the adverse effects discussed above with respect to FIG. 8.

Figure 37:
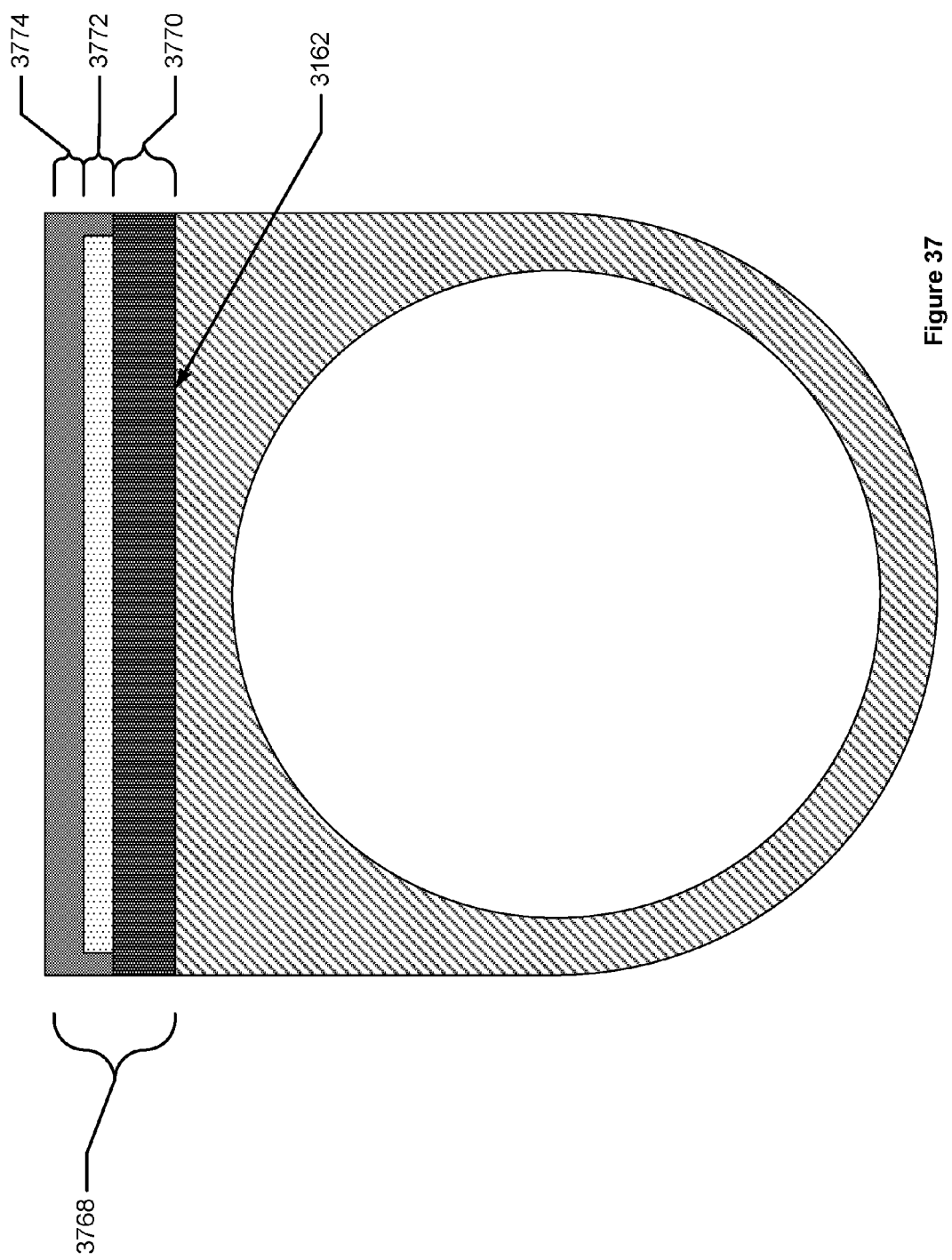
FIG. 37 depicts the tubular passage cross-sectional-area in FIG. 32 with an example heat trace.

After the additively manufactured tubular passage with an exterior surface that includes a runway is constructed, whether individually or as part of an additively manufactured manifold, a heat trace may be added to the tubular passage. FIG. 37 depicts the tubular passage cross-sectional-area in FIG. 32 with an example heat trace. As discussed above, the cross-sectional area in FIG. 37 includes the profile 3162 that defines the runway (3160, not shown), as well as a heat trace 3768 that includes one or more layers. Here a first dielectric layer 3770 is adjacent to the profile 3162 of the runway (not shown), a resistive heating element layer 3772 is adjacent to the first dielectric layer 3770, and a second dielectric layer 3774 is adjacent to the resistive heating element layer 3772, such that the resistive heating element layer 3772 is interposed between the first dielectric layer 3770 and the second dielectric layer 3774. In some embodiments the first dielectric layer 3770 and/or the second dielectric layer 3774 may be formed from two or more dielectric layers placed adjacent to each other. For example, the first dielectric layer 3770 may include three separate dielectric layers that form the first dielectric layer 3770. As used herein, any reference to a "dielectric layer" may be considered a single dielectric layer or two or more adjacent dielectric layers.

The thickness of each dielectric layer may vary upon numerous factors including, for instance, the operating temperature of the resistive heating element layer. One dielectric layer may also be a different thickness than another dielectric layer. In some embodiments, for example, the first dielectric layer may have a thickness ranging between about 0.2 millimeters and about 0.5 millimeters, and the second dielectric layer may have a thickness ranging between about 0.5 millimeters and about 2 millimeters. The dielectric layer thicknesses may also be substantially constant, i.e. substantially uniform, along the length of the tubular passage, such as within +/−10% of the average thickness of the layer.

Figure 38:
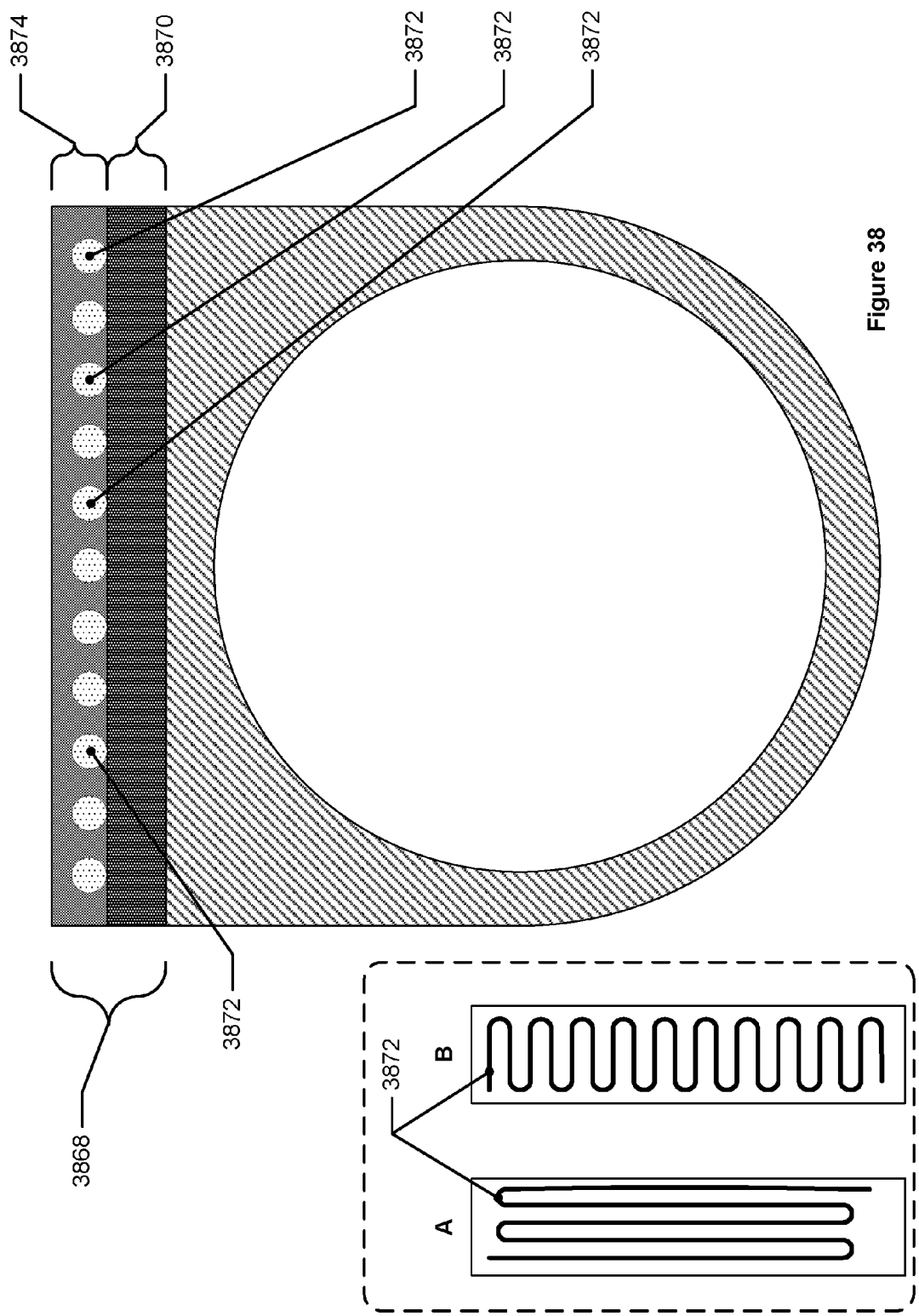
FIG. 38 depicts the cross-sectional area in FIG. 32 with a second example heat trace.

In some embodiments, the resistive heating element layer 3772 may not be a layer that fully separates the first dielectric layer 3768 from the second dielectric layer 3774 as shown in FIG. 37. For instance, the resistive heating element layer 3772 may be an electrical wire or resistive trace located on the first dielectric layer 3768 in a serpentine-like design such that one or more gaps exist between the trace. For instance, FIG. 38 depicts the cross-sectional area in FIG. 32 with a second example heat trace. As can be seen, the resistive heating element layer 3872 is not a solid layer like in FIG. 37, but is an electrical trace placed along the runway that is represented by circles. In some sections of the second example heat trace 3868, the resistive heating element layer 3872 is interposed between the first dielectric layer 3870 and the second dielectric layer 3874, and in other sections, the first dielectric layer 3870 is adjacent to the second dielectric layer 3874. The electrical trace placed along the runway may be configured in numerous arrangements, such as that depicted in FIG. 38 or in a similar serpentine manner rotated by 90 degrees. For instance, as shown inside the dashed box in FIG. 38, the serpentine pattern of the resistive heating element 3872 may be arranged in a manner similar to portion A, which is similar to the arrangement in FIG. 38, or it may be arranged in the manner rotated 90 degrees like that depicted in portion B.

The first and second dielectric layers may be configured to electrically insulate and/or isolate the resistive heating element. For instance, the first dielectric layer may electrically isolate the resistive heating element from the tubular passage such that current does not flow from the resistive heating element to the tubular passage. The second dielectric layer, for example, may insulate the resistive heating element such that it is not an exposed conductive trace thereby preventing arcing or electrical conductivity with some other element, such as equipment or a body part of a user. An example embodiment of this is seen in FIG. 37 in which the second dielectric layer 3874 extends along the side of the resistive heating element layer 3872 to partially encapsulate and electrically isolate the resistive heating element layer 3872. FIG. 38 also depicts the second dielectric layer 3874 partially surrounding and therefore electrically insulating and/or isolating the resistive heating element 3872.

Although not shown in FIGS. 37 and 38, the one or more layers of the heat trace may extend along the runway. In some embodiments, the first dielectric layer may extend along the runway for substantially the entire length of the first runway. "Substantially" here means that the first dielectric layer may not extend the full length of the runway, but may extend at least 85% of the length of the runway. Similarly, the resistive heating element layer may extend along the first dielectric layer for substantially the entire length of the first dielectric layer. "Substantially" here means that the resistive heating element layer may not extend the full length of the first dielectric layer, but in some embodiments may extend at least 85% of the length of the first dielectric layer, for instance. Also as mentioned above, the resistive heating element layer may be arranged in numerous configurations, for example a serpentine, corkscrew, and/or other configurations that may not have curved corners. The second dielectric layer may extend along the runway for substantially the entire length of the runway. "Substantially" here means that the second dielectric layer may not extend the full length of the runway, but in some embodiments may extend at least 85% of the length of the runway, for example. The second dielectric layer may also be adjacent to the first dielectric layer in one or more locations, as mentioned above.

Figure 39:
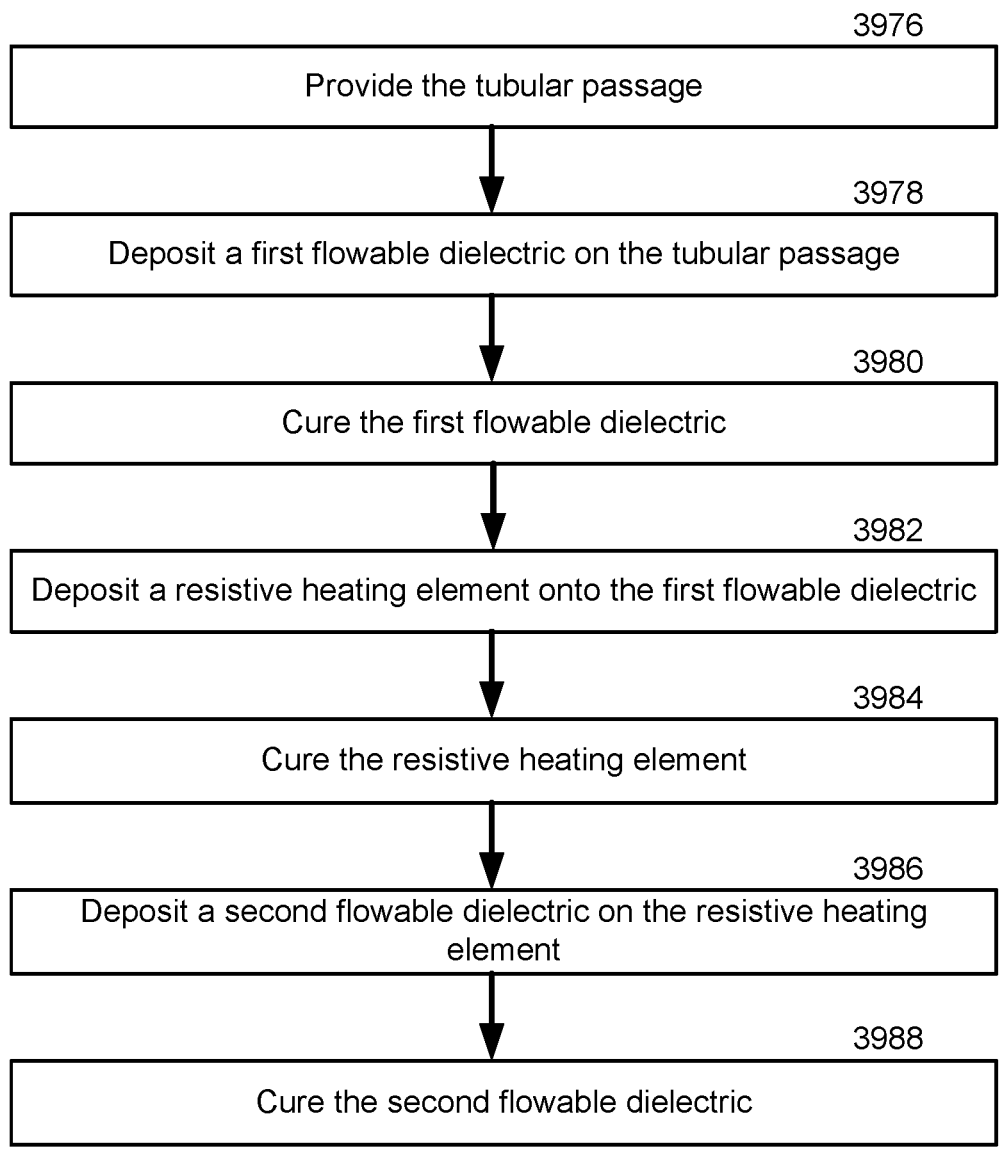
FIG. 39 depicts an example flowchart of the example implementation for creating a heat trace using additive manufacturing.

An example technique for using additive manufacturing to create a heat trace on a tubular passage will now be discussed. FIG. 39 depicts an example flowchart of the example implementation for creating a heat trace using additive manufacturing. In block 3976 a tubular passage is provided. In some embodiments, the tubular passage may be an additively manufactured tubular passage as discussed herein, for instance a tubular passage that includes a runway. In some such embodiments, the technique may also include additively manufacturing the tubular passage as part of block 3976. In some other embodiments, the tubular passage may be a traditionally manufactured tubular passage, for example a tubular passage constructed using casting or molding techniques.

In block 3978 a first flowable dielectric is deposited onto the tubular passage. This deposition may be performed using a first nozzle that is configured to extrude a flowable dielectric, for instance a ceramic paste. The first nozzle may be part of an additive manufacturing machine that is configured to move the first nozzle in the horizontal and vertical directions. For example, one such machine may have a nozzle that is connected to a mechanism (such a mechanism may include, among other things, rails and stepper motors) which moves the nozzle in the vertical Z direction as well as in the horizontal X and Y directions. With such machines, a typical deposition process involves maintaining the nozzle at a specific vertical height while the nozzle is moved in the X and Y directions to deposit a layer, after which the nozzle may be moved incrementally upwards in the Z direction and another the nozzle is moved again in the X and Y directions to deposit another layer of material. Such example mechanism may be considered an "X-Y-Z rectilinear" design or a "Cartesian robot" which may, for instance, perform three linear translations along linear slides. Another example additive manufacturing machine may have a platform on which the deposition occurs and such platform is configured to move in the vertical direction while the nozzle is configured to move in only the horizontal X and Y directions. In a third example additive manufacturing machine, the nozzle may be located on an articulated robot, such as an articulated robot with multiple, e.g., six, degrees of freedom.

Most additive manufacturing machines use computer-aided manufacturing to produce an item. For many typical additive manufacturing machines, the production process begins with a three-dimensional computer model of the item to be produced that is processed by software that "slices", i.e. converts, the item into thin layers, followed by the creation of instruction code for producing the item using a particular additive manufacturing machine. This "slicer" software may be part of the additive manufacturing machine or another computer. An additive manufacturing machine using extrusion deposition then executes the instruction code by moving the nozzle in various directions, depending on the movement mechanism used (e.g., a X-Y-Z rectilinear design or a six-axis robot), to extrude the material for each layer in the desired shape, e.g. "draw" the desired shape with the material. Additive manufacturing machines may have different X-Y resolution such that different nozzles may produce different measurements of dots-per-inch. Such machines may also produce layers in a variety of thicknesses. Some such machines may also be configured to use more than one nozzles, to use more than one material (such as different types of flowable dielectrics), and to have more than one nozzle and movement mechanism for each nozzle, such as two six-axis robots.

Some additive manufacturing machines may also be configured to deposit a continuous layer of material in three dimensions along a runway. For example, such a machine may be configured to move the nozzle, the platform on which a tubular passage sits, and/or the tubular passage, in at least the X, Y, and Z directions (as well as additional axes of movement like discussed above) in order to deposit one continuous layer of extruded material for a particular distance along a runway that follows a three-dimensional pathway, as opposed to extruding one layer of material in the X and Y directions with the nozzle, platform, and/or tubular passage fixed in the Z direction as described above. In such an example, the runway may follow a three-dimensional pathway, like the runway 3160 identified with shading in FIG. 31, and such an additive manufacturing machine may be configured to move the nozzle in the X, Y, and Z directions such that a continuous layer of material is extruded along the entire length of the runway, e.g., all of the shaded area in FIG. 31, in one continuous motion. This configuration and movement of the nozzle, platform, and/or tubular passage may be similar to a computer numerical control ("CNC") machine, such as machines that perform CNC welding, gluing, milling, and laser cutting.

This deposition may also be made onto any surface of the tubular passage which may include a runway or one or more portions of a circular exterior surface of a tubular passage, as discussed in greater detail below. As mentioned above, the first flowable dielectric may be a ceramic or plastic, for instance.

After the first flowable dielectric is deposited onto the tubular passage, the flowable dielectric is cured, as shown in block 3980. The type of curing process selected is dependent upon the flowable dielectric used and may include air-drying, baking, and/or sintering. In some embodiments, as mentioned above, one or more additional layers of flowable dielectric may be deposited onto the first layer of cured dielectric, after which the additional layer may be cured; both the deposition and the cure may be performed as herein described. Additional dielectric layers may be formed in a similar fashion in order to form one overall dielectric layer on the tubular passage before a resistive heating element is applied.

In block 3982 a resistive heating element is deposited onto the cured first flowable dielectric. In some embodiments in which the multiple dielectric layers are deposited and formed on the tubular passage, the resistive heating element is deposited on the outermost (e.g., farthest away from the tubular passage) dielectric layer. The resistive heating element may be a nickel or iron-based metal or alloy, such as nichrome, as discussed above. The resistive heating element may be deposited using a second nozzle which may be configured to extrude the material used to make the resistive heating element. In some embodiments, the second nozzle may extrude a flowable metal (e.g., a flowable metal that is heated by the second nozzle). Following the deposition, the resistive heating element is cured, which may be air-drying (e.g., soon after deposition of a flowable metal) or sintering (e.g., of a powdered metal), as shown in block 3984. In some embodiments, multiple layers or sections of the resistive heating element may be deposited on the cured flowable dielectric and in such instances, the curing may occur after each such partial deposition or after the deposition of all the resistive heating element is complete.

Following the deposition of the resistive heating element, a second flowable dielectric may be deposited onto the resistive heating element, as shown in block 3986, which may be done similar to the first flowable dielectric. This deposition may occur such that the second flowable dielectric covers the exposed resistive heating element as discussed above.

The deposition of the first flowable dielectric, the resistive heating element, and the second flowable dielectric may be performed by one or more additive manufacturing machines. In a first example, a first additive manufacturing machine may be configured to deposit the first flowable dielectric using a first nozzle, a second additive manufacturing machine may be configured to deposit the resistive heating element using a second nozzle, and a third additive manufacturing machine may be configured to deposit the second flowable dielectric using a third nozzle. In this first example, the tubular passage on which the heat trace is to be deposited is initially placed in the first additive manufacturing machine for the deposition of the first flowable dielectric. After curing of the first flowable dielectric, either in the first additive manufacturing machine or another apparatus, the subject tubular passage may then be relocated to the second additive manufacturing machine for the deposition of the resistive heating element. After curing the resistive heating element, either in the second additive manufacturing machine or another apparatus, the subject tubular passage may be placed in the third additive manufacturing machine for deposition of the second flowable dielectric, after which curing may occur.

In some embodiments, similar to the first example directly above, the second nozzle may be different from the first and third nozzles such that the second nozzle is configured to extrude a different material, e.g. a metal, as opposed to a flowable dielectric.

In a second example, a second additive manufacturing machine may have two or more nozzles with each nozzle connected to a separate movement mechanism, such as a six-axis robotic arm. A first nozzle of the second additive manufacturing machine may be configured to deposit both the first and second flowable dielectric layers, which may or may not be the same material. A second nozzle of the second additive manufacturing machine may be configured to deposit the resistive heating element. In this second example, the same machine may perform all of the depositions with the two or more nozzles with the tubular passage remaining stationary in the machine during all such depositions.

In a third example, a first additive manufacturing machine may be configured to deposit the first flowable dielectric and the second flowable dielectric, which may be different dielectrics, while a second additive manufacturing machine may be configured to deposit the resistive heating element. The first additive manufacturing machine may have two different nozzles to extrude two different flowable dielectrics, it may also have a single nozzle configured to extrude two different flowable materials, and/or it may be a machine with interchangeable nozzles and/or sources of flowable dielectric material. Similar to the first example, after deposition of the first flowable dielectric and curing, the tubular passage may be moved to the second additive manufacturing machine for deposition of the resistive heating element. Once the resistive heating element is deposited and cured, the tubular passage may be moved back to the first additive manufacturing machine for the deposition of the second flowable dielectric.

This example technique may be applied to various tubular passages, as noted above, such as a stand-alone traditionally manufactured tubular passage, a stand-alone additively manufactured tubular passage, a stand-alone additively manufactured tubular passage with one or more runways, one or more tubular passages in a manifold, one or more additively manufactured tubular passages in an additively manufactured manifold, and one or more additively manufactured tubular passages with a runway in an additively manufactured manifold. Such tubular passages with one or more runways may be configured as discussed above.

Figure 40:
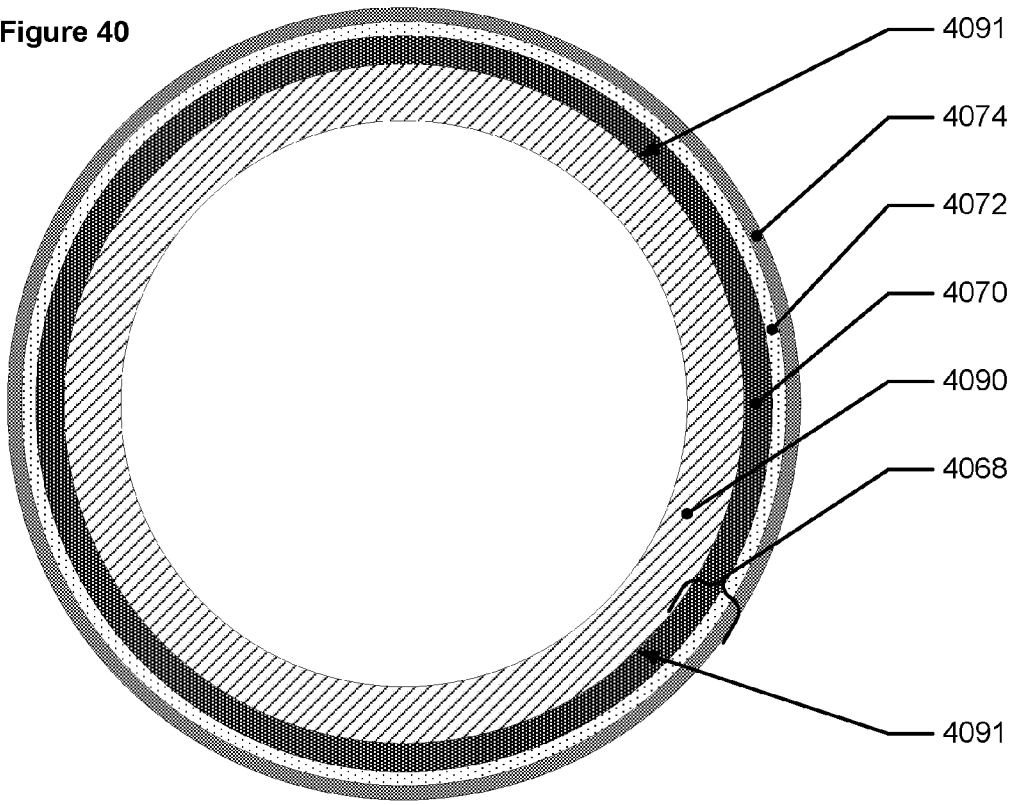
FIG. 40 depicts a cross-sectional view of a tubular passage similar to the tubular passage in FIG. 30.

When this example technique is applied to a tubular passage without a runway, e.g. a tubular passage with a curved exterior surface, the heat trace may be applied in various ways. For example, FIG. 40 depicts a cross-sectional view of a tubular passage similar to the tubular passage in FIG. 30. Here, the tubular passage 4090 has a circular cross-section that includes a circular cross-sectional exterior surface 4091 and a heat trace 4068 applied to the exterior surface. As can be seen, the heat trace 4068 includes three layers similar to the heat trace 3768 discussed above, with a first dielectric layer 4070 adjacent to the exterior surface of the tubular passage 4090, and with a resistive heating element layer 4072 interposed between the first dielectric layer 4070 and a second dielectric layer 4074. Heat trace 4068 may be applied along substantially the entire length of the tubular passage 4090. "Substantially" means along at least 85% the length of the tubular passage 4090. Also, as shown in FIG. 40, heat trace 4068 may, in some implementations, be applied along all of the cross-sectional circumference of the exterior surface 4091 of tubular passage 4090.

The additive manufacturing machine(s) may be configured to apply one or more of the heat trace elements onto the exterior surface of the tubular passage, including a curved surface of the tubular passage. However, depositing flowable material onto a curved surface may present numerous challenges and difficulties because, for instance, the material may slide off and/or shift during the deposition which may create a nonuniform thickness of the deposited layer. Additionally, some additive manufacturing machines may only be able to position a nozzle above a limited section of a curved surface. For instance, an additive manufacturing machine with a nozzle on an X, Y, and Z rectilinear mechanism may only be able to deposit material on 180 degrees of a circular surface without any additional adjustment or rotation of the circular surface or adjustment the nozzle around the circular surface. Even if the circular surface and/or nozzle may be appropriately adjusted, the already deposited flowable material and/or the newly deposited material may shift or fall off the circular surface. Again, such shifting of the flowable material may be undesirable.

Therefore, printing on a curved surface may require rotating the tubular passage and/or moving the nozzle around the circumference of the curved surface. This may be achieved by a user manually adjusting the tubular passage, as well as by an additive manufacturing machine having an adjustment mechanism that may move the tubular passage in an X, Y, Z, and/or rotational directions; having a nozzle that can be articulated in more than the X, Y, and Z axes, such as rotational about the X and Y axis; and/or having a nozzle attached to a six-axis robotic arm.

Even with such adjustments and configurations, the flowable material may still shift after deposition which may require that more than one deposition and/or cures occur in order to produce one layer. For instance, in a situation in which the additive manufacturing machine is to deposit a dielectric layer around the full 360 degree circular circumference of an exterior surface of a tubular passage, such as that depicted in FIG. 37, the additive manufacturing machine may make one deposition of the flowable dielectric along a partial arc of the cross-sectional circumference of the exterior surface of the tubular passage, such as 60 degrees, after which the dielectric may be cured and/or allowed to partially dry before the a next deposition along another partial arc occurs. In this example, in order to create a uniform layer in a full 360 arc, six separate depositions and six separate cures may be required.

Figure 41:
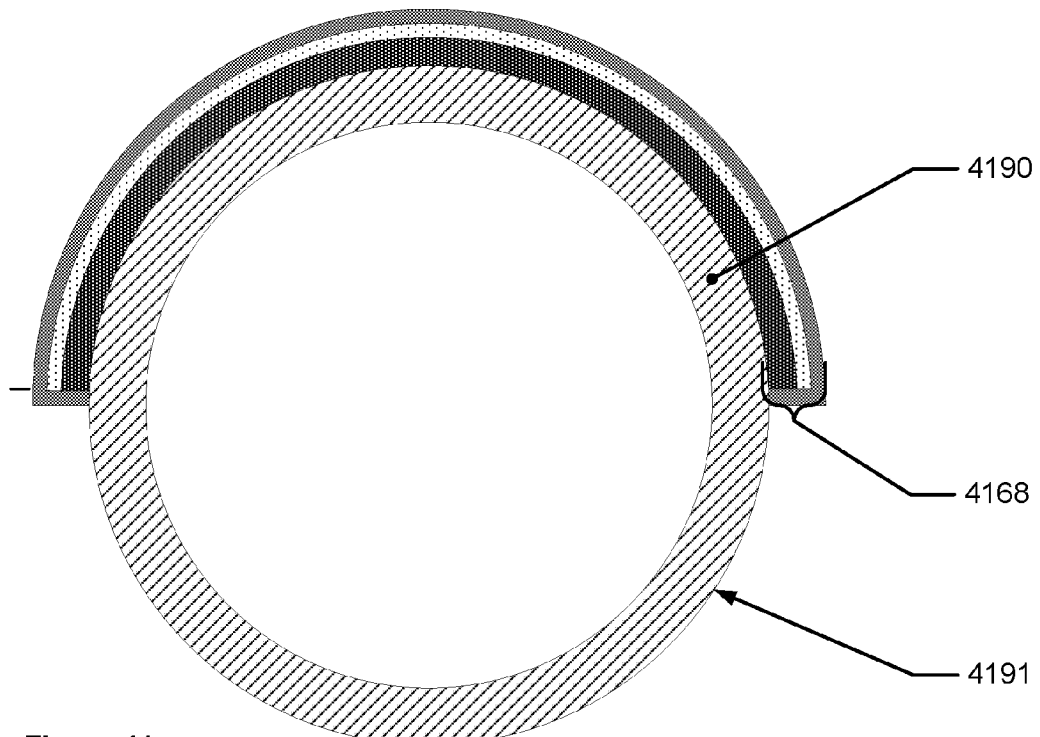
FIG. 41 depicts a tubular passage similar to FIG. 40.

In some embodiments, the heat trace 4068 may not be applied to all of the cross-sectional circumference of the exterior surface 4091 of the tubular passage 4090, but applied only to a part of the cross-sectional circumference of the exterior surface 4191. FIG. 41 depicts a tubular passage similar to FIG. 40 and, as can be seen, a heat trace 4168, similar to that described above, is applied only to half of the cross-sectional circumference of the exterior surface 4191 of the tubular passage 4190.

Figure 42:
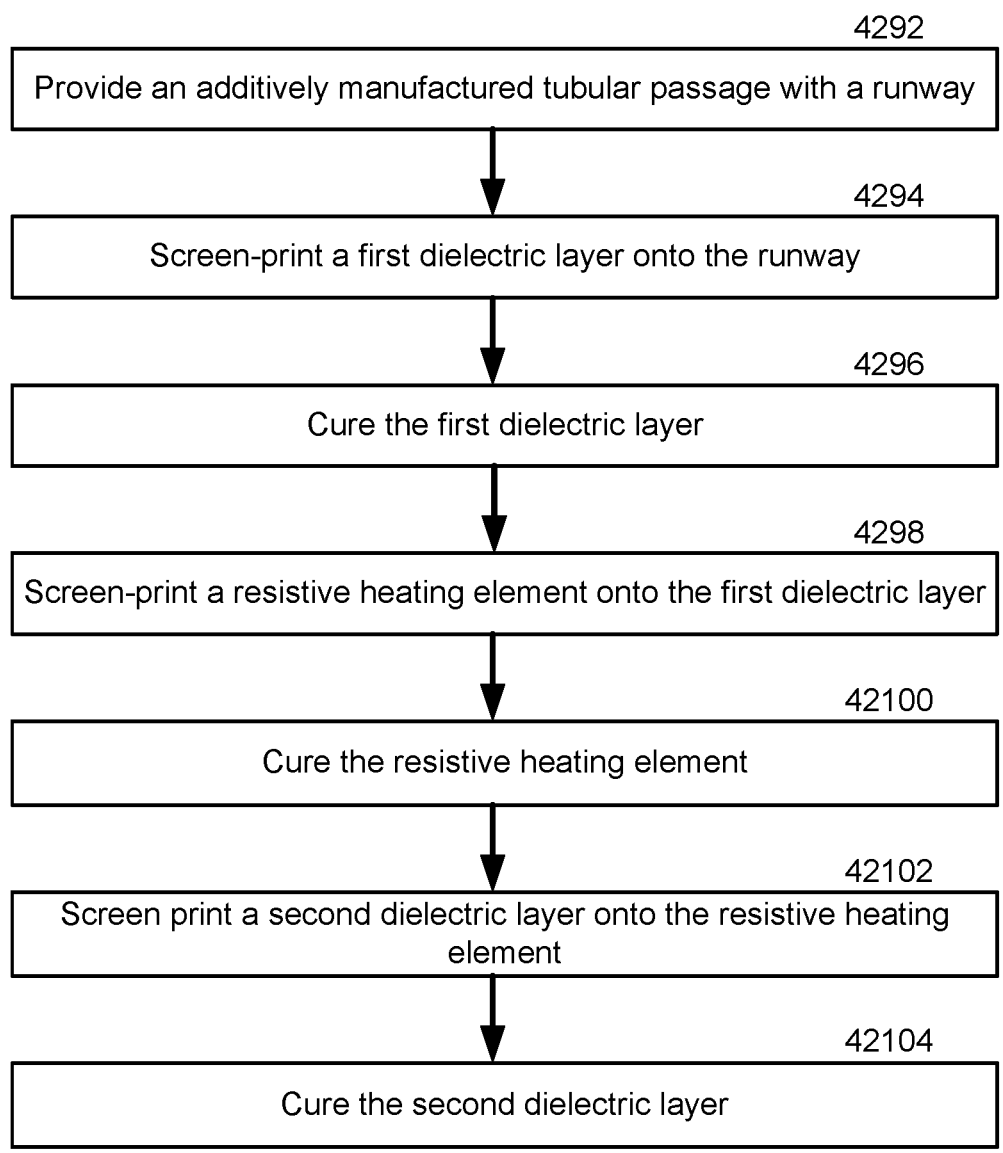
FIG. 42 depicts an example flowchart of the example implementation for creating a heat trace using screen-printing.

Another example technique for creating a heater on a tubular passage includes the use of screen-printing. FIG. 42 depicts an example flowchart of the example implementation for creating a heat trace using screen-printing. In block 4292 an additively manufactured tubular passage with a runway is provided. The additively manufactured tubular passage may follow a two-dimensional pathway such that the runway also follows a two-dimensional course; this additively manufactured tubular passage may also be configured similar to those described above. The pathway may also be substantially two-dimensional such that it is +/−10 degrees of planar. In some embodiments, "substantially two-dimensional" may be less than +/−10 degrees of planar and may also be represented as a comparison between a nonlinear deviation from planar distance as compared to the outer diameter of the tubular passage. For instance, a tubular passage with a circular outer diameter of approximately 0.25 inches with a runway that deviates from a two-dimensional plane, e.g., such as "hills" or "valleys" in the surface of the runway, by 1 millimeter or less may be considered "substantially two-dimensional". In block 4294, a first dielectric layer is screen-printed onto the runway, after which the first dielectric layer is cured in block 4296. In some embodiments, similar to that described above, the first dielectric layer may be described as a single layer that is formed by two or more dielectric layers. In such embodiments, additional curing steps may occur after each dielectric layer is applied with screen-printing.

In block 4298, a resistive heating element is screen-printed on the first dielectric layer. As stated above, the resistive heating element may be configured in numerous ways, including a serpentine design. After being screen-printed, the resistive heating element may be cured as stated in block 42100. A second dielectric layer may be screen-printed onto the resistive heating element, as provided in block 42102, which may be followed by a curing step in 42104. Similar to above, the resistive heating element may be interposed between the first dielectric layer and the second dielectric layer.

In some of the embodiments discussed herein, the heater may also include electrical conductors which may provide electrical connection points for the resistive heating element. In some such embodiments, the electrical conductors may be created using additive manufacturing. The electrical conductors may also extend through one or more surfaces of the heater, such as the second conductive layer.

Also in some of the embodiments discussed herein, the heater may include additional features, such as a thermocouple, which may be created using additive manufacturing. A thermocouple may be a control thermocouple which may be electrically connected to a controller (as discussed above), device, or other processor that is configured to control the heater, such as the on/off and/or temperature of the resistive heating element. The control thermocouple may be located at various locations on the tubular passage, such as on the first dielectric layer, on the runway, or a location near the resistive heating element. For instance, a controller may be configured to receive and interpret electrical signals from a control thermocouple that is configured to detect the temperature of the resistive heating element, and to adjust the temperature of the resistive heating element by adjusting the voltage delivered to the resistive heating element based on those electrical signals. A thermocouple may also be an "overtemp", e.g., safety, thermocouple which may be configured to prevent the resistive heating element from exceeding a particular temperature and/or to cause the shutoff of the resistive heating element if a particular temperature is reached. Such configurations may include electrically connecting the overtemp thermocouple to a controller, device, or other processor.

Figure 45:
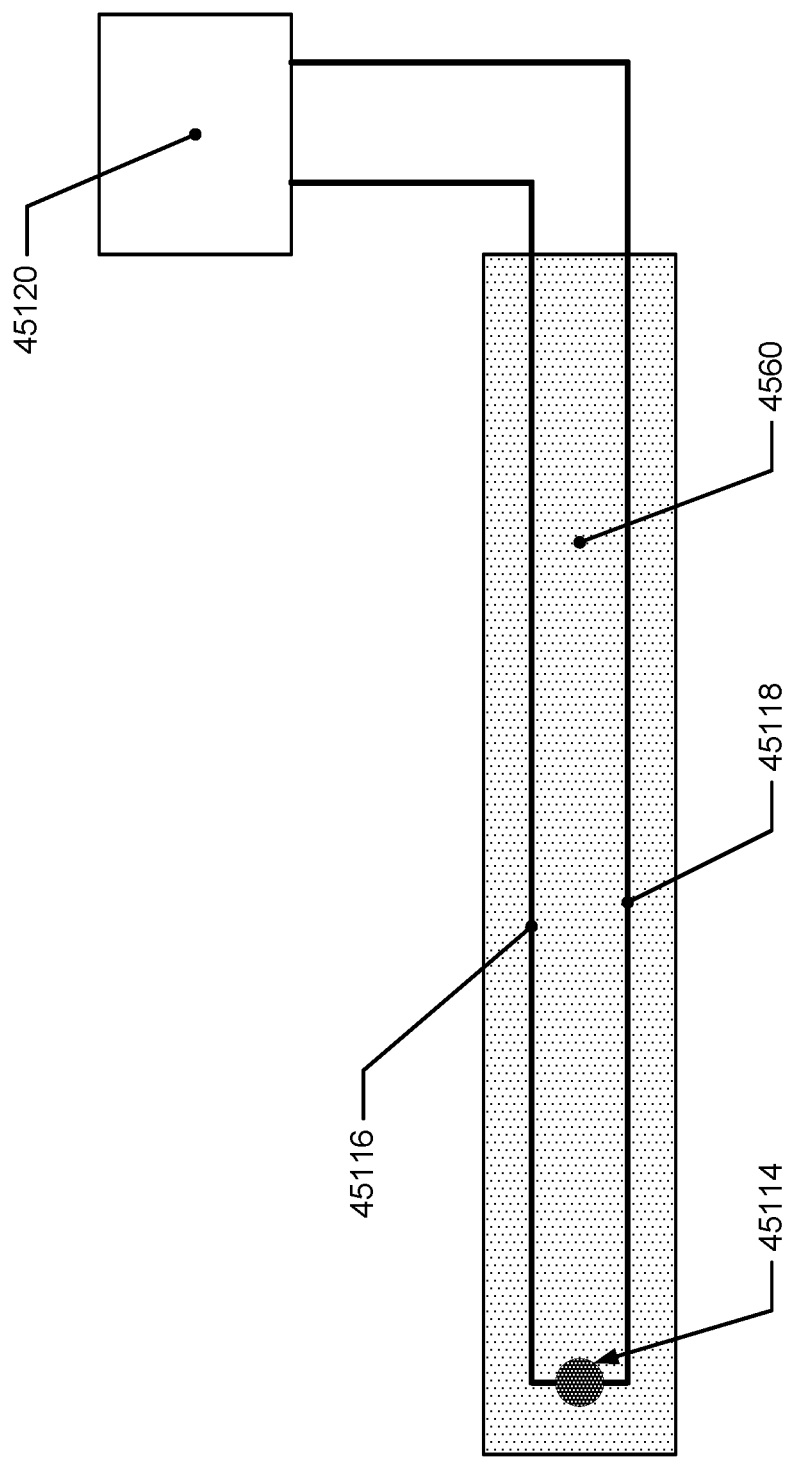
FIG. 45 depicts an example control thermocouple connected to a runway.

For example, FIG. 45 depicts an example control thermocouple connected to a runway. As can be seen, a control thermocouple in FIG. 45 includes a junction 45114, shown with dark shading, that is placed on a runway 4560, shown with light shading; the junction 45114 is the point at which a first lead 45116 and a second lead 45118 of the control thermocouple are joined together. The first lead 45116 and the second lead 45118 of the control thermocouple in FIG. 45 are also shown connected to a controller 45120. In some embodiments, at least a portion of the first lead 45116 and/or the second lead 45118 may be manufactured onto the runway, a section of the heater, or any other surface of a tubular passage by additive manufacturing, similar to the manner of additive manufacturing for the resistive heating element discussed hereinabove.

In some embodiments, there may have be more than one heating zone along a runway of a tubular passage such that one heating zone may be configured to heat the tubular passage to a temperature different than another heating zone. Such heating zones may be within a single resistive heating element layer along the length of the runway. These heating zones may be configured to compensate for heat loss from components, such as valves or transducers, connected to the tubular passage. Each heat zone may also have one or more corresponding control thermocouples and/or one or more overtemp thermocouples.

Figure 43:
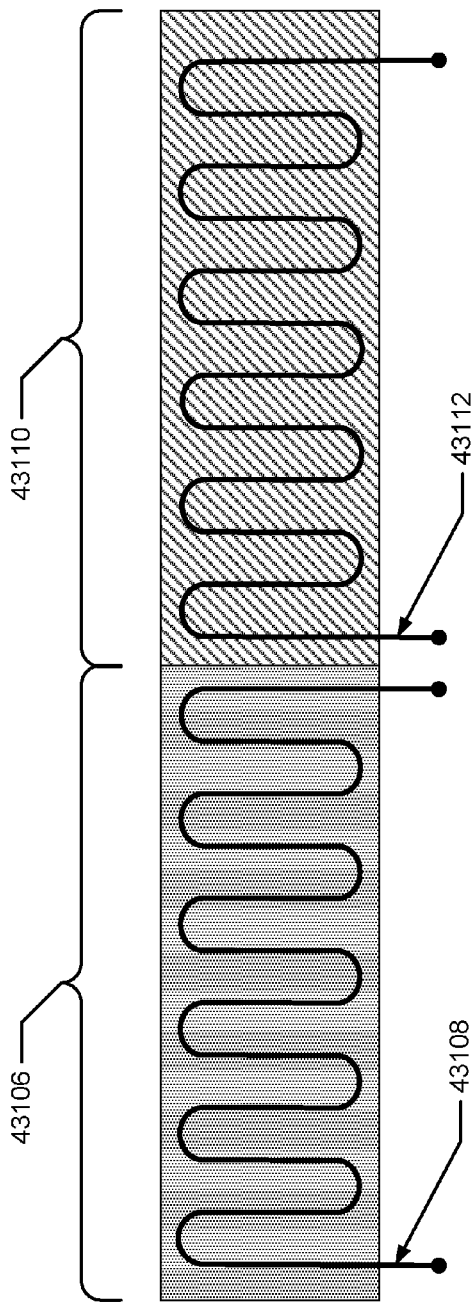
FIG. 43 depicts a plan view of runway with two heating zones.

In some such embodiments, one tubular passage may have two or more separate resistive heating elements in which each resistive heating element is associated with a separate heating zone. For example, one tubular passage may have one runway, as discussed above, but may have two separate resistive heating elements with the first heating element configured to heat the tubular passage to a first temperature and the second heating element configured to heat the tubular passage to a second temperature that is different than the first temperature. For instance, FIG. 43 depicts a plan view of runway with two heating zones. As can be seen, a first heating zone 43106, identified with shading, includes a first resistive heating element 43108, and a second heating zone 43110, identified with cross-hatching, includes a second resistive heating element 43112. The first resistive heating element 43108 may be configured to heat the first heating zone 43106 to a first temperature while the second resistive heating element 43112 may be configured to heat the first heating zone 43110 to a second temperature that is different than the first temperature. A tubular passage may have more than the two heating zones depicted in FIG. 43 and such heating zones may not be equally spaced.

Figure 44:
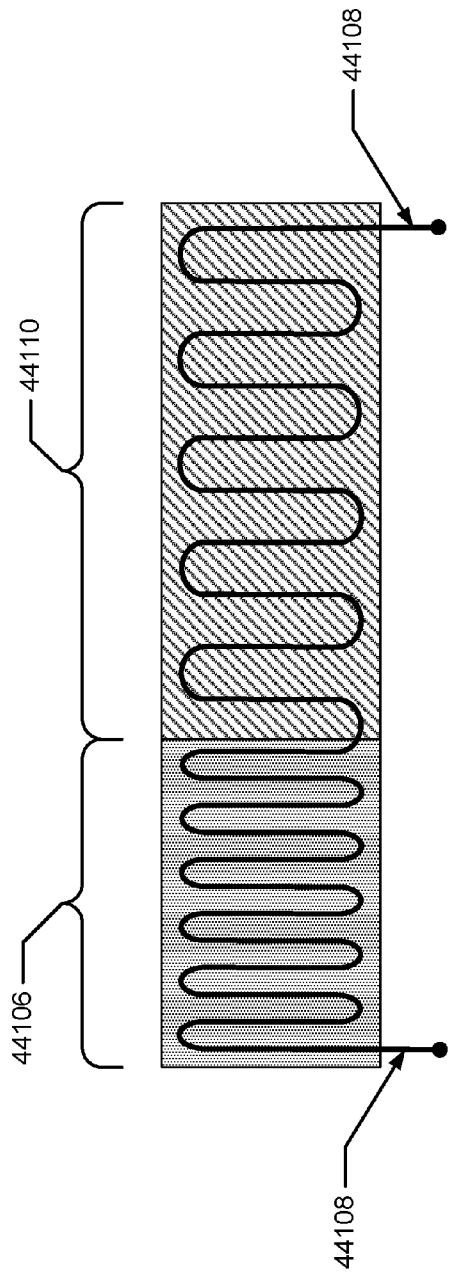
FIG. 44 depicts a plan view of another runway with two heating zones.

In some other such embodiments, the different temperatures of the heating zones may be controlled by a single resistive heating element that is arranged along the runway with a varying density. For example, a more densely, e.g., closely, arranged resistive heating element may generate more heat for a given area than a less-densely arranged resistive heating element. For instance, FIG. 44 depicts a plan view of another runway with two heating zones. As can be seen, the runway has a first heating zone 44106 identified with shading, a second heating zone 44110 identified with cross-hatching, and a first resistive heating element 44108. Different than in FIG. 43, in FIG. 44 there is only one resistive heating element but it is arranged with varying density along the runway. Here, the first resistive heating element 44108 is more densely or closely arranged in the first heating zone 44106 than in the second heating zone 44110, which may cause more heat to be generated within the first heating zone 44106 than in the second heating zone 44110. In such embodiments, a single resistive heating element may be arranged with different densities in order to create more than the two zones shown in FIG. 44 and such zones may be of different areas than depicted in FIG. 44.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

What is claimed is:

1. An apparatus for use with a semiconductor processing chamber, the apparatus comprising:
   a manifold constructed by additive manufacturing and including:
      a mixing chamber, and
      portions of a plurality of flow paths, each flow path including:
         a first fluid flow component interface including a first fluid flow component interface inlet and a first fluid flow component interface outlet,
         a first tubular passage fluidically connecting the first mixing chamber with the first fluid flow component interface outlet of that flow path, and
         a second tubular passage fluidically connected to the first fluid flow component interface inlet of that flow path, wherein:
            the first fluid flow component interface, the first tubular passage, and the second tubular passage of each flow path are a unitary body,
            one or more of the first tubular passage and the second tubular passage for at least one of the flow paths follows a respective pathway and has an exterior surface that includes a first runway,
            the pathway is a three-dimensional path, and
            for each runway:
               that first runway includes a surface defined by a respective first profile that is swept along the respective pathway,
               the respective first profile is in a plane perpendicular to the respective pathway, and
               the respective first profile is substantially linear.

2. The apparatus of claim 1, wherein the first profile is slightly curved so as to make the first runway concave.

3. The apparatus of claim 1, wherein the first profile includes features that define opposing sidewalls along the length of the runway to form a trough.

4. The apparatus of claim 1, wherein:
   the exterior surface of the at least one tubular passage includes a second runway,
   the second runway includes a surface defined by a second profile that is swept along the pathway,
   the second profile is in a plane perpendicular to the pathway, and
   the second profile is substantially linear.

5. The apparatus of claim 4, wherein the second profile is at an oblique angle to the first profile when viewed normal to the plane perpendicular to the pathway.

6. The apparatus of claim 4, wherein the second profile is substantially parallel to the first profile when viewed normal to the plane perpendicular to the pathway.

7. The apparatus of claim 4, wherein the second profile is perpendicular to the first profile when viewed normal to the plane perpendicular to the pathway.

8. The apparatus of claim 1, wherein the at least one tubular passage further includes a first dielectric layer that is adjacent to the first runway and extends along the first runway for substantially the entire length of the first runway.

9. The apparatus of claim 8, wherein the at least one tubular passage further includes a resistive heating element layer that is adjacent to the first dielectric layer and extends along the first dielectric layer for substantially the entire length of the first dielectric layer.

10. The apparatus of claim 9, wherein:
    the at least one tubular passage further includes a second dielectric layer that is adjacent to the resistive heating element layer and extends along the first runway for substantially the entire length of the first runway, and
    the resistive heating element layer is interposed between the first dielectric layer and the second dielectric layer.

11. The apparatus of claim 9, wherein:
    the resistive heating element layer includes a first heating zone that is configured to heat the tubular passage to a first temperature, and
    the resistive heating element layer includes a second heating zone that is configured to heat the tubular passage to a second temperature that is different than the first temperature.

12. The apparatus of claim 1, wherein:
    the at least one flow path further comprises a heating element, and
    the heating element is positioned on the first runway of one or more of the first tubular passage and the second tubular passage, and the heating element extends along the respective pathway of one or more of the first tubular passage and the second tubular passage.

13. The apparatus of claim 12, wherein:
the heating element is positioned on the first runway of both the first tubular passage and the second tubular passage, and
the heating element extends along the respective pathway of both the first tubular passage and the second tubular passage.

14. The apparatus of claim 12, wherein:
each flow path of the plurality of flow paths follows a respective pathway, and has an exterior surface that includes a first runway,
each flow path of the plurality of flow paths includes a heating element,
for each flow path, the heating element is positioned on the first runway of one or more of the first tubular passage and the second tubular passage of that flow path, and
for each flow path, the heating element extends along the respective pathway of one or more of the first tubular passage and the second tubular passage of that flow path.

15. The apparatus of claim 14, wherein:
for each flow path, the heating element is positioned on the first runway of both the first tubular passage and the second tubular passage of that flow path, and
for each flow path, the heating element extends along the respective pathway of both the first tubular passage and the second tubular passage of that flow path.

16. An apparatus for use with a semiconductor processing chamber, the apparatus comprising:
a manifold constructed by additive manufacturing and including:
a mixing chamber,
a resistive heating element layer, and
portions of a plurality of flow paths, each flow path including:
a first fluid flow component interface including a first fluid flow component interface inlet and a first fluid flow component interface outlet,
a first tubular passage fluidically connecting the first mixing chamber with the first fluid flow component interface outlet of that flow path, and
a second tubular passage fluidically connected to the first fluid flow component interface inlet of that flow path, wherein:
the first fluid flow component interface, the first tubular passage, and the second tubular passage of each flow path are a unitary body,
one or more of the first tubular passage and the second tubular passage for at least one of the flow paths follows a respective pathway, and
for the at least one flow path that follows a respective pathway, the resistive heating element layer is positioned on one or more of the first tubular passage and the second tubular passage, and extends along the respective pathway of one or more of the first tubular passage and the second tubular passage.

17. The apparatus of claim 16, wherein for the at least one flow path that follows the respective pathway:

the one or more of the first tubular passage and the second tubular passage on which the resistive heating element is positioned further includes a first dielectric layer,
the first dielectric layer is positioned on and extends along the one or more of the first tubular passage and the second tubular passage on which the resistive heating element layer is positioned, and
the first dielectric layer is interposed between the resistive heating element layer and the one or more of the first tubular passage and the second tubular passage on which the resistive heating element layer is positioned.

18. The apparatus of claim 17, wherein for the at least one flow path that follows the respective pathway:
the one or more of the first tubular passage and the second tubular passage on which the resistive heating element layer is positioned further includes a second dielectric layer,
the second dielectric layer is adjacent to the heating element layer and extends along the one or more of the first tubular passage and the second tubular passage on which the resistive heating element layer is positioned, and
the heating element layer is interposed between the first dielectric layer and the second dielectric layer.

19. The apparatus of claim 16, wherein:
the resistive heating element layer includes a first heating zone that is configured to heat the tubular passage to a first temperature, and
the resistive heating element layer includes a second heating zone that is configured to heat the tubular passage to a second temperature that is different than the first temperature.

20. The apparatus of claim 16, further comprising a plurality of resistive heating element layers, wherein:
each flow path of the plurality of flow paths follows a respective pathway,
each flow path of the plurality of flow paths includes a resistive heating element layer,
for each flow path, the resistive heating element layer is positioned on one or more of the first tubular passage and the second tubular passage of that flow path, and
for each flow path, the resistive heating element layer extends along the one or more of the first tubular passage and the second tubular passage of that flow path.

21. The apparatus of claim 16, wherein the resistive heating element layer is positioned along at least a part of the cross-sectional circumference of the one or more of the first tubular passage and the second tubular passage on which the resistive heating element is positioned.

22. The apparatus of claim 21, wherein the resistive heating element layer is positioned along all of the cross-sectional circumference of the one or more of the first tubular passage and the second tubular passage on which the resistive heating element is positioned.

23. The apparatus of claim 16, wherein the resistive heating element layer includes one or more resistive heating elements.

24. The apparatus of claim 23, wherein at least one resistive heating element follows one of a corkscrew pattern, a serpentine pattern, and a pattern having linear and curved sections.

* * * * *